United States Patent
Yamazaki et al.

(10) Patent No.: US 11,316,051 B2
(45) Date of Patent: Apr. 26, 2022

(54) SEMICONDUCTOR DEVICE AND METHOD FOR MANUFACTURING SEMICONDUCTOR DEVICE

(71) Applicant: Semiconductor Energy Laboratory Co., Ltd., Atsugi (JP)

(72) Inventors: Shunpei Yamazaki, Setagaya (JP); Katsuaki Tochibayashi, Isehara (JP); Ryota Hodo, Atsugi (JP); Kentaro Sugaya, Atsugi (JP); Naoto Yamade, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 7 days.

(21) Appl. No.: 16/963,928

(22) PCT Filed: Feb. 21, 2019

(86) PCT No.: PCT/IB2019/051397
§ 371 (c)(1),
(2) Date: Jul. 22, 2020

(87) PCT Pub. No.: WO2019/171196
PCT Pub. Date: Sep. 12, 2019

(65) Prior Publication Data
US 2020/0388710 A1 Dec. 10, 2020

(30) Foreign Application Priority Data

Mar. 7, 2018 (JP) .............................. JP2018-040286
Mar. 7, 2018 (JP) .............................. JP2018-040287

(51) Int. Cl.
*H01L 27/00* (2006.01)
*H01L 29/00* (2006.01)
(Continued)

(52) U.S. Cl.
CPC .... *H01L 29/7869* (2013.01); *H01L 27/10808* (2013.01); *H01L 27/10873* (2013.01); *H01L 29/24* (2013.01); *H01L 29/66742* (2013.01)

(58) Field of Classification Search
CPC ........... H01L 21/8258; H01L 21/02565; H01L 21/0228; H01L 21/76802;
(Continued)

(56) References Cited

U.S. PATENT DOCUMENTS 9,691,905 B2  6/2017  Ito et al.
9,698,277 B2  7/2017  Yamazaki et al.
(Continued)

FOREIGN PATENT DOCUMENTS

CN  107004722 A  8/2017
CN  107210227 A  9/2017
(Continued)

OTHER PUBLICATIONS

International Search Report (Application No. PCT/IB2019/051397) dated Jun. 4, 2019.
(Continued)

*Primary Examiner* — Nikolay K Yushin
(74) *Attorney, Agent, or Firm* — Robinson Intellectual Property Law Office; Eric J. Robinson

(57) ABSTRACT

A semiconductor device includes a transistor including, a first to fifth insulator, a first to third oxide, a first to third conductor. An opening reaching the second oxide is provided in the fourth insulator and the fifth insulator. The third oxide, the third insulator, and the third conductor are arranged sequentially from the inner wall side of the opening so as to fill the opening. In the channel length direction of the transistor, at least part of the fourth insulator in a region where the fourth insulator and the second oxide do not overlap with each other is in contact with the first insulator.

(Continued)

In the channel width direction of the transistor, at least part of the third oxide in a region where the third oxide and the second oxide do not overlap with each other is in contact with the first insulator.

18 Claims, 31 Drawing Sheets

(51) Int. Cl.
*H01L 29/786* (2006.01)
*H01L 27/108* (2006.01)
*H01L 29/24* (2006.01)
*H01L 29/66* (2006.01)

(58) Field of Classification Search
CPC ....... H01L 21/823462; H01L 27/10873; H01L 27/10808; H01L 27/108; H01L 27/088; H01L 27/1156; H01L 29/78648; H01L 29/24; H01L 29/66742; H01L 29/7869
See application file for complete search history.

(56) References Cited

U.S. PATENT DOCUMENTS

| | | | |
|---|---|---|---|
| 9,825,177 B2 | 11/2017 | Yamazaki et al. |
| 9,871,145 B2 | 1/2018 | Ito et al. |
| 9,905,657 B2 | 2/2018 | Endo et al. |
| 9,923,097 B2 | 3/2018 | Koezuka et al. |
| 9,947,802 B2 | 4/2018 | Kimura et al. |
| 10,141,452 B2 | 11/2018 | Ito et al. |
| 10,186,614 B2 | 1/2019 | Asami |
| 10,256,348 B2 | 4/2019 | Endo et al. |
| 10,290,745 B2 | 5/2019 | Yamazaki et al. |
| 10,373,981 B2 | 8/2019 | Yamazaki et al. |
| 10,438,982 B2 | 10/2019 | Kurata et al. |
| 2015/0008428 A1 | 1/2015 | Yamamoto et al. |
| 2016/0172500 A1 | 6/2016 | Yamazaki et al. |
| 2016/0372606 A1 | 12/2016 | Ito et al. |
| 2017/0092779 A1 | 3/2017 | Kimura et al. |
| 2018/0019343 A1 | 1/2018 | Asami |
| 2018/0233597 A1 | 8/2018 | Yamamoto et al. |
| 2020/0287026 A1 | 9/2020 | Koezuka et al. |

FOREIGN PATENT DOCUMENTS

| | | |
|---|---|---|
| JP | 2013-179289 A | 9/2013 |
| JP | 2015-035597 A | 2/2015 |
| JP | 2016-197708 A | 11/2016 |
| JP | 2017-063192 A | 3/2017 |
| JP | 2018-022713 A | 2/2018 |
| KR | 2015-0006363 A | 1/2015 |
| KR | 2017-0107997 A | 9/2017 |
| KR | 2018-0020157 A | 2/2018 |
| TW | 201633548 | 9/2016 |
| TW | 201709346 | 3/2017 |
| WO | WO-2016/092427 | 6/2016 |
| WO | WO-2016/125052 | 8/2016 |
| WO | WO-2016/203354 | 12/2016 |

OTHER PUBLICATIONS

Written Opinion (Application No. PCT/IB2019/051397) dated Jun. 4, 2019.
Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.
Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.
Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.
Yamazaki.S et al., "In—Ga—Zn-Oxide Semiconductor and Its Transistor Characteristics", ECS Journal of Solid State Science and Technology, Jul. 1, 2014, vol. 3, No. 9, pp. Q3012-Q3022.
Yamazaki,S, "Crystalline Oxide Semiconductor Using CAAC-IGZO and its Application", ECS Transactions, Oct. 1, 2014, vol. 64, No. 10, pp. 155-164, The Electrochemical Society.
Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics) , 2012, vol. 51, pp. 021201-1-021201-7.
Matsuda.S et al., "30-nm-Channel-Length C-Axis Aligned Crystalline In—Ga—Zn—O Transistors with Low Off-State Leakage Current and Steep Subthreshold Characteristics", 2015 Symposium on VLSI Technology : Digest of Technical Papers, 2015, pp. T216-T217.
Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.

SEMICONDUCTOR DEVICE AND METHOD FOR MANUFACTURING SEMICONDUCTOR DEVICE

TECHNICAL FIELD

One embodiment of the present invention relates to a semiconductor device and a method for manufacturing the semiconductor device. Another embodiment of the present invention relates to a semiconductor wafer, a module, and an electronic device.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. In some cases, it can be said that a display device (e.g., a liquid crystal display device and a light-emitting display device), a projection device, a lighting device, an electro-optical device, a power storage device, a memory device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. One embodiment of the present invention relates to a process, a machine, manufacture, or a composition (composition of matter).

BACKGROUND ART

As semiconductor thin films that can be used in the transistors, silicon-based semiconductor materials have been widely known, but oxide semiconductors have been attracting attention as alternative materials. Examples of oxide semiconductors include not only single-component metal oxides, such as indium oxide and zinc oxide, but also multi-component metal oxides. Among the multi-component metal oxides, in particular, an In—Ga—Zn oxide (hereinafter also referred to as IGZO) has been actively studied.

From the studies on IGZO, in an oxide semiconductor, a CAAC (c-axis aligned crystalline) structure and an nc (nanocrystalline) structure, which are not single crystal nor amorphous, have been found (see Non-Patent Document 1 to Non-Patent Document 3). In Non-Patent Document 1 and Non-Patent Document 2, a technique for forming a transistor using an oxide semiconductor having the CAAC structure is also disclosed. Moreover, Non-Patent Document 4 and Non-Patent Document 5 disclose that a fine crystal is included even in an oxide semiconductor which has lower crystallinity than an oxide semiconductor having the CAAC structure or the nc structure.

In addition, a transistor using IGZO as an active layer has an extremely low off-state current (see Non-Patent Document 6), and an LSI and a display utilizing the characteristics have been reported (see Non-Patent Document 7 and Non-Patent Document 8).

REFERENCE

Non-Patent Document

[Non-Patent Document 1] S. Yamazaki et al., "SID Symposium Digest of Technical Papers", 2012, volume 43, issue 1, p. 183-186

[Non-Patent Document 2] S. Yamazaki et al., "Japanese Journal of Applied Physics", 2014, volume 53, Number 4S, p. 04ED18-1-04ED18-10

[Non-Patent Document 3] S. Ito et al., "The Proceedings of AM-FPD'13 Digest of Technical Papers", 2013, p. 151-154

[Non-Patent Document 4] S. Yamazaki et al., "ECS Journal of Solid State Science and Technology", 2014, volume 3, issue 9, p. Q3012-Q3022

[Non-Patent Document 5] S. Yamazaki, "ECS Transactions", 2014, volume 64, issue 10, p. 155-164

[Non-Patent Document 6] K. Kato et al., "Japanese Journal of Applied Physics", 2012, volume 51, p. 021201-1-021201-7

[Non-Patent Document 7] S. Matsuda et al., "2015 Symposium on VLSI Technology Digest of Technical Papers", 2015, p. T216-T217

[Non-Patent Document 8] S. Amano et al., "SID Symposium Digest of Technical Papers", 2010, volume 41, issue 1, p. 626-629

SUMMARY OF THE INVENTION

Problems to be Solved by the Invention

An object of one embodiment of the present invention is to provide a semiconductor device with a high on-state current. Another object of one embodiment of the present invention is to provide a semiconductor device having high frequency characteristics. Another object of one embodiment of the present invention is to provide a highly reliable semiconductor device. Another object of one embodiment of the present invention is to provide a semiconductor device that can be scaled down or highly integrated. Another object of one embodiment of the present invention is to provide a semiconductor device having favorable electrical characteristics. Another object of one embodiment of the present invention is to provide a semiconductor device with high productivity.

An object of one embodiment of the present invention is to provide a semiconductor device capable of retaining data for a long time. An object of one embodiment of the present invention is to provide a semiconductor device with high-speed data writing. An object of one embodiment of the present invention is to provide a semiconductor device with high design flexibility. An object of one embodiment of the present invention is to provide a semiconductor device capable of reducing power consumption. An object of one embodiment of the present invention is to provide a novel semiconductor device.

Note that the description of these objects does not preclude the existence of other objects. One embodiment of the present invention does not have to achieve all these objects. Other objects will be apparent from and can be derived from the description of the specification, the drawings, the claims, and the like.

Means for Solving the Problems

One embodiment of the present invention is a semiconductor device including a transistor, and the transistor includes a first insulator, a second insulator over the first insulator, a first oxide over the second insulator, a second oxide over the first oxide, a third oxide over the second oxide, a first conductor and a second conductor over the second oxide, a third insulator over the third oxide, a third conductor over the third insulator, a fourth insulator over the first conductor and the second conductor, and a fifth insulator over the fourth insulator. An opening reaching the second oxide is provided in the fourth insulator and the fifth insulator. The third oxide is positioned to cover an inner wall of the opening. The third insulator is positioned to cover the inner wall of the opening with the third oxide therebetween. The third conductor is positioned to fill the opening with the third oxide and the third insulator therebetween. In the channel length direction of the transistor, at least part of the fourth insulator in a region where the fourth insulator and the second oxide do not overlap with each other is in contact with the first insulator. In the channel width direction of the transistor, with reference to the height of a bottom surface of the first insulator, the height of a bottom surface of the third conductor in a region where the third conductor and the second oxide do not overlap with each other is lower than the height of a bottom surface of the second oxide. In the channel width direction of the transistor, at least part of the third oxide in a region where the third oxide and the second oxide do not overlap with each other is in contact with the first insulator.

In the above semiconductor device, it is preferred that the third oxide have a stacked-layer structure including a first layer and a second layer, the first layer be in contact with the second oxide and the fifth insulator, and the second layer be provided between the first layer and the third insulator. Moreover, the second layer preferably has higher crystallinity than the first layer. Alternatively, it is preferred that the first layer and the second layer each contain In, an element M (M is Al, Ga, Y, or Sn), and Zn, and the atomic ratio of In to constituent elements in the second layer be lower than the atomic ratio of In to constituent elements in the first layer.

Another embodiment of the present invention is a semiconductor device including a transistor, and the transistor includes a first insulator; a second insulator over the first insulator; a first oxide over the second insulator; a second oxide over the first oxide; a third oxide over the second oxide; a third insulator over the third oxide; a conductor over the third insulator; a fourth insulator in contact with at least part of the third oxide, at least part of a top surface of the second oxide, at least part of a side surface of the second oxide, at least part of a side surface of the first oxide, at least part of a side surface of the second insulator, and at least part of the first insulator; a fifth insulator over the fourth insulator; and a sixth insulator in contact with at least part of a top surface of the third oxide, at least part of a top surface of the third insulator, at least part of a top surface of the conductor, and at least part of a top surface of the fifth insulator. The second oxide includes a first region, a second region, and a third region positioned between the first region and the second region. The resistance of the first region and the second region is lower than the resistance of the third region. The conductor is provided above the third region to overlap with the third region. Part of the third oxide and part of the third insulator are provided between a side surface of the conductor and a side surface of the fifth insulator. The fourth insulator includes regions in contact with the first region and the second region. In the channel width direction of the transistor, with reference to the height of a bottom surface of the first insulator, the height of a bottom surface of the conductor in a region where the conductor and the second oxide do not overlap with each other is lower than the height of a bottom surface of the second oxide. In the channel width direction of the transistor, at least part of the third oxide in a region where the third oxide and the second oxide do not overlap with each other is in contact with the first insulator.

In the above semiconductor device, the first region and the second region preferably contain one of phosphorus and boron.

In the above semiconductor device, the first region and the second region preferably include more oxygen vacancies than the third region.

In the above semiconductor device, it is preferable that the fourth insulator have a stacked-layer structure including a third layer and a fourth layer, the third layer be in contact with the first insulator, and the fourth layer be in contact with the fifth insulator. Moreover, it is preferable that the third layer contain silicon oxide, and the fourth layer contain aluminum oxide.

In the above semiconductor device, it is preferred that the third oxide have a stacked-layer structure including a first layer and a second layer, the first layer be in contact with the second oxide and the fifth insulator, and the second layer be provided between the first layer and the third insulator. In addition, it is preferable that the first layer and the second layer each contain In, an element M (M is Al, Ga, Y, or Sn), and Zn, and the atomic ratio of In to the element M in the second layer be lower than the atomic ratio of In to the element M in the first layer.

Effect of the Invention

With one embodiment of the present invention, a semiconductor device with a high on-state current can be provided. With one embodiment of the present invention, a semiconductor device having high frequency characteristics can be provided. With one embodiment of the present invention, a highly reliable semiconductor device can be provided. With one embodiment of the present invention, a semiconductor device that can be scaled down or highly integrated can be provided. With one embodiment of the present invention, a semiconductor device having favorable electrical characteristics can be provided. With one embodiment of the present invention, a semiconductor device with high productivity can be provided.

A semiconductor device capable of retaining data for a long time can be provided. A semiconductor device with high-speed data writing can be provided. A semiconductor device with high design flexibility can be provided. A semiconductor device capable of reducing power consumption can be provided. A novel semiconductor device can be provided.

Note that the description of these effects does not preclude the existence of other effects. One embodiment of the present invention does not have to have all these effects. Effects other than these will be apparent from and can be derived from the description of the specification, the drawings, the claims, and the like.

BRIEF DESCRIPTION OF THE DRAWINGS

FIG. 7 FIGS. 7A-7C A top view and cross-sectional views illustrating a method for manufacturing a semiconductor device according to one embodiment of the present invention.

FIGS. 31A-31F Diagrams illustrating electronic devices according to one embodiment of the present invention.

MODE FOR CARRYING OUT THE INVENTION

Figure 1A:
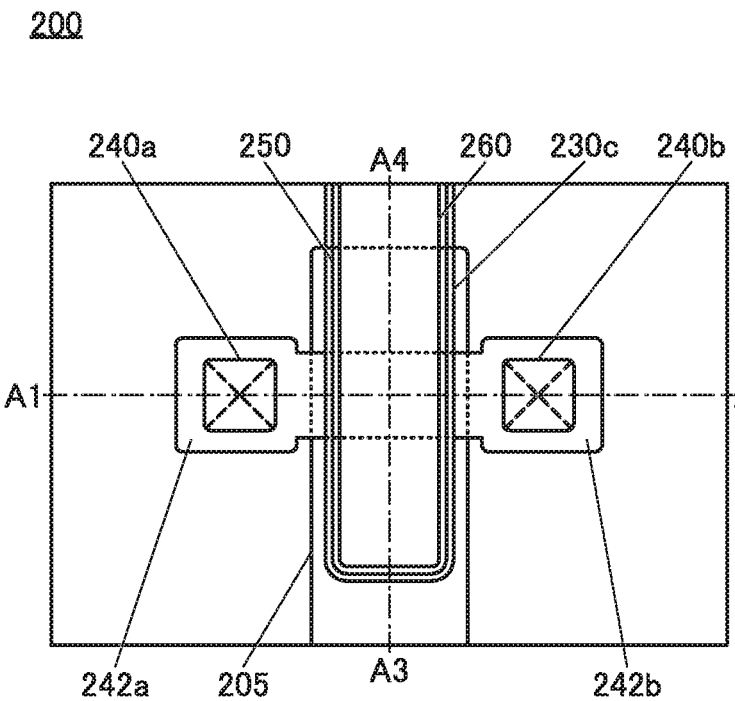
FIGS. 1A-1C A top view and cross-sectional views of a semiconductor device according to one embodiment of the present invention.

Hereinafter, embodiments will be described with reference to the drawings. Note that the embodiments can be implemented with many different modes, and it will be readily understood by those skilled in the art that modes and details thereof can be changed in various ways without departing from the spirit and scope thereof. Therefore, the present invention should not be interpreted as being limited to the description of the embodiments below.

In the drawings, the size, the layer thickness, or the region is exaggerated for clarity in some cases. Therefore, they are not limited to the illustrated scale. Note that the drawings schematically illustrate ideal examples, and embodiments of the present invention are not limited to shapes, values, and the like shown in the drawings. For example, in an actual manufacturing process, a layer, a resist mask, or the like might be unintentionally reduced in size by treatment such as etching, which might not be reflected in the drawings for easy understanding. Furthermore, in the drawings, the same reference numerals are used in common for the same portions or portions having similar functions in different drawings, and repeated description thereof is omitted in some cases. Moreover, the same hatch pattern is used for the portions having similar functions, and the portions are not especially denoted by reference numerals in some cases.

Particularly in a top view (also referred to as a plan view), a perspective view, and the like, the description of some components might be omitted for easy understanding of the invention. Furthermore, some hidden lines and the like might be omitted.

In this specification and the like, ordinal numbers such as "first" and "second" are used for convenience and do not denote the order of steps or the stacking order of layers. Therefore, for example, description can be made by replacing "first" with "second", "third", or the like as appropriate. In some cases, ordinal numbers in this specification and the like do not correspond to ordinal numbers that are used to specify one embodiment of the present invention.

In this specification and the like, terms for describing arrangement, such as "over" and "below", are used for convenience to describe the positional relation between components with reference to drawings. The positional relation between components is changed as appropriate in accordance with a direction in which the components are described. Thus, terms for the description are not limited to those used in this specification, and description can be made appropriately depending on the situation.

When this specification and the like explicitly state that X and Y are connected, for example, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or text, a connection relation other than a connection relation shown in drawings or text is regarded as being disclosed in the drawings or the text.

Here, X and Y each denote an object (e.g., a device, an element, a circuit, a wiring, an electrode, a terminal, a conductive film, or a layer).

In this specification and the like, a transistor is an element having at least three terminals of a gate, a drain, and a source. The transistor includes a region where a channel is formed (hereinafter also referred to as a channel formation region) between the drain (a drain terminal, a drain region, or a drain electrode) and the source (a source terminal, a source region, or a source electrode), and current can flow between the source and the drain through the channel formation region. Note that in this specification and the like, a channel region refers to a region through which current mainly flows.

Functions of a source and a drain might be switched when a transistor of opposite polarity is employed or a direction of current flow is changed in circuit operation, for example. Therefore, the terms "source" and "drain" can sometimes be interchanged with each other in this specification and the like.

Note that the channel length refers to, for example, the distance between a source (a source region or a source electrode) and a drain (a drain region or a drain electrode) in a region where a semiconductor (or a portion where current flows in a semiconductor when a transistor is in an on state) and a gate electrode overlap with each other or a channel formation region in a top view of the transistor. Note that in one transistor, channel lengths in all regions are not necessarily the same. In other words, the channel length of one transistor is not fixed to one value in some cases. Thus, in this specification, the channel length is any one of the values, the maximum value, the minimum value, or the average value in a channel formation region.

The channel width refers to, for example, the length of a channel formation region in a direction perpendicular to the channel length direction in a region where a semiconductor (or a portion where current flows in a semiconductor when a transistor is in an on state) and a gate electrode overlap with each other, or a channel formation region in a top view of the transistor. Note that in one transistor, channel widths in all regions do not necessarily have the same value. In other words, the channel width of one transistor is not fixed to one value in some cases. Thus, in this specification, the channel width is any one of the values, the maximum value, the minimum value, or the average value in a channel formation region.

Note that in this specification and the like, depending on transistor structures, a channel width in a region where a channel is actually formed (hereinafter also referred to as an effective channel width) is different from a channel width shown in a top view of a transistor (hereinafter also referred to as an apparent channel width) in some cases. For example, when a gate electrode covers a side surface of a semiconductor, an effective channel width is greater than an apparent channel width, and its influence cannot be ignored in some cases. For example, in a miniaturized transistor having a gate electrode covering a side surface of a semiconductor, the proportion of a channel formation region formed in the side surface of the semiconductor is increased in some cases. In that case, an effective channel width is greater than an apparent channel width.

In such a case, an effective channel width is sometimes difficult to estimate by actual measurement. For example, estimation of an effective channel width from a design value requires assumption that the shape of a semiconductor is known. Accordingly, in the case where the shape of a semiconductor is not known accurately, it is difficult to measure an effective channel width accurately.

In this specification, the simple term "channel width" refers to an apparent channel width in some cases. Alternatively, in this specification, the simple term "channel width" refers to an effective channel width in some cases. Note that values of a channel length, channel width, effective channel width, apparent channel width, and the like can be determined, for example, by analyzing a cross-sectional TEM image and the like.

Note that impurities in a semiconductor refer to, for example, elements other than the main components of a semiconductor. For example, an element with a concentration lower than 0.1 atomic % can be regarded as an impurity. When an impurity is contained, for example, the density of defect states in a semiconductor increases and the crystallinity decreases in some cases. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. In the case of an oxide semiconductor, water also serves as an impurity in some cases. Also in the case of an oxide semiconductor, oxygen vacancies are formed by the mixing of impurities, for example. Furthermore, when the semiconductor is silicon, examples of the impurity that changes characteristics of the semiconductor include oxygen, Group 1 elements except hydrogen, Group 2 elements, Group 13 elements, and Group 15 elements.

Note that in this specification and the like, silicon oxynitride is a material that contains more oxygen than nitrogen in its composition. Moreover, silicon nitride oxide is a material that contains more nitrogen than oxygen in its composition.

In this specification and the like, the term "insulator" can be replaced with an insulating film or an insulating layer. Furthermore, the term "conductor" can be replaced with a conductive film or a conductive layer. Moreover, the term "semiconductor" can be replaced with a semiconductor film or a semiconductor layer.

In this specification and the like, "parallel" indicates a state where two straight lines are placed at an angle greater than or equal to −10° and less than or equal to 10°. Accordingly, the case where the angle is greater than or equal to −5° and less than or equal to 5° is also included. Moreover, "substantially parallel" indicates a state where two straight lines are placed at an angle of greater than or equal to −30° and less than or equal to 30°. Moreover, "perpendicular" indicates a state where two straight lines are placed at an angle greater than or equal to 80° and less than or equal to 100°. Accordingly, the case where the angle is greater than or equal to 85° and less than or equal to 95° is also included. Moreover, "substantially perpendicular" indicates a state where two straight lines are placed at an angle of greater than or equal to 60° and less than or equal to 120°.

Note that in this specification, a barrier film means a film having a function of inhibiting transmission of oxygen and impurities such as water and hydrogen; in the case where the barrier film has conductivity, the barrier film is referred to as a conductive barrier film in some cases.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, when OS transistor is mentioned, the OS transistor can also be called a transistor including an oxide or an oxide semiconductor.

In this specification and the like, "normally off" means that current per micrometer of channel width flowing through a transistor when a potential is not applied to a gate or a ground potential is applied to the gate is lower than or equal to $1 \times 10^{-20}$ A at room temperature, lower than or equal to $1 \times 10^{-18}$ A at 85° C., or lower than or equal to $1 \times 10^{-16}$ A at 125° C.

Embodiment 1

An example of a semiconductor device including a transistor 200 of one embodiment of the present invention will be described below.

<Structure Example 1 of Semiconductor Device>

Figure 1C:
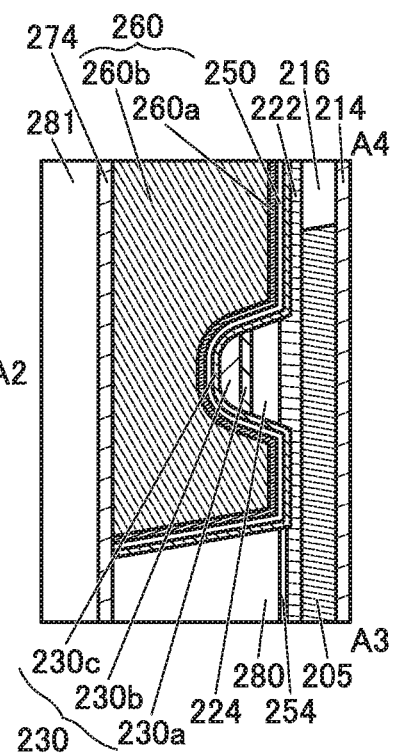
Figure 1B:
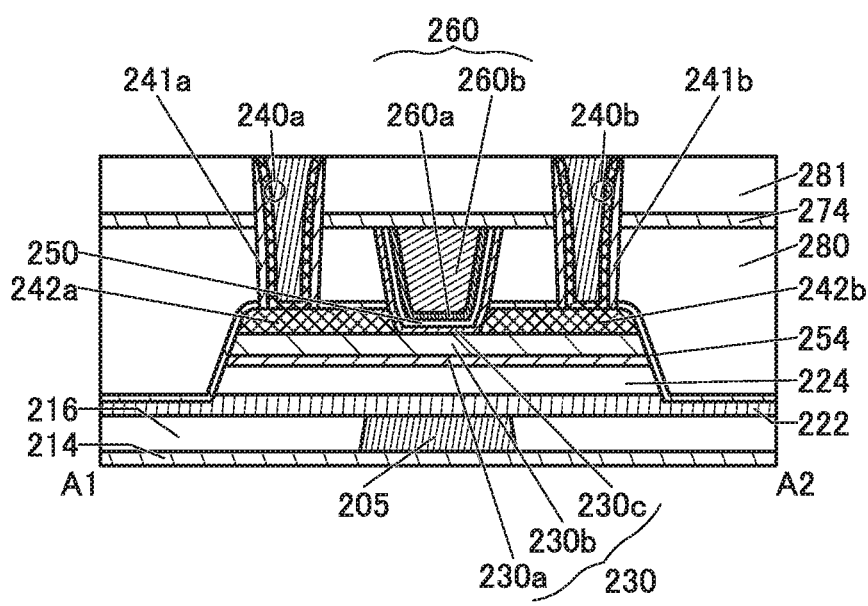

FIG. 1(A) to FIG. 1(C) are a top view and cross-sectional views of the transistor 200 of one embodiment of the present invention and the periphery of the transistor 200.

FIG. 1(A) is a top view of a semiconductor device including the transistor 200. FIG. 1(B) and FIG. 1(C) are cross-sectional views of the semiconductor device. Here, FIG. 1(B) is a cross-sectional view of a portion indicated by a dashed-dotted line A1-A2 in FIG. 1(A), and is also a cross-sectional view in the channel length direction of the transistor 200. FIG. 1(C) is a cross-sectional view of a portion indicated by a dashed-dotted line A3-A4 in FIG. 1(A), and is also a cross-sectional view in the channel width direction of the transistor 200. Note that for clarity of the drawing, some components are not illustrated in the top view of FIG. 1(A).

Figure 2:
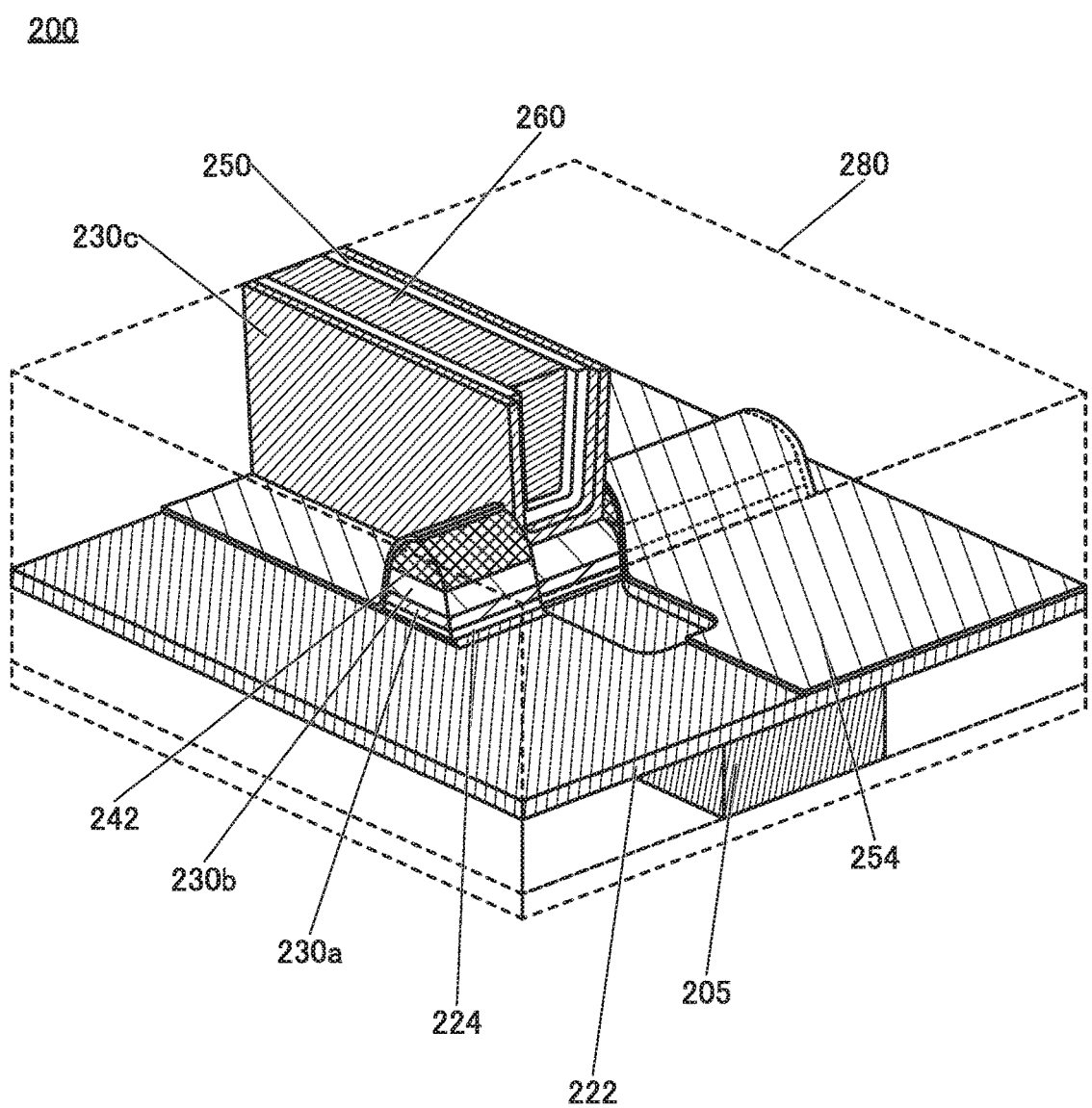
FIG. 2 A perspective view of a semiconductor device according to one embodiment of the present invention.

FIG. 2 is a perspective view of the transistor 200 of one embodiment of the present invention. Note that for clarification of the drawing, some components are not illustrated in the perspective view of FIG. 2.

The semiconductor device of one embodiment of the present invention includes the transistor 200 and an insulator 214, an insulator 280, and an insulator 274, and an insulator 281 that function as interlayer films. A conductor 240 (a conductor 240a and a conductor 240b) that is electrically connected to the transistor 200 and functions as a plug is also included. Note that an insulator 241 (an insulator 241a and an insulator 241b) is provided in contact with a side surface of the conductor 240 functioning as a plug.

In contact with a side wall of an opening in an insulator 254, the insulator 280, the insulator 274, and the insulator 281, the insulator 241 is provided. In contact with its side surface, a first conductor of the conductor 240 is provided, and a second conductor of the conductor 240 is further provided on the inner side. Here, a top surface of the conductor 240 and a top surface of the insulator 281 can be substantially level with each other. Note that although the transistor 200 having a structure in which the first conductor of the conductor 240 and the second conductor of the conductor 240 are stacked is illustrated, the present invention is not limited thereto. For example, the conductor 240 may be provided as a single layer or to have a stacked-layer structure of three or more layers. When a component has a stacked-layer structure, layers may be distinguished by ordinal numbers corresponding to the formation order.

[Transistor 200]

As illustrated in FIG. 1, the transistor 200 includes an insulator 216 placed over a substrate (not illustrated); a conductor 205 placed to be embedded in the insulator 216; an insulator 222 placed over the insulator 216 and the conductor 205; an insulator 224 placed over the insulator 222; an oxide 230 (an oxide 230a, an oxide 230b, and an oxide 230c) placed over the insulator 224; an insulator 250 placed over the oxide 230; a conductor 260 (a conductor 260a and a conductor 260b) placed over the insulator 250; a conductor 242a and a conductor 242b in contact with part of a top surface of the oxide 230b; and the insulator 254 placed in contact with part of a top surface of the insulator 222, a side surface of the insulator 224, a side surface of the oxide 230a, a side surface of the oxide 230b, a side surface of the conductor 242a, a top surface of the conductor 242a, a side surface of the conductor 242b, and a top surface of the conductor 242b.

The conductor 260 functions as a gate electrode of the transistor 200, and the conductor 242a and the conductor 242b function as a source electrode and a drain electrode. In the transistor 200, the conductor 260 functioning as a gate electrode is formed in a self-aligned manner to fill an opening formed in the insulator 280 and the like. The formation of the conductor 260 in this manner allows the conductor 260 to be positioned certainly in the region between the conductor 242a and the conductor 242b without alignment.

Note that the conductor 260 preferably includes the conductor 260a and the conductor 260b positioned over the conductor 260a. For example, the conductor 260a is preferably positioned to cover a bottom surface and a side surface of the conductor 260b. Moreover, as illustrated in FIG. 1(B), a top surface of the conductor 260 is substantially aligned with a top surface of the insulator 250 and a top surface of the oxide 230c. Although the conductor 260 has a two-layer stacked structure in the transistor 200, the present invention is not limited thereto. For example, the conductor 260 may have a single-layer structure or a stacked-layer structure of three or more layers.

The insulator 222, the insulator 254, and the insulator 274 preferably have a function of inhibiting diffusion of hydrogen (e.g., at least one of a hydrogen atom, a hydrogen molecule, and the like). In addition, the insulator 222, the insulator 254, and the insulator 274 preferably have a function of inhibiting diffusion of oxygen (e.g., at least one of an oxygen atom, an oxygen molecule, and the like). For example, the insulator 222, the insulator 254, and the insulator 274 preferably have lower permeability of one or both of hydrogen and oxygen than the insulator 224. The insulator 222, the insulator 254, and the insulator 274 preferably have lower permeability of one or both of hydrogen and oxygen than the insulator 250. The insulator 222, the insulator 254, and the insulator 274 preferably have lower permeability of one or both of hydrogen and oxygen than the insulator 280.

The oxide 230 preferably includes the oxide 230a positioned over the insulator 224, the oxide 230b positioned over the oxide 230a, and the oxide 230c that is positioned over the oxide 230b and is at least partly in contact with the top surface of the oxide 230b.

Note that although a structure of the transistor 200 in which three layers of the oxide 230a, the oxide 230b, and the oxide 230c are stacked in a region where a channel is formed (hereinafter also referred to as a channel formation region) and its vicinity is illustrated, the present invention is not limited thereto. For example, a single layer of the oxide 230b, a two-layer structure of the oxide 230a and the oxide 230b, a two-layer structure of the oxide 230b and the oxide 230c, or a stacked-layer structure of four or more layers may be provided.

In addition, in the transistor 200, as the oxide 230 (the oxide 230a, the oxide 230b, and the oxide 230c) including the channel formation region, a metal oxide functioning as a semiconductor (hereinafter also referred to as an oxide semiconductor) is preferably used.

The transistor 200 using an oxide semiconductor in the channel formation region exhibits extremely low leakage current in a non-conduction state (off-state current); hence, a semiconductor device with low power consumption can be provided. An oxide semiconductor can be deposited by a sputtering method or the like, and can thus be used in the transistor 200 constituting a highly integrated semiconductor device.

For example, as the oxide 230, a metal oxide such as an In-M-Zn oxide (the element M is one kind or a plurality of kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used for the element M. Furthermore, an In—Ga oxide, an In—Zn oxide, or a Ga—Zn oxide may be used as the oxide 230.

A transistor using an oxide semiconductor is likely to have its electrical characteristics changed when impurities and oxygen vacancies exist in a channel formation region of the oxide semiconductor, which might affect the reliability. Moreover, when the channel formation region of the oxide semiconductor includes oxygen vacancies, the transistor tends to have normally-on characteristics. Thus, it is preferable that oxygen vacancies in the channel formation region be reduced as much as possible. For example, oxygen is supplied to the oxide 230 through the insulator 250 or the like to fill the oxygen vacancies. Accordingly, variations in electrical characteristics are suppressed, so that a transistor having stable electrical characteristics and improved reliability can be provided.

In the case where an element included in the conductor 242 (the conductor 242a and the conductor 242b) that is provided on and in contact with the oxide 230 and functions as a source electrode and a drain electrode has a function of absorbing oxygen in the oxide 230, a low-resistance region is sometimes partly formed between the oxide 230 and the conductor 242, or in the vicinity of the surface of the oxide 230. In that case, in the low-resistance region, an impurity (hydrogen, nitrogen, a metal element, and the like) that enters oxygen vacancies serves as a donor and the carrier density increases in some cases. Note that in the following, hydrogen that enters oxygen vacancies is sometimes referred to as $V_oH$.

Figure 3A:
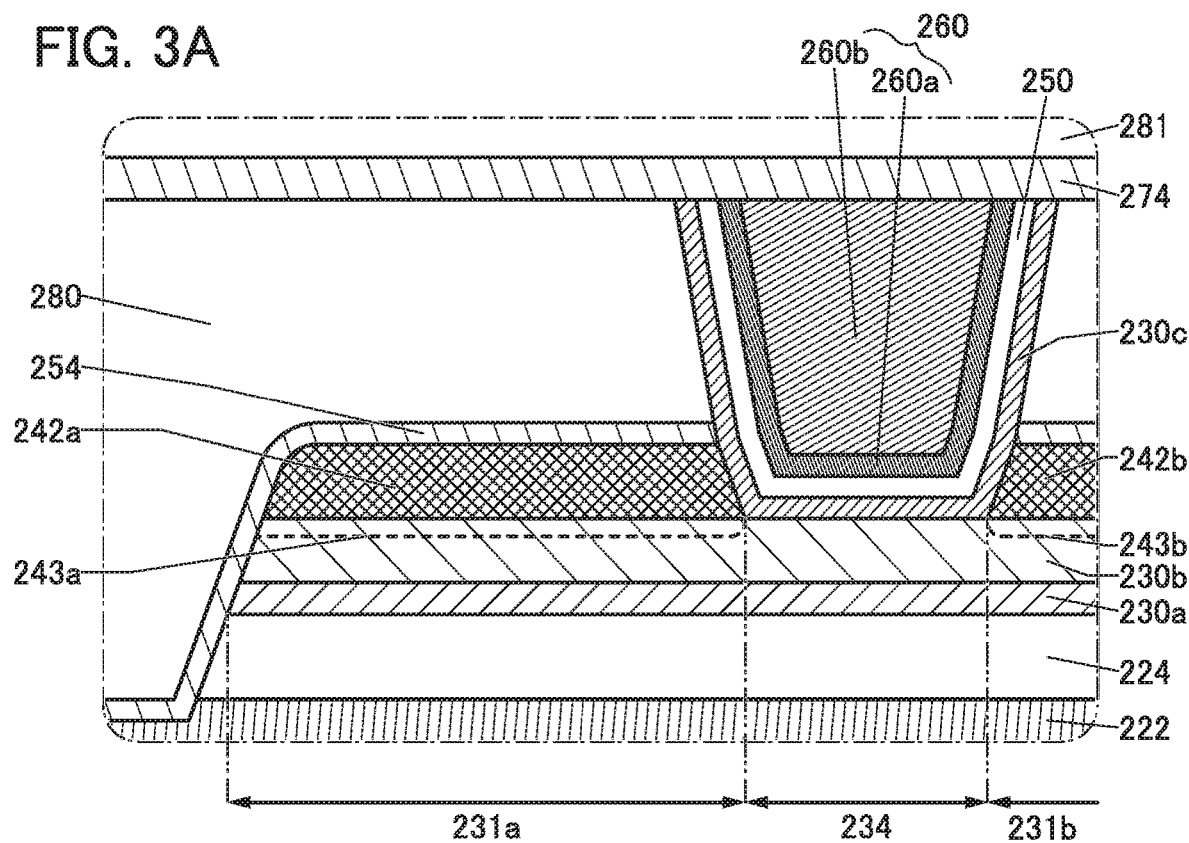
FIGS. 3A-3B Cross-sectional views of a semiconductor device according to one embodiment of the present invention.

FIG. 3(A) illustrates an enlarged view of a region of part of the transistor 200 illustrated in FIG. 1(B). As illustrated in FIG. 3(A), the conductor 242 is provided on and in contact with the oxide 230, and a region 243 (a region 243a and a region 243b) is sometimes formed as a low-resistance region at an interface between the oxide 230 and the conductor 242 and the vicinity of the interface. The oxide 230 includes a region 234 functioning as a channel formation region of the transistor 200 and a region 231 (a region 231a and a region 231b) including at least part of the region 243 and functioning as a source region or a drain region. Note that in the following drawings, even when the region 243 is not illustrated in an enlarged view and the like, the same region 243 has been formed in some cases.

Note that although an example in which the region 243a and the region 243b are provided to spread in the depth direction of the oxide 230b near the conductor 242 is illustrated, the present invention is not limited thereto. The region 243a and the region 243b can be formed as appropriate in accordance with the required electrical characteristics of the transistor. In the oxide 230, the boundaries between the regions are difficult to detect clearly in some cases. The concentration of an element detected in each region may not only gradually change between the regions, but also continuously change (also referred to as a gradation) within each region.

As illustrated in FIG. 1(B), the insulator 254 is preferably in contact with the top surfaces of the conductor 242a and the conductor 242b, side surfaces of the conductor 242a and the conductor 242b other than their side surfaces facing each other, the side surfaces of the oxide 230a and the oxide 230b, the side surface of the insulator 224, and part of the top surface of the insulator 222. Thus, the insulator 280 is isolated from the insulator 224, the oxide 230a, and the oxide 230b by the insulator 254. This can inhibit entry of impurities such as hydrogen contained in the insulator 280 and the like into the insulator 224, the oxide 230a, and the oxide 230b.

The insulator 274 is in contact with the top surfaces of the conductor 260, the insulator 250, and the oxide 230c. As illustrated in FIG. 3(A), the transistor 200 of one embodiment of the present invention has a structure in which the insulator 274 and the insulator 250 are in contact with each other. Such a structure can inhibit entry of impurities such as hydrogen contained in the insulator 281 and the like into the insulator 250. Thus, adverse effects on the electrical characteristics of the transistor and the reliability of the transistor can be suppressed.

As illustrated in FIG. 3(A), with reference to the bottom surface of the insulator 224, the height of the bottom surface of the conductor 260 in a region overlapping with the region 234 may be lower than the height of the top surfaces of the conductor 242a and the conductor 242b. For example, the difference between the height of the bottom surface of the conductor 260 in the region overlapping with the region 234 and the height of the top surfaces of the conductor 242a and the conductor 242b is greater than or equal to 0 nm and less than or equal to 30 nm, or greater than or equal to 0 nm and less than or equal to 15 nm.

Figure 3B:
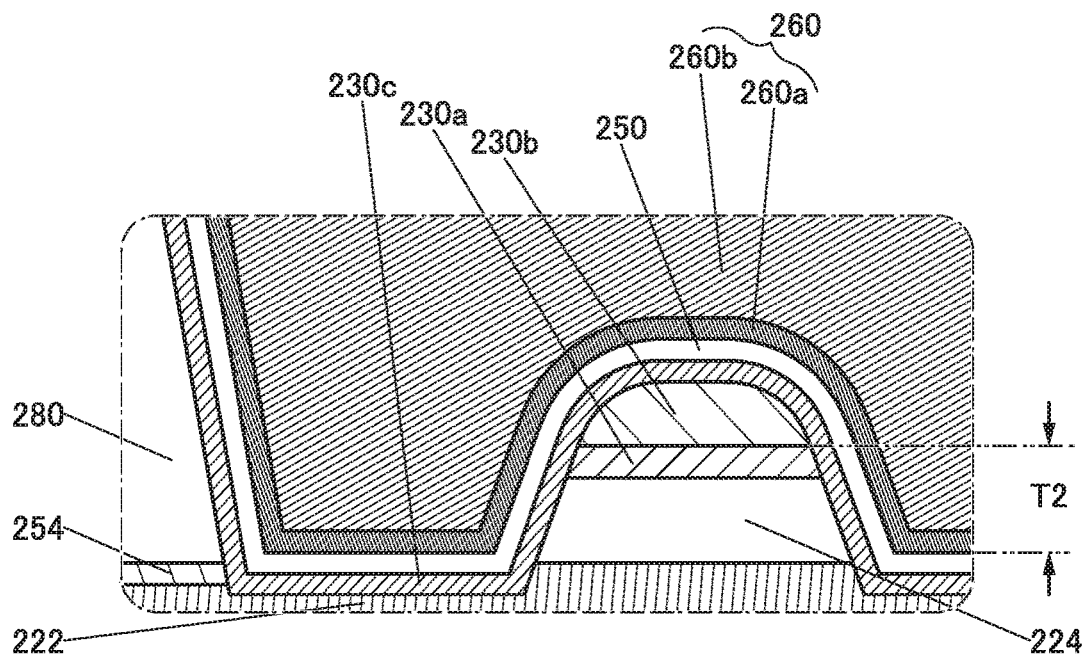

FIG. 3(B) illustrates an enlarged view of a region of part of the transistor 200 illustrated in FIG. 1(C). As illustrated in FIG. 1(C) and FIG. 3(B), in the channel width direction of the transistor 200, with reference to the bottom surface of the insulator 222, the height of the bottom surface of the conductor 260 in a region where the conductor 260 and the oxide 230b do not overlap with each other is preferably lower than the height of the bottom surface of the oxide 230b. When the conductor 260, which functions as a gate electrode, covers the side surface and the top surface of the oxide 230b in the channel formation region with the oxide 230c and the insulator 250 therebetween, electric fields of the conductor 260 are likely to affect the entire region 234 of the oxide 230b. Thus, the on-state current of the transistor 200 can be increased, and the frequency characteristics can be improved. When the difference between the height of the bottom surface of the conductor 260 in the region where the oxide 230a and the oxide 230b do not overlap with the conductor 260 and the height of the bottom surface of the oxide 230b is T2, T2 is greater than or equal to 0 nm and less than or equal to 100 nm, preferably greater than or equal to 3 nm and less than or equal to 50 nm, further preferably greater than or equal to 5 nm and less than or equal to 20 nm.

As illustrated in FIG. 3(B), in the channel width direction of the transistor 200, at least part of the oxide 230c in a region that does not overlap with the oxide 230b, the oxide 230a, and the insulator 224 is preferably in contact with the insulator 222. With such a structure, oxygen contained in the oxide 230c can be prevented from diffusing to the outside of the transistor 200 through the insulator 224. Alternatively, oxygen contained in the oxide 230b and the oxide 230a can be prevented from diffusing to the outside of the transistor 200 through the insulator 224. Alternatively, a decrease in the area of the insulator 224 reduces the amount of oxygen taken into the insulator 224, thereby suppressing a reduction in the amount of oxygen supplied to the oxide 230. Accordingly, oxygen contained in the oxide 230c can be efficiently supplied to the oxide 230b and the oxide 230a, thereby inhibiting a reduction in the resistance of the oxide 230 in the region 234. Thus, it is possible to suppress variations in electrical characteristics of the transistor, achieve stable electrical characteristics, and increase the reliability.

Alternatively, employing the above structure can inhibit entry of impurities such as hydrogen contained in the insulator 224 and the like into the oxide 230. That is, a reduction in the resistance of the oxide 230 can be inhibited. Accordingly, it is possible to suppress variations in electrical characteristics of the transistor, achieve stable electrical characteristics, and increase the reliability. Note that the structure can be formed by removing the insulator 224 in a region that does not overlap with the oxide 230b and the oxide 230a.

When the insulator 224 in the region that does not overlap with the oxide 230b and the oxide 230a is removed, as illustrated in FIG. 1(C), in the channel width direction of the transistor 200, with reference to the bottom surface of the insulator 222, the height of the bottom surface of the conductor 260 in a region where the oxide 230a and the oxide 230b do not overlap with the conductor 260 is likely to be lower than the height of the bottom surface of the oxide 230b. Thus, the on-state current of the transistor 200 can be increased, and the frequency characteristics can be improved.

Accordingly, a semiconductor device including a transistor having a high on-state current can be provided. A semiconductor device including a transistor having high frequency characteristics can be provided. A semiconductor device having suppressed variations in electrical characteristics, stable electrical characteristics, and improved reliability can be provided. In addition, a semiconductor device including a transistor having a low off-state current can be provided.

The detailed structure of the semiconductor device including the transistor 200 according to one embodiment of the present invention will be described below.

The conductor 205 is positioned to overlap with the oxide 230 and the conductor 260. Furthermore, the conductor 205 is preferably provided to be embedded in the insulator 214 and the insulator 216. Here, the top surface of the conductor 205 preferably has favorable planarity. For example, the average surface roughness (Ra) of the top surface of the conductor 205 is less than or equal to 1 nm, preferably less than or equal to 0.5 nm, further preferably less than or equal to 0.3 nm. This achieves favorable planarity of the insulator 224 formed over the conductor 205 and the increase in crystallinity of the oxide 230a, the oxide 230b, and the oxide 230c.

Here, the conductor 260 sometimes functions as a first gate (also referred to as top gate) electrode. The conductor 205 functions as a second gate electrode in some cases. In that case, by changing a potential applied to the conductor 205 not in conjunction with but independently of a potential applied to the conductor 260, the threshold voltage (Vth) of the transistor 200 can be controlled. In particular, by applying a negative potential to the conductor 205, Vth of the transistor 200 can be further increased, and the off-state current can be reduced. Thus, drain current at the time when a potential applied to the conductor 260 is 0 V can be lower in the case where a negative potential is applied to the conductor 205 than in the case where the negative potential is not applied to the conductor 205.

Note that as illustrated in FIG. 1(A), the conductor 205 is preferably provided larger than the channel formation region in the oxide 230. As illustrated in FIG. 1(C), it is particularly preferable that the conductor 205 also extend to a region outside an end portion of the oxide 230 that intersects with the channel width direction. That is, the conductor 205 and the conductor 260 preferably overlap with each other with the insulators therebetween on the outer side of the side surface of the oxide 230 in the channel width direction.

With the above structure, the channel formation region of the oxide 230 can be electrically surrounded by electric fields of the conductor 260 functioning as a first gate electrode and electric fields of the conductor 205 functioning as a second gate electrode. In this specification, a transistor structure in which a channel formation region is electrically surrounded by electric fields of a first gate electrode and a second gate electrode is referred to as a surrounded channel (S-channel) structure.

Furthermore, as illustrated in FIG. 1(C), the conductor 205 is extended to function as a wiring as well. However, without limitation to this structure, a structure where a conductor functioning as a wiring is provided below the conductor 205 may be employed. In addition, the conductor 205 is not necessarily provided in each transistor. For example, the conductor 205 may be shared by a plurality of transistors.

A conductive material containing tungsten, copper, or aluminum as its main component is preferably used for the conductor 205. Note that the conductor 205 is illustrated as a single layer but may have a stacked-layer structure, for example, a stack of the above conductive material and titanium or titanium nitride.

In addition, a conductor having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom (a conductor through which the above impurities are less likely to pass) may be used below the conductor 205. Alternatively, it is preferable to use a conductor having a function of inhibiting diffusion of oxygen (e.g., at least one of an oxygen atom, an oxygen molecule, and the like) (through which the above oxygen is less likely to pass). Note that in this specification, a function of inhibiting diffusion of impurities or oxygen means a function of inhibiting diffusion of any one or all of the above impurities and oxygen.

When a conductor having a function of inhibiting oxygen diffusion is used below the conductor 205, a reduction in conductivity of the conductor 205 due to oxidation can be inhibited. As the conductor having a function of inhibiting oxygen diffusion, for example, tantalum, tantalum nitride, ruthenium, ruthenium oxide, or the like is preferably used. Accordingly, the conductor used below the conductor 205 may be a single layer or stacked layers of the above conductive materials.

The insulator 214 preferably functions as a barrier insulating film that inhibits diffusion of impurities such as water and hydrogen into the transistor 200 from the substrate side. Accordingly, for the insulator 214, it is preferable to use an insulating material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom (an insulating material through which the above impurities are less likely to pass). Alternatively, it is preferable to use an insulating material that has a function of inhibiting diffusion of oxygen (e.g., at least one of an oxygen atom, an oxygen molecule, and the like) (through which the above oxygen is less likely to pass).

For example, aluminum oxide, silicon nitride, or the like is preferably used for the insulator 214. Accordingly, impurities such as water and hydrogen can be inhibited from diffusing to the transistor 200 side from the substrate side through the insulator 214. Alternatively, oxygen contained in the insulator 224 and the like can be inhibited from diffusing to the substrate side through the insulator 214.

The permittivity of the insulator 216, the insulator 280, and the insulator 281 each functioning as an interlayer film is preferably lower than that of the insulator 214. When a material with a low permittivity is used for an interlayer film, the parasitic capacitance generated between wirings can be reduced. For example, as the insulator 216, the insulator 280, and the insulator 281, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like is used as appropriate.

The insulator 216 may have a stacked-layer structure. For example, in the insulator 216, an insulator similar to the insulator 214 may be provided at least in a portion in contact with a side surface of the conductor 205. Such a structure can inhibit oxidation of the conductor 205 due to oxygen contained in the insulator 216, or can inhibit absorption of oxygen contained in the insulator 216 by the conductor 205.

The insulator 222 and the insulator 224 have a function of a gate insulator.

Here, it is preferred that the insulator 224, which is in contact with the oxide 230, release oxygen by heating. In this specification, oxygen that is released by heating is referred to as excess oxygen in some cases. For example, silicon oxide, silicon oxynitride, or the like is used as appropriate for the insulator 224. When an insulator containing oxygen is provided in contact with the oxide 230, oxygen vacancies in the oxide 230 can be reduced and the reliability of the transistor 200 can be improved.

As the insulator 224, specifically, an oxide material from which part of oxygen is released by heating is preferably used. An oxide film that releases oxygen by heating is an oxide film in which the amount of released oxygen converted into oxygen atoms is greater than or equal to $1.0\times10^{18}$ atoms/cm$^3$, preferably greater than or equal to $1.0\times10^{19}$ atoms/cm$^3$, further preferably greater than or equal to $2.0\times10^{19}$ atoms/cm$^3$ or greater than or equal to $3.0\times10^{20}$ atoms/cm$^3$ in TDS (Thermal Desorption Spectroscopy) analysis. Note that the temperature of the film surface in the TDS analysis is preferably higher than or equal to 100° C. and lower than or equal to 700° C., or higher than or equal to 100° C. and lower than or equal to 400° C.

The insulator 222 preferably functions as a barrier insulating film that inhibits diffusion of impurities such as water and hydrogen into the transistor 200 from the substrate side. For example, the insulator 222 preferably has lower hydrogen permeability than the insulator 224. By surrounding the insulator 224, the oxide 230, and the like with the insulator 222 and the insulator 254, diffusion of impurities such as water and hydrogen into the insulator 224 and the oxide 230 from the outside can be inhibited.

Furthermore, it is preferable that the insulator 222 have a function of inhibiting diffusion of oxygen (e.g., at least one of an oxygen atom, an oxygen molecule, and the like) (through which the above oxygen is less likely to pass). For example, the insulator 222 preferably has lower oxygen permeability than the insulator 224. When the insulator 222 has a function of inhibiting diffusion of oxygen and impurities, diffusion of oxygen contained in the oxide 230 into the substrate side can be reduced, which is preferable. Furthermore, the conductor 205 can be inhibited from reacting with oxygen contained in the insulator 224 and the oxide 230.

As the insulator 222, an insulator containing an oxide of one or both of aluminum and hafnium, which is an insulating material, is preferably used. As the insulator containing an oxide of one or both of aluminum and hafnium, aluminum oxide, hafnium oxide, an oxide containing aluminum and hafnium (hafnium aluminate), or the like is preferably used. In the case where the insulator 222 is formed using such a material, the insulator 222 functions as a layer that inhibits release of oxygen from the oxide 230 and diffusion of impurities such as hydrogen from the periphery of the transistor 200 into the oxide 230. Note that among the above-described materials, hafnium oxide is particularly suitably used as the insulator 222. For example, when the insulator 222 is used as a gate insulating film, the use of hafnium oxide as the insulator 222 can sometimes reduce the interface state density, as compared to the case of using aluminum oxide.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

A single layer or stacked layers of an insulator containing what is called a high-k material such as aluminum oxide, hafnium oxide, tantalum oxide, zirconium oxide, lead zirconate titanate (PZT), strontium titanate ($SrTiO_3$), or (Ba, Sr)TiO$_3$(BST) may be used for the insulator 222. With miniaturization and high integration of transistors, a problem such as leakage current may arise because of a thinner gate insulator. When a high-k material is used for an insulator functioning as a gate insulator, a gate potential during operation of the transistor can be reduced while the physical thickness of the gate insulator is kept.

As illustrated in FIG. 1(C), the insulator 222 may have a smaller thickness in a region that does not overlap with the oxide 230b than in the other regions. The thickness of the insulator 222 in the region that does not overlap with the oxide 230b is preferably a thickness with which the insulator 222 can function as an etching stopper film or a thickness large enough to prevent the surface of the insulator 216 or the conductor 205 from being exposed, at the time of forming an opening in the insulator 280 and the like.

Note that the insulator 222 and the insulator 224 may each have a stacked-layer structure of two or more layers. In that case, without limitation to a stacked-layer structure formed of the same material, a stacked-layer structure formed of different materials may be employed. For example, an insulator similar to the insulator 224 may be provided below the insulator 222.

The oxide 230 includes the oxide 230a, the oxide 230b over the oxide 230a, and the oxide 230c over the oxide 230b. Including the oxide 230a below the oxide 230b makes it possible to inhibit diffusion of impurities into the oxide 230b from the components formed below the oxide 230a. Moreover, including the oxide 230c over the oxide 230b makes it possible to inhibit diffusion of impurities into the oxide 230b from the components formed above the oxide 230c.

Note that the oxide 230 preferably has a stacked-layer structure of oxides with different chemical compositions. Specifically, the atomic ratio of the element M to the constituent elements in the metal oxide used for the oxide 230a is preferably greater than the atomic ratio of the element M to the constituent elements in the metal oxide used for the oxide 230b. Moreover, the atomic ratio of the element M to In in the metal oxide used for the oxide 230a is preferably greater than the atomic ratio of the element M to In in the metal oxide used for the oxide 230b. Furthermore, the atomic ratio of In to the element M in the metal oxide used for the oxide 230b is preferably greater than the atomic ratio of In to the element M in the metal oxide used for the oxide 230a. A metal oxide that can be used for the oxide 230a or the oxide 230b can be used for the oxide 230c.

The oxide 230b and the oxide 230c preferably have crystallinity. For example, a CAAC-OS (c-axis aligned crystalline oxide semiconductor) described later is preferably used. An oxide having crystallinity, such as a CAAC-OS, has a dense structure with small amounts of impurities and defects (e.g., oxygen vacancies) and high crystallinity. This can inhibit oxygen extraction from the oxide 230b by the source electrode or the drain electrode. This can reduce oxygen extraction from the oxide 230b even when heat treatment is performed; thus, the transistor 200 is stable with respect to high temperatures in a manufacturing process (what is called thermal budget).

The conduction band minimum of each of the oxide 230a and the oxide 230c is preferably closer to the vacuum level than the conduction band minimum of the oxide 230b. In other words, the electron affinity of each of the oxide 230a and the oxide 230c is preferably smaller than the electron affinity of the oxide 230b. In that case, a metal oxide that can be used for the oxide 230a is preferably used for the oxide 230c. Specifically, the atomic ratio of the element M to the constituent elements in the metal oxide used for the oxide 230c is preferably greater than the atomic ratio of the element M to the constituent elements in the metal oxide used for the oxide 230b. Moreover, the atomic ratio of the element M to In in the metal oxide used for the oxide 230c is preferably greater than the atomic ratio of the element M to In in the metal oxide used for the oxide 230b. Furthermore, the atomic ratio of In to the element M in the metal oxide used for the oxide 230b is preferably greater than the atomic ratio of In to the element M in the metal oxide used for the oxide 230c.

In the case where the oxide 230c has a stacked-layer structure including an oxide 230c1 and an oxide 230c2, the conduction band minimum of each of the oxide 230a and the oxide 230c2 is preferably closer to the vacuum level than the conduction band minimum of each of the oxide 230b and the oxide 230c1. In other words, the electron affinity of each of the oxide 230a and the oxide 230c2 is preferably smaller than the electron affinity of each of the oxide 230b and the oxide 230c1. In that case, it is preferred that a metal oxide that can be used as the oxide 230a be used as the oxide 230c2, and a metal oxide that can be used as the oxide 230b be used as the oxide 230c1.

The conduction band minimum gradually changes at a junction portion of the oxide 230a, the oxide 230b, and the oxide 230c. In other words, the conduction band minimum at a junction portion of the oxide 230a, the oxide 230b, and the oxide 230c continuously changes or is continuously connected. To obtain this, the density of defect states in a mixed layer formed at an interface between the oxide 230a and the oxide 230b and an interface between the oxide 230b and the oxide 230c is preferably made low.

Specifically, when the oxide 230a and the oxide 230b or the oxide 230b and the oxide 230c contain the same element (as a main component) in addition to oxygen, a mixed layer with a low density of defect states can be formed. For example, in the case where the oxide 230b is an In—Ga—Zn oxide, an In—Ga—Zn oxide, a Ga—Zn oxide, a gallium oxide, or the like may be used for the oxide 230a and the oxide 230c. In the case where the oxide 230c has a stacked-layer structure of the oxide 230c1 and the oxide 230c2, it is possible to employ a stacked-layer structure of an In—Ga—Zn oxide and a Ga—Zn oxide over the In—Ga—Zn oxide, or a stacked-layer structure of an In—Ga—Zn oxide and gallium oxide over the In—Ga—Zn oxide, for example. In other words, a stacked-layer structure of an In—Ga—Zn oxide and an oxide that does not contain In may be used for the oxide 230c.

Specifically, as the oxide 230a, a metal oxide having In:Ga:Zn=1:3:4 [atomic ratio] or In:Ga:Zn=1:1:0.5 [atomic ratio] is used. As the oxide 230b, a metal oxide having In:Ga:Zn=4:2:3 [atomic ratio] or In:Ga:Zn=3:1:2 [atomic ratio] is used. As the oxide 230c, a metal oxide having In:Ga:Zn=1:3:4 [atomic ratio], In:Ga:Zn=4:2:3 [atomic ratio], Ga:Zn=2:1 [atomic ratio], or Ga:Zn=2:5 [atomic ratio] is used. Specific examples of the oxide 230c having a stacked-layer structure include a stacked-layer structure of In:Ga:Zn=4:2:3 [atomic ratio] and In:Ga:Zn=1:3:4 [atomic ratio], a stacked-layer structure of In:Ga:Zn=4:2:3 [atomic ratio] and Ga:Zn=2:1 [atomic ratio], a stacked-layer structure of In:Ga:Zn=4:2:3 [atomic ratio] and Ga:Zn=2:5 [atomic ratio], and a stacked-layer structure of In:Ga:Zn=4:2:3 [atomic ratio] and gallium oxide.

At this time, the oxide 230b serves as a main carrier path. Alternatively, in the case where the oxide 230c has a stacked-layer structure including the oxide 230c1 and the oxide 230c2, not only the oxide 230b but also the oxide 230c1 serves as a main carrier path in some cases. When the oxide 230a and the oxide 230c have the above structure, the density of defect states at the interface between the oxide 230a and the oxide 230b and the interface between the oxide 230b and the oxide 230c can be made low. Thus, the influence of interface scattering on carrier conduction is small, and the transistor 200 can have high on-state current and high frequency characteristics. Note that in the case where the oxide 230c has a stacked-layer structure, in addition to the effect of reducing the density of defect states at the interface between the oxide 230b and the oxide 230c, the effect of inhibiting diffusion of the constituent element of the oxide 230c to the insulator 250 side is expected. More specifically, since the oxide 230c has a stacked-layer structure in which an oxide that does not contain In is positioned in the upper layer, the diffusion of In to the insulator 250 side can be inhibited. Since the insulator 250 functions as a gate insulator, the transistor exhibits poor characteristics when In enters the insulator 250 and the like. Thus, when the oxide 230c has a stacked-layer structure, a highly reliable semiconductor device can be provided.

A metal oxide functioning as an oxide semiconductor is preferably used as the oxide 230. For example, as the metal oxide to be the region 234, it is preferable to use a metal oxide having a band gap of 2 eV or more, preferably 2.5 eV or more. With the use of a metal oxide having such a wide band gap, the off-state current of the transistor can be reduced. With the use of such a transistor, a semiconductor device with low power consumption can be provided.

The conductor 242 (the conductor 242a and the conductor 242b) functioning as the source electrode and the drain electrode is provided over the oxide 230b. The thickness of the conductor 242 is greater than or equal to 1 nm and less than or equal to 50 nm, preferably greater than or equal to 2 nm and less than or equal to 25 nm, for example.

For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

Like the insulator 214 and the like, the insulator 254 preferably functions as a barrier insulating film that inhibits diffusion of impurities such as water and hydrogen into the transistor 200 from the insulator 280 side. For example, the insulator 254 preferably has lower hydrogen permeability than the insulator 224. Furthermore, as illustrated in FIG. 1(B) and FIG. 1(C), the insulator 254 is preferably in contact with the top surface and the side surface of the conductor 242a, the top surface and the side surface of the conductor 242b, the side surfaces of the oxide 230a and the oxide 230b, and the side surface of the insulator 224. With such a structure, the insulator 280 is isolated from the insulator 224 and the oxide 230 by the insulator 254. Accordingly, hydrogen contained in the insulator 280 can be inhibited from diffusing into the oxide 230 through the top surfaces or side surfaces of the conductor 242a, the conductor 242b, the oxide 230a, the oxide 230b, and the insulator 224; hence, the transistor 200 can be provided with favorable electrical characteristics and reliability.

It is also preferable that the insulator 254 have a function of inhibiting diffusion of oxygen (e.g., at least one of an oxygen atom, an oxygen molecule, and the like) (through which the above oxygen is less likely to pass). For example, the insulator 254 preferably has lower oxygen permeability than the insulator 280 or the insulator 224.

The insulator 254 is preferably deposited by a sputtering method. When the insulator 254 is deposited by a sputtering method in an oxygen-containing atmosphere, oxygen can be added to the vicinity of a region of the insulator 224 that is in contact with the insulator 254. Accordingly, oxygen can be supplied from the region to the oxide 230 through the insulator 224. Here, with the insulator 254 having a function of inhibiting upward oxygen diffusion, oxygen can be prevented from diffusing from the oxide 230 into the insulator 280. Moreover, with the insulator 222 having a function of inhibiting downward oxygen diffusion, oxygen can be prevented from diffusing from the oxide 230 to the substrate side. In this manner, oxygen is supplied to the channel formation region of the oxide 230. Accordingly, oxygen vacancies in the oxide 230 can be reduced, so that the transistor can be inhibited from becoming normally on.

An insulator containing an oxide of one or both of aluminum and hafnium is preferably deposited as the insulator 254, for example. Note that as the insulator containing an oxide of one or both of aluminum and hafnium, aluminum oxide, hafnium oxide, an oxide containing aluminum and hafnium (hafnium aluminate), or the like is preferably used. In this case, the insulator 254 is preferably deposited using an atomic layer deposition (ALD) method. An ALD method is a deposition method that provides good coverage, and thus can prevent formation of disconnection or the like due to unevenness of the insulator 254.

As described above, the insulator 224 and the metal oxide 230 are covered with the insulator 254 having a barrier property against hydrogen, whereby the insulator 280 is isolated from the insulator 224 and the metal oxide 230. Accordingly, the entry of impurities such as hydrogen from the outside of the transistor 200 can be inhibited, and the transistor 200 can be provided with favorable electrical characteristics and reliability.

Alternatively, an insulator containing aluminum nitride may be used as the insulator 254, for example. It is preferable to use a nitride insulator that satisfies the composition formula $AlN_x$ (x is a real number greater than 0 and less than or equal to 2, preferably x is a real number greater than 0.5 and less than or equal to 1.5) as the insulator 254. Accordingly, a film having an excellent insulating property and high thermal conductivity can be obtained, and thus dissipation of heat generated in driving the transistor 200 can be increased. Alternatively, aluminum titanium nitride, titanium nitride, or the like can be used as the insulator 254. In that case, deposition by a sputtering method is preferable because deposition can be performed without using a highly oxidizing gas such as oxygen or ozone as a deposition gas. Alternatively, silicon nitride, silicon nitride oxide, or the like can be used.

The insulator 254 can have a multilayer structure of two or more layers. For example, the insulator 254 may have a two-layer structure in which the first layer is deposited by a sputtering method in an oxygen-containing atmosphere and then the second layer is deposited by an ALD method. An ALD method is a deposition method achieving excellent step coverage, and thus can prevent formation of disconnection or the like due to unevenness of the first layer. Note that in the case of employing a multilayer structure of two or more layers, the insulator 254 may have a multilayer structure using different materials. For example, a stacked-layer structure of silicon oxide, silicon oxynitride, silicon nitride oxide, or silicon nitride and an insulator having a function of inhibiting transmission of oxygen and impurities such as hydrogen may be employed. As the insulator having a function of inhibiting transmission of oxygen and impurities such as hydrogen, an insulator containing an oxide of one or both of aluminum and hafnium can be used, for example.

The insulator 250 functions as a gate insulator. The insulator 250 is preferably positioned in contact with at least part of the oxide 230c. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used. In particular, silicon oxide and silicon oxynitride, which have thermal stability, are preferable.

Like the insulator 224, the insulator 250 is preferably formed using an insulator from which oxygen is released by heating. When an insulator from which oxygen is released by heating is provided as the insulator 250 in contact with at least part of the oxide 230c, oxygen can be effectively supplied to the region 234 of the oxide 230b. Furthermore, as in the insulator 224, the concentration of impurities such as water and hydrogen in the insulator 250 is preferably reduced. The thickness of the insulator 250 is preferably greater than or equal to 1 nm and less than or equal to 20 nm.

Furthermore, a metal oxide may be provided between the insulator 250 and the conductor 260. The metal oxide preferably inhibits diffusion of oxygen from the insulator 250 into the conductor 260. Providing the metal oxide that inhibits oxygen diffusion suppresses diffusion of oxygen from the insulator 250 into the conductor 260. That is, a reduction in the amount of oxygen supplied to the oxide 230 can be inhibited. Furthermore, oxidation of the conductor 260 due to oxygen from the insulator 250 can be inhibited.

Note that the metal oxide functions as part of the gate insulator in some cases. Therefore, when silicon oxide, silicon oxynitride, or the like is used for the insulator 250, a metal oxide that is a high-k material with a high dielectric constant is preferably used as the metal oxide. When the gate insulator has a stacked-layer structure of the insulator 250 and the metal oxide, the stacked-layer structure can be thermally stable and have a high dielectric constant. Thus, a gate potential that is applied during operation of the transistor can be reduced while the physical thickness of the gate insulator is maintained. Furthermore, the equivalent oxide thickness (EOT) of the insulator functioning as the gate insulator can be reduced.

The metal oxide may have a function of part of the first gate. For example, an oxide semiconductor that can be used for the oxide 230 can be used as the metal oxide. In that case, when the conductor 260 is deposited by a sputtering method, the metal oxide can have a reduced electric resistance to be a conductor. This can be referred to as an OC (Oxide Conductor) electrode.

With the metal oxide, the on-state current of the transistor 200 can be increased without a reduction in the influence of electric fields from the conductor 260. Since the distance between the conductor 260 and the oxide 230 is kept by the physical thicknesses of the insulator 250 and the metal oxide, a leakage current between the conductor 260 and the oxide 230 can be reduced. Moreover, when the stacked-layer structure of the insulator 250 and the metal oxide is provided, the physical distance between the conductor 260 and the oxide 230 and the intensity of electric fields applied to the oxide 230 from the conductor 260 can be easily adjusted as appropriate.

Specifically, a metal oxide containing one kind or two or more kinds selected from hafnium, aluminum, gallium, yttrium, zirconium, tungsten, titanium, tantalum, nickel, germanium, magnesium, and the like can be used. In particular, aluminum oxide, hafnium oxide, an oxide containing aluminum and hafnium (hafnium aluminate), or the like, which is an insulator containing an oxide of one or both of aluminum and hafnium, is preferably used. Furthermore, the oxide semiconductor that can be used for the oxide 230 can also be used for the metal oxide when the resistance thereof is reduced.

Although FIG. 1 shows that the conductor 260 has a two-layer structure, the conductor 260 may have a single-layer structure or a stacked-layer structure of three or more layers.

For the conductor 260a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like).

When the conductor 260a has a function of inhibiting oxygen diffusion, the conductivity of the conductor 260b can be inhibited from being lowered because of oxidation due to oxygen contained in the insulator 250. As a conductive material that has a function of inhibiting diffusion of oxygen, for example, tantalum, tantalum nitride, ruthenium, ruthenium oxide, or the like is preferably used.

The conductor 260 also functions as a wiring and thus is preferably formed using a conductor having high conductivity. For example, a conductive material containing tungsten, copper, or aluminum as its main component can be used for the conductor 260b. The conductor 260b may have a stacked-layer structure, for example, a stacked-layer structure of any of the above conductive materials and titanium or titanium nitride.

The insulator 280 is provided over the insulator 222, the insulator 224, the oxide 230, and the conductor 242 with the insulator 254 therebetween. For example, as the insulator 280, silicon oxide, silicon oxynitride, silicon nitride oxide, silicon oxide to which fluorine is added, silicon oxide to which carbon is added, silicon oxide to which carbon and nitrogen are added, porous silicon oxide, or the like is preferably included. In particular, silicon oxide and silicon oxynitride, which have thermal stability, are preferable. Materials such as silicon oxide, silicon oxynitride, and porous silicon oxide, in each of which a region containing oxygen released by heating can be easily formed, are particularly preferable.

The concentration of impurities such as water and hydrogen in the insulator 280 is preferably reduced. In addition, the top surface of the insulator 280 may be planarized.

As in the insulator 214 and the like, the insulator 274 preferably functions as a barrier insulating film that inhibits diffusion of impurities such as water and hydrogen into the insulator 280 from above. As the insulator 274, for example, an insulator that can be used as the insulator 214, the insulator 254, and the like can be used.

The insulator 281 functioning as an interlayer film is preferably provided over the insulator 274. As in the insulator 224 and the like, the concentration of impurities such as water and hydrogen in the insulator 281 is preferably reduced.

The conductor 240a and the conductor 240b are positioned in openings formed in the insulator 281, the insulator 274, the insulator 280, and the insulator 254. The conductor 240a and the conductor 240b are provided to face each other with the conductor 260 therebetween. Note that top surfaces of the conductor 240a and the conductor 240b may be on the same plane as the top surface of the insulator 281.

Note that the insulator 241a is provided in contact with a side wall of the opening in the insulator 281, the insulator 274, the insulator 280, and the insulator 254, and the first conductor of the conductor 240a is formed on a side surface of the insulator 241a. The conductor 242a is located on at least part of the bottom portion of the opening, and the conductor 240a is in contact with the conductor 242a. Similarly, the insulator 241b is provided in contact with a side wall of the opening in the insulator 281, the insulator 274, the insulator 280, and the insulator 254, and the first conductor of the conductor 240b is formed on a side surface of the insulator 241b. The conductor 242b is located on at least part of the bottom portion of the opening, and the conductor 240b is in contact with the conductor 242b.

For the conductor 240a and the conductor 240b, a conductive material containing tungsten, copper, or aluminum as its main component is preferably used. In addition, the conductor 240a and the conductor 240b may have a stacked-layer structure.

In the case where the conductor 240 has a stacked-layer structure, a conductive material having a function of inhibiting transmission of impurities such as water and hydrogen is preferably used for a conductor in contact with the oxide 230a, the oxide 230b, the conductor 242, the insulator 254, the insulator 280, the insulator 274, and the insulator 281. For example, tantalum, tantalum nitride, titanium, titanium nitride, ruthenium, ruthenium oxide, or the like is preferably used. The conductive material having a function of inhibiting transmission of impurities such as water and hydrogen may be used as a single layer or stacked layers. The use of the conductive material can prevent oxygen added to the insulator 280 from being absorbed by the conductor 240a and the conductor 240b. Moreover, impurities such as water and hydrogen contained in a layer above the insulator 281 can be inhibited from diffusing into the oxide 230 through the conductor 240a and the conductor 240b.

An insulator that can be used as the insulator 254 and the like is used as the insulator 241a and the insulator 241b, for example. Since the insulator 241a and the insulator 241b are provided in contact with the insulator 254, impurities such as water and hydrogen contained in the insulator 280 and the like can be inhibited from diffusing into the oxide 230 through the conductor 240a and the conductor 240b. In addition, oxygen contained in the insulator 280 can be prevented from being absorbed by the conductor 240a and the conductor 240b. Note that the insulator 241a and the insulator 241b can be formed by an ALD method or a chemical vapor deposition (CVD) method.

In addition, although not illustrated, a conductor functioning as a wiring may be provided in contact with the top surface of the conductor 240a and the top surface of the conductor 240b. For the conductor functioning as a wiring, a conductive material containing tungsten, copper, or aluminum as its main component is preferably used. Furthermore, the conductor may have a stacked-layer structure, for example, a stack of the above conductive material and titanium or titanium nitride. Note that the conductor may be formed to be embedded in an opening provided in an insulator.

In addition, although not illustrated, an insulator having resistivity higher than or equal to $1.0 \times 10^{13}$ Ωcm and lower than or equal to $1.0 \times 10^{15}$ Ωcm, preferably higher than or equal to $5.0 \times 10^{13}$ Ωcm and lower than or equal to $5.0 \times 10^{14}$ Ωcm is preferably provided to cover the above conductor. It is preferable that an insulator having the above resistivity be provided over the conductor, in which case the insulator can disperse electric charge accumulated in the transistor 200, a wiring (e.g., the conductor), and the like and can inhibit poor characteristics and electrostatic breakdown of the transistor and an electronic device including the transistor due to the electric charge, while maintaining the insulating property.

<Constituent Materials of Semiconductor Device>

Constituent materials that can be used for a semiconductor device are described below.

«Substrate»

As a substrate where the transistor 200 is formed, an insulator substrate, a semiconductor substrate, or a conductor substrate is used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like and a compound semiconductor substrate made of silicon carbide, silicon germanium, gallium arsenide, indium phosphide, zinc oxide, or gallium oxide. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor, a resistor, a switching element, a light-emitting element, and a memory element.

«Insulator»

Examples of an insulator include an oxide, a nitride, an oxynitride, a nitride oxide, a metal oxide, a metal oxynitride, and a metal nitride oxide, each of which has an insulating property.

As miniaturization and high integration of transistors progress, for example, a problem such as leakage current may arise because of a thinner gate insulator. When a high-k material is used for the insulator functioning as a gate insulator, the voltage when the transistor operates can be reduced while keeping the physical thickness of the gate insulator. In contrast, when a material with a low dielectric constant is used for the insulator functioning as an interlayer film, parasitic capacitance generated between wirings can be reduced. Thus, a material is preferably selected depending on the function of an insulator.

Examples of the insulator with a high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator with a low dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor using an oxide semiconductor is surrounded by insulators having a function of inhibiting transmission of oxygen and impurities such as hydrogen (the insulator 214, the insulator 222, the insulator 254, the insulator 274, and the like), the electrical characteristics of the transistor can be stable. For the insulator having a function of inhibiting transmission of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum can be used. Specifically, as the insulator having a function of inhibiting transmission of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide or a metal nitride such as aluminum nitride, aluminum titanium nitride, titanium nitride, silicon nitride oxide, or silicon nitride can be used.

In addition, the insulator functioning as the gate insulator is preferably an insulator including a region containing oxygen released by heating. For example, when a structure is employed in which silicon oxide or silicon oxynitride including a region containing oxygen released by heating is in contact with the oxide 230, oxygen vacancies included in the oxide 230 can be compensated for.

«Conductor»

For the conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. A semiconductor having high electrical conductivity, typified by polycrystalline silicon containing an impurity element such as phosphorus, or silicide such as nickel silicide may be used.

A stack including a plurality of conductive layers formed of the above materials may be used. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed.

Note that when an oxide is used for the channel formation region of the transistor, a stacked-layer structure in which a material containing the above metal element and a conductive material containing oxygen are combined is preferably used for the conductor functioning as the gate electrode. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide where the channel is formed. Alternatively, a conductive material containing the above metal element and nitrogen may be used. For example, a conductive material containing nitrogen, such as titanium nitride or tantalum nitride, may be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen contained in the metal oxide where the channel is formed can be trapped in some cases. Alternatively, hydrogen entering from an external insulator or the like can be trapped in some cases.

«Metal Oxide»

As the oxide 230, a metal oxide functioning as a semiconductor is preferably used. A metal oxide that can be used as the oxide 230 according to the present invention is described below.

The metal oxide preferably contains at least indium or zinc. In particular, indium and zinc are preferably contained. Moreover, aluminum, gallium, yttrium, tin, or the like is preferably contained in addition to them. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, an element M, and zinc is considered. Note that the element M is aluminum, gallium, yttrium, tin, or the like. Other elements that can be used as the element M include boron, titanium, iron, nickel, germanium, zirconium, molybdenum, lanthanum, cerium, neodymium, hafnium, tantalum, tungsten, and magnesium. Note that it is sometimes acceptable to use a plurality of the above-described elements in combination as the element M.

Note that in this specification and the like, a metal oxide containing nitrogen is also collectively referred to as a metal oxide in some cases. A metal oxide containing nitrogen may be referred to as a metal oxynitride.

[Structure of Metal Oxide]

Oxide semiconductors (metal oxides) can be classified into a single crystal oxide semiconductor and a non-single-crystal oxide semiconductor. Examples of a non-single-crystal oxide semiconductor include a CAAC-OS, a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter referred to as an In layer) and a layer containing the element M, zinc, and oxygen (hereinafter referred to as an (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can also be referred to as an (In,M) layer.

The CAAC-OS is a metal oxide with high crystallinity. By contrast, in the CAAC-OS, a reduction in electron mobility due to a crystal grain boundary is less likely to occur because it is difficult to observe a clear crystal grain boundary. Entry of impurities, formation of defects, or the like might decrease the crystallinity of a metal oxide; thus, it can be said that the CAAC-OS is a metal oxide that has small amounts of impurities and defects (e.g., oxygen vacancies (also referred to as $V_O$)). Thus, a metal oxide including a CAAC-OS is physically stable. Therefore, the metal oxide including a CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

Note that indium-gallium-zinc oxide (hereinafter IGZO) that is a kind of metal oxide containing indium, gallium, and zinc has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS includes a void or a low-density region. That is, the a-like OS has low crystallinity compared with the nc-OS and the CAAC-OS.

An oxide semiconductor (metal oxide) can have various structures which show different properties. Two or more of the amorphous oxide semiconductor, the polycrystalline oxide semiconductor, the a-like OS, the nc-OS, and the CAAC-OS may be included in an oxide semiconductor of one embodiment of the present invention.

[Impurities]

Here, the influence of each impurity in the metal oxide will be described.

When the metal oxide contains an alkali metal or an alkaline earth metal, defect states are formed and carriers are generated in some cases. Thus, a transistor using a metal oxide that contains an alkali metal or an alkaline earth metal for its channel formation region is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide obtained by secondary ion mass spectrometry (SIMS) (the concentration obtained by SIMS) is set lower than or equal to $1\times10^{18}$ atoms/cm$^3$, preferably lower than or equal to $2\times10^{16}$ atoms/cm$^3$.

Hydrogen contained in a metal oxide reacts with oxygen bonded to a metal atom to be water, and thus forms an oxygen vacancy in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using a metal oxide containing hydrogen is likely to have normally-on characteristics.

Accordingly, hydrogen in the metal oxide is preferably reduced as much as possible. Specifically, the hydrogen concentration of the metal oxide obtained by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide in which impurities are sufficiently reduced is used in a channel formation region of a transistor, stable electrical characteristics can be given.

As a metal oxide used for a semiconductor of a transistor, a thin film having high crystallinity is preferably used. With the use of the thin film, the stability or reliability of the transistor can be improved. Examples of the thin film include a thin film of a single crystal metal oxide and a thin film of a polycrystalline metal oxide. However, to form the thin film of a single crystal metal oxide or the thin film of a polycrystalline metal oxide over a substrate, a high-temperature process or a laser heating process is needed. Thus, manufacturing cost is increased, and throughput is decreased.

Non-Patent Document 1 and Non-Patent Document 2 have reported that an In—Ga—Zn oxide having a CAAC structure (referred to as CAAC-IGZO) was found in 2009. Here, it has been reported that CAAC-IGZO has c-axis alignment, a crystal grain boundary is not clearly observed in CAAC-IGZO, and CAAC-IGZO can be formed over a substrate at low temperatures. It has also been reported that a transistor using CAAC-IGZO has excellent electrical characteristics and high reliability.

In addition, an In—Ga—Zn oxide having an nc structure (referred to as nc-IGZO) was found in 2013 (see Non-Patent Document 3). It has been reported that nc-IGZO has periodic atomic arrangement in a microscopic region (e.g., a region with a size greater than or equal to 1 nm and less than or equal to 3 nm) and there is no regularity of crystal orientation between different regions.

Non-Patent Document 4 and Non-Patent Document 5 have shown changes in average crystal size due to electron beam irradiation to thin films of CAAC-IGZO, nc-IGZO, and IGZO having low crystallinity. In the thin film of IGZO having low crystallinity, crystalline IGZO with a size of approximately 1 nm was observed even before electron beam irradiation. Thus, here, it has been reported that the existence of a completely amorphous structure could not be observed in IGZO. In addition, it has been shown that the thin film of CAAC-IGZO and the thin film of nc-IGZO each have higher stability to electron beam irradiation than the thin film of IGZO having low crystallinity. Thus, the thin film of CAAC-IGZO or the thin film of nc-IGZO is preferably used for the semiconductor of the transistor.

Non-Patent Document 6 shows that a transistor using a metal oxide has an extremely low leakage current in a non-conductive state; specifically, the off-state current per micrometer of the channel width of the transistor is in the order of yA/μm ($10^{-24}$ A/μm). For example, a CPU with low power consumption utilizing a characteristic of a low leakage current of a transistor using a metal oxide is disclosed (see Non-Patent Document 7).

Furthermore, an application of a transistor using a metal oxide to a display device utilizing the characteristic of a low leakage current of the transistor has been reported (see Non-Patent Document 8). In the display device, a displayed image is changed several tens of times per second. The number of times an image is changed per second is referred to as a refresh rate. The refresh rate is also referred to as drive frequency. Such high-speed screen change that is hard for human eyes to recognize is considered as a cause of eyestrain. In view of this, it is proposed that the refresh rate of the display device is lowered to reduce the number of times of image rewriting. Moreover, driving with a lowered refresh rate can reduce the power consumption of the display device. Such a driving method is referred to as idling stop (IDS) driving.

The discovery of the CAAC structure and the nc structure has contributed to an improvement in electrical characteristics and reliability of a transistor using a metal oxide having the CAAC structure or the nc structure, a reduction in manufacturing cost, and an improvement in throughput. Furthermore, applications of the transistor to a display device and an LSI utilizing the characteristic of low leakage current of the transistor have been studied.

<Method for Manufacturing Semiconductor Device>

Next, a method for manufacturing a semiconductor device including the transistor 200 of one embodiment of the present invention, which is illustrated in FIG. 1, will be described with reference to FIG. 4 to FIG. 11. In FIG. 4 to FIG. 11, (A) in each drawing is a top view. Furthermore, (B) in each drawing is a cross-sectional view corresponding to a portion indicated by a dashed-dotted line A1-A2 in (A), and is also a cross-sectional view of the transistor 200 in the channel length direction. Moreover, (C) in each drawing is a cross-sectional view corresponding to a portion indicated by a dashed-dotted line A3-A4 in (A), and is also a cross-sectional view of the transistor 200 in the channel width direction. Note that for simplification of the drawing, some components are not illustrated in the top view of (A) of each drawing.

First, a substrate (not illustrated) is prepared, and the insulator 214 is deposited over the substrate. The insulator 214 can be deposited by a sputtering method, a CVD method, a molecular beam epitaxy (MBE) method, a pulsed laser deposition (PLD) method, an ALD method, or the like.

Note that CVD methods can be classified into a plasma enhanced CVD (PECVD) method using plasma, a thermal CVD (TCVD) method using heat, a photo CVD method using light, and the like. Moreover, the CVD methods can be classified into a metal CVD (MCVD) method and a metal organic CVD (MOCVD) method depending on a source gas to be used.

By a plasma CVD method, a high-quality film can be obtained at a relatively low temperature. Furthermore, a thermal CVD method is a deposition method that does not use plasma and thus enables less plasma damage to an object to be processed. For example, a wiring, an electrode, an element (e.g., a transistor and a capacitor), and the like included in a semiconductor device might be charged up by receiving electric charge from plasma. In that case, accumulated electric charge might break the wiring, the electrode, the element, and the like included in the semiconductor device. In contrast, such plasma damage does not occur in the case of a thermal CVD method that does not use plasma, and thus the yield of the semiconductor device can be increased. In addition, the thermal CVD method does not cause plasma damage during deposition, so that a film with few defects can be obtained.

In an ALD method, one atomic layer can be deposited at a time using self-regulating characteristics of atoms. Thus, the ALD method has advantages such as deposition of an extremely thin film, deposition on a component with a high aspect ratio, deposition of a film with a small number of defects such as pinholes, deposition with good coverage, and low-temperature deposition. Furthermore, the ALD method includes a plasma enhanced ALD (PEALD) method using plasma. The use of plasma is sometimes preferable because deposition at lower temperature is possible. Note that a precursor used in the ALD method sometimes contains impurities such as carbon. For that reason, in some cases, a film provided by the ALD method contains impurities such as carbon in a larger amount than a film provided by another deposition method. Note that impurities can be quantified by X-ray photoelectron spectroscopy (XPS).

Unlike a deposition method in which particles ejected from a target or the like are deposited, a CVD method and an ALD method are deposition methods in which a film is formed by reaction at a surface of an object. Thus, a CVD method and an ALD method are deposition methods that enable favorable step coverage almost regardless of the shape of an object. In particular, an ALD method enables excellent step coverage and excellent thickness uniformity and can be favorably used to cover a surface of an opening portion with a high aspect ratio, for example. On the other hand, an ALD method has a relatively low deposition rate, and thus is preferably used in combination with another deposition method with a high deposition rate, such as a CVD method, in some cases.

When a CVD method or an ALD method is used, the composition of a film to be formed can be controlled with the flow rate ratio of source gases. For example, by a CVD method or an ALD method, a film with a certain composition can be formed depending on the flow rate ratio of the source gases. Moreover, with a CVD method or an ALD method, by changing the flow rate ratio of the source gases while forming a film, a film whose composition is continuously changed can be formed. In the case of depositing a film while changing the flow rate ratio of source gases, as compared with the case of depositing a film with the use of a plurality of deposition chambers, time taken for the deposition can be shortened because time taken for transfer and pressure adjustment is not required. Thus, the productivity of the semiconductor device can be increased in some cases.

In this embodiment, for the insulator 214, aluminum oxide is deposited by a sputtering method. In addition, the insulator 214 may have a multilayer structure. For example, a structure may be employed in which aluminum oxide is deposited by a sputtering method and aluminum oxide is deposited over the aluminum oxide by an ALD method. Alternatively, a structure may be employed in which aluminum oxide is deposited by an ALD method and aluminum oxide is deposited over the aluminum oxide by a sputtering method.

Next, a conductive film to be the conductor 205 is deposited over the insulator 214. The conductive film to be the conductor 205 can be deposited by a sputtering method, a CVD method, an MBE method, a PLD method, an ALD method, or the like. In addition, the conductive film to be the conductor 205 can be a multilayer film. In this embodiment, tungsten is deposited for the conductive film to be the conductor 205.

Next, the conductive film to be the conductor 205 is processed by a lithography method, so that the conductor 205 is formed.

Note that in the lithography method, first, a resist is exposed to light through a mask. Next, a region exposed to light is removed or left using a developer, so that a resist mask is formed. Then, etching treatment through the resist mask is conducted, whereby a conductor, a semiconductor, an insulator, or the like can be processed into a desired shape. The resist mask is formed by, for example, exposure of the resist to light such as KrF excimer laser light, ArF excimer laser light, EUV (Extreme Ultraviolet) light, or the like. Alternatively, a liquid immersion technique may be employed in which a gap between a substrate and a projection lens is filled with liquid (e.g., water) in light exposure. Alternatively, an electron beam or an ion beam may be used instead of the light. Note that a mask is unnecessary in the case of using an electron beam or an ion beam. Note that the resist mask can be removed by dry etching treatment such as ashing, wet etching treatment, wet etching treatment after dry etching treatment, or dry etching treatment after wet etching treatment.

In addition, a hard mask formed of an insulator or a conductor may be used instead of the resist mask. In the case where a hard mask is used, a hard mask with a desired shape can be formed by forming an insulating film or a conductive film to be a hard mask material over the conductive film to be the conductor 205, forming a resist mask thereover, and then etching the hard mask material. The etching of the conductive film to be the conductor 205 may be performed after removal of the resist mask or with the resist mask remaining. In the latter case, the resist mask sometimes disappears during the etching. The hard mask may be removed by etching after the etching of the conductive film to be the conductor 205. Meanwhile, the hard mask is not necessarily removed when the hard mask material does not affect the following process or can be utilized in the following process.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency power is applied to one of the parallel plate electrodes. Alternatively, a structure may be employed in which different high-frequency powers are applied to one of the parallel plate electrodes. Alternatively, a structure may be employed in which high-frequency powers with the same frequency are applied to the parallel plate electrodes. Alternatively, a structure may be employed in which high-frequency powers with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus or the like can be used, for example.

Next, an insulating film to be the insulator 216 is deposited over the insulator 214 and the conductor 205. The insulating film is formed to be in contact with the top surface and side surface of the conductor 205. The insulating film can be deposited by a sputtering method, a CVD method, an MBE method, a PLD method, an ALD method, or the like. In this embodiment, for the insulating film to be the insulator 216, silicon oxide is deposited by a CVD method.

Here, the thickness of the insulating film to be the insulator 216 is preferably greater than or equal to the thickness of the conductor 205. For example, when the thickness of the conductor 205 is 1, the thickness of the insulating film to be the insulator 216 is greater than or equal to 1 and less than or equal to 3. In this embodiment, the thickness of the conductor 205 is 150 nm, and the thickness of the insulating film to be the insulator 216 is 350 nm.

Next, CMP (Chemical Mechanical Polishing) treatment is performed on the insulating film to be the insulator 216, so that part of the insulating film to be the insulator 216 is removed and a surface of the conductor 205 is exposed. Thus, the conductor 205 and the insulator 216 in contact with the side surface of the conductor 205, each of which has a flat top surface, can be formed (see FIG. 4). The improvement in planarity of the top surfaces of the insulator 216 and the conductor 205 results in improved crystallinity of the CAAC-OS that forms the oxide 230b and the oxide 230c.

Here, a method for forming the conductor 205 which is different from the above will be described below.

The insulator 216 is deposited over the insulator 214. The insulator 216 can be deposited by a sputtering method, a CVD method, an MBE method, a PLD method, an ALD method, or the like.

Then, an opening reaching the insulator 214 is formed in the insulator 216. Examples of the opening include a groove and a slit. A region where the opening is formed may be referred to as an opening portion. Wet etching can be used for the formation of the opening; however, dry etching is preferably used for microfabrication. As the insulator 214, it is preferable to select an insulator that functions as an etching stopper film used in forming the groove by etching the insulator 216. For example, in the case where a silicon oxide film is used as the insulator 216 in which the groove is to be formed, a silicon nitride film, an aluminum oxide film, or a hafnium oxide film is preferably used as the insulator 214.

After the formation of the opening, a conductive film to be the conductor 205 is deposited. The conductive film desirably includes a conductor that has a function of inhibiting oxygen transmission. For example, tantalum nitride, tungsten nitride, or titanium nitride can be used. Alternatively, a stacked-layer film of the above conductor and tantalum, tungsten, titanium, molybdenum, aluminum, copper, or a molybdenum-tungsten alloy can be used. The conductive film to be the conductor 205 can be deposited by a sputtering method, a CVD method, an MBE method, a PLD method, an ALD method, or the like.

In this embodiment, the conductive film to be the conductor 205 has a multilayer structure. First, tantalum nitride is deposited by a sputtering method, and titanium nitride is stacked over the tantalum nitride. Even when a metal that is likely to diffuse, such as copper, is used for an upper layer of the conductive film to be the conductor 205 described below, the use of such a metal nitride for a lower layer of the conductive film to be the conductor 205 can prevent outward diffusion of the metal from the conductor 205.

Next, a conductive film that is the upper layer of the conductive film to be the conductor 205 is deposited. The conductive film can be deposited by a plating method, a sputtering method, a CVD method, an MBE method, a PLD method, an ALD method, or the like. In this embodiment, for the conductive film that is the upper layer of the conductive film to be the conductor 205, a low-resistance conductive material such as copper is deposited.

Next, CMP treatment is performed to remove parts of the upper layer of the conductive film to be the conductor 205 and the lower layer of the conductive film to be the conductor 205, so that the insulator 216 is exposed. As a result, the conductive film to be the conductor 205 remains only in the opening portion. Thus, the conductor 205 whose top surface is flat can be formed. Note that the insulator 216 is partly removed by the CMP treatment in some cases. The above is another method of forming the conductor 205.

Next, the insulator 222 is deposited over the insulator 216 and the conductor 205. An insulator containing an oxide of one or both of aluminum and hafnium is preferably deposited as the insulator 222. Note that as the insulator containing an oxide of one or both of aluminum and hafnium, aluminum oxide, hafnium oxide, an oxide containing aluminum and hafnium (hafnium aluminate), or the like is preferably used. The insulator containing an oxide of one or both of aluminum and hafnium has a barrier property against oxygen, hydrogen, and water. When the insulator 222 has a barrier property against hydrogen and water, hydrogen and water contained in components provided around the transistor 200 are inhibited from diffusing into the transistor 200 through the insulator 222, and generation of oxygen vacancies in the oxide 230 can be inhibited.

The insulator 222 can be deposited by a sputtering method, a CVD method, an MBE method, a PLD method, an ALD method, or the like.

Next, an insulating film 224A to be the insulator 224 is deposited over the insulator 222. The insulating film 224A can be deposited by a sputtering method, a CVD method, an MBE method, a PLD method, an ALD method, or the like.

Next, heat treatment is preferably performed. The heat treatment can be performed at a temperature higher than or equal to 250° C. and lower than or equal to 650° C., preferably higher than or equal to 300° C. and lower than or equal to 500° C., further preferably higher than or equal to 320° C. and lower than or equal to 450° C. Note that the heat treatment is performed in a nitrogen gas or inert gas atmosphere, or an atmosphere containing an oxidizing gas at 10 ppm or more, 1% or more, or 10% or more. Alternatively, the heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen.

In this embodiment, heat treatment is performed at 400° C. in a nitrogen atmosphere for one hour after the deposition of the insulating film 224A. By the heat treatment, impurities such as water and hydrogen contained in the insulating film 224A can be removed, for example. The heat treatment can also be performed after the deposition of the insulator 222, for example.

Here, in order to form an excess-oxygen region in the insulating film 224A, plasma treatment with oxygen may be performed under reduced pressure. For the plasma treatment with oxygen, an apparatus including a power source for generating high-density plasma using microwaves is preferably used, for example. Alternatively, a power source for applying an RF (Radio Frequency) to a substrate side may be included. The use of high-density plasma enables high-density oxygen radicals to be produced, and RF application to the substrate side allows the oxygen radicals generated by the high-density plasma to be efficiently introduced into the insulating film 224A. Alternatively, after plasma treatment with an inert gas is performed using this apparatus, plasma treatment with oxygen may be performed to compensate for released oxygen. Note that impurities such as water and hydrogen contained in the insulating film 224A can be removed by selecting the conditions for the plasma treatment appropriately. In that case, the heat treatment does not need to be performed.

Here, aluminum oxide may be deposited over the insulating film 224A by a sputtering method, for example, and then CMP treatment may be performed until the insulating film 224A is exposed. The CMP treatment can planarize and smooth the surface of the insulating film 224A. When the CMP treatment is performed on the aluminum oxide placed over the insulating film 224A, it is easy to detect the endpoint of the CMP treatment. Part of the insulating film 224A may be polished by the CMP treatment so that the thickness of the insulating film 224A may be reduced; the thickness of the insulating film 224A is adjusted at the time of the deposition. Planarizing and smoothing the surface of the insulating film 224A can sometimes prevent a decrease in the coverage with an oxide deposited later and a decrease in the yield of the semiconductor device. The deposition of aluminum oxide over the insulating film 224A by a sputtering method is preferred because oxygen can be added to the insulating film 224A.

Figure 4A:
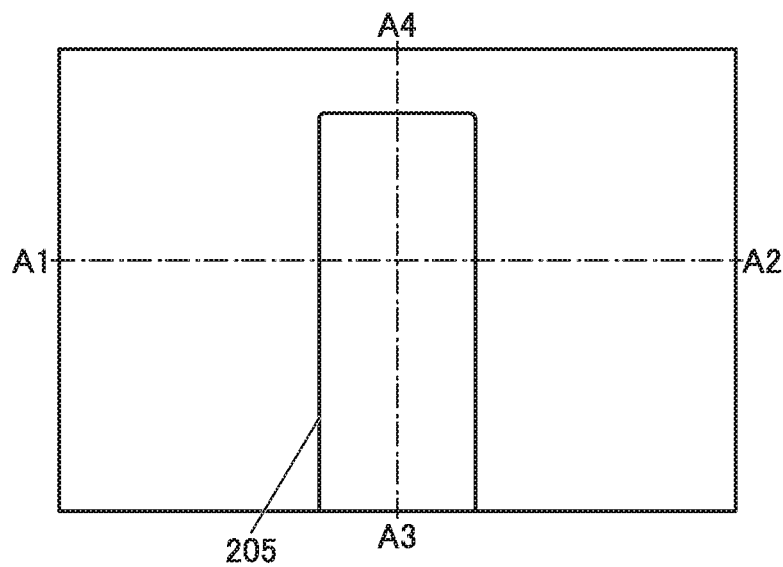
FIGS. 4A-4C A top view and cross-sectional views illustrating a method for manufacturing a semiconductor device according to one embodiment of the present invention.
Figure 4C:
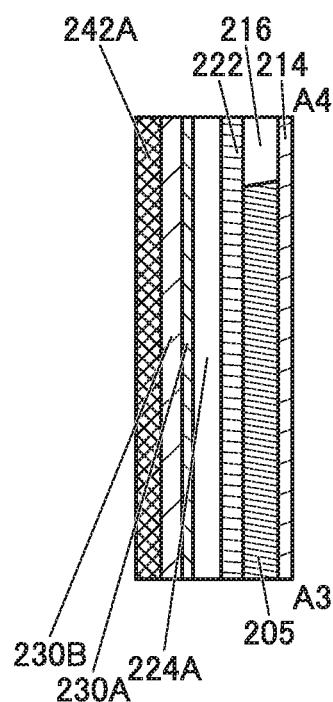
Figure 4B:
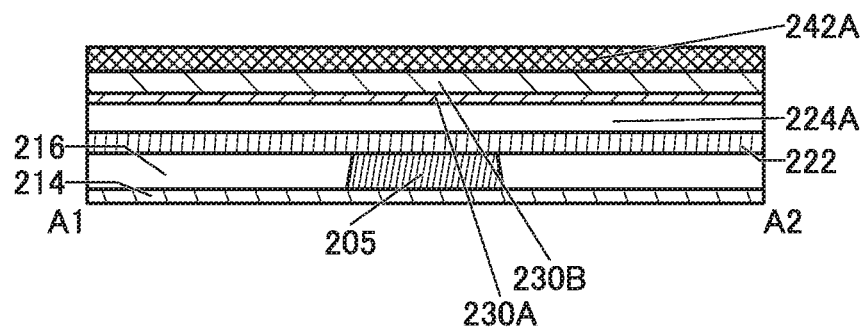

Next, an oxide film 230A to be the oxide 230a and an oxide film 230B to be the oxide 230b are deposited in this order over the insulating film 224A (see FIG. 4). Note that the oxide films are preferably deposited successively without being exposed to an atmospheric environment. By the deposition without exposure to the air, impurities or moisture from the atmospheric environment can be prevented from being attached onto the oxide film 230A and the oxide film 230B, so that the vicinity of the interface between the oxide film 230A and the oxide film 230B can be kept clean.

The oxide film 230A and the oxide film 230B can be deposited by a sputtering method, a CVD method, an MBE method, a PLD method, an ALD method, or the like.

In the case where the oxide film 230A and the oxide film 230B are deposited by a sputtering method, for example, oxygen or a mixed gas of oxygen and a rare gas is used as a sputtering gas. Increasing the proportion of oxygen contained in the sputtering gas can increase the amount of excess oxygen in the deposited oxide films. In the case where the oxide films are deposited by a sputtering method, the above In-M-Zn oxide target and the like can be used. Furthermore, a direct current (DC) power source or an alternating current (AC) power source such as a radio frequency (RF) power source is connected to a target, and required power can be applied depending on the electric conductivity of the target.

In particular, at the time of depositing the oxide film 230A, part of oxygen contained in the sputtering gas is supplied to the insulating film 224A in some cases. Therefore, the proportion of oxygen contained in the sputtering gas for the oxide film 230A is higher than or equal to 70%, preferably higher than or equal to 80%, further preferably 100%.

In the case where the oxide film 230B is formed by a sputtering method, when the proportion of oxygen contained in the sputtering gas is higher than or equal to 1% and lower than or equal to 30%, preferably higher than or equal to 5% and lower than or equal to 20% during the deposition, an oxygen-deficient oxide semiconductor is formed. In a transistor in which an oxygen-deficient oxide semiconductor is used for its channel formation region, comparatively high field-effect mobility can be obtained. Furthermore, when the deposition is performed while the substrate is heated, the crystallinity of the oxide film can be improved. Note that one embodiment of the present invention is not limited thereto. In the case where the oxide film to be the oxide 230b is formed by a sputtering method and the proportion of oxygen contained in the sputtering gas for deposition is higher than 30% and lower than or equal to 100%, preferably higher than or equal to 70% and lower than or equal to 100%, an oxygen-excess oxide semiconductor is formed. In a transistor using an oxygen-excess oxide semiconductor for its channel formation region, relatively high reliability can be obtained.

In this embodiment, the oxide film 230A is deposited by a sputtering method using an In—Ga—Zn oxide target with In:Ga:Zn=1:1:0.5 [atomic ratio] (2:2:1 [atomic ratio]) or In:Ga:Zn=1:3:4 [atomic ratio]. In addition, the oxide film 230B is deposited by a sputtering method using an In—Ga—Zn oxide target with In:Ga:Zn=4:2:4.1 [atomic ratio]. Note that each of the oxide films is formed to have characteristics required for the oxide 230 by selecting the deposition condition and the atomic ratio as appropriate.

Here, the insulator 222, the insulating film 224A, the oxide film 230A, and the oxide film 230B are preferably deposited without being exposed to the air. For example, a multi-chamber deposition apparatus can be used.

Next, heat treatment may be performed. For the heat treatment, the conditions for the above heat treatment can be used. Through the heat treatment, impurities such as water and hydrogen in the oxide film 230A and the oxide film 230B can be removed, for example. In this embodiment, treatment is performed at 400° C. in a nitrogen atmosphere for one hour, and treatment is successively performed at 400° C. in an oxygen atmosphere for one hour.

Next, a conductive film 242A is deposited over the oxide film 230B. The conductive film 242A can be deposited by a sputtering method, a CVD method, an MBE method, a PLD method, an ALD method, or the like (see FIG. 4).

Figure 5A:
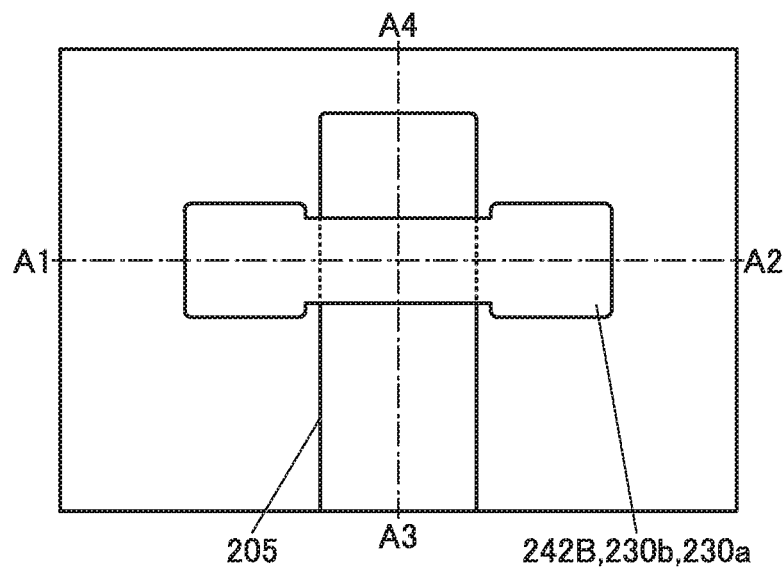
FIGS. 5A-5C A top view and cross-sectional views illustrating a method for manufacturing a semiconductor device according to one embodiment of the present invention.
Figure 5C:
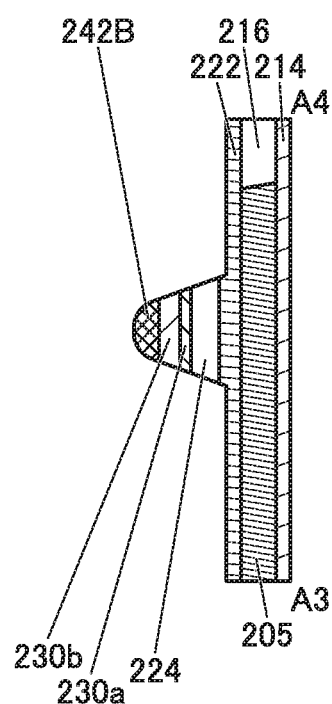
Figure 5B:
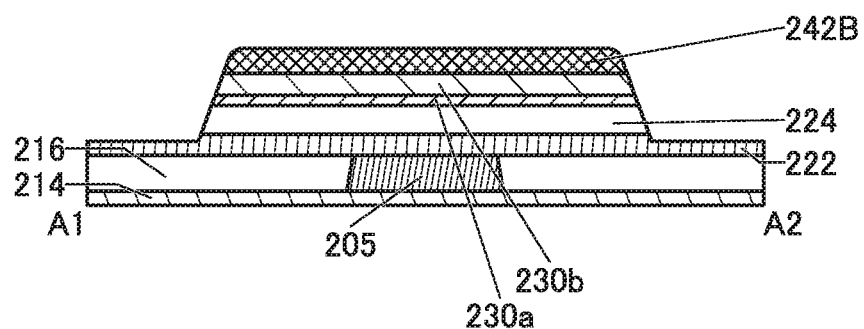

Next, the insulating film 224A, the oxide film 230A, the oxide film 230B, and the conductive film 242A are processed into island shapes to form the insulator 224, the oxide 230a, the oxide 230b, and a conductor layer 242B (see FIG. 5).

Here, the insulator 224, the oxide 230a, the oxide 230b, and the conductor layer 242B are formed to at least partly overlap with the conductor 205. It is preferable that side surfaces of the insulator 224, the oxide 230a, the oxide 230b, and the conductor layer 242B be substantially perpendicular to a top surface of the insulator 222. When the side surfaces of the insulator 224, the oxide 230a, the oxide 230b, and the conductor layer 242B are substantially perpendicular to the top surface of the insulator 222, a plurality of transistors 200 can be provided in a smaller area and at a higher density. Alternatively, a structure may be employed in which an angle formed by the side surfaces of the insulator 224, the oxide 230a, the oxide 230b, and the conductor layer 242B and the top surface of the insulator 222 is a small angle. In that case, the angle formed by the side surfaces of the insulator 224, the oxide 230a, the oxide 230b, and the conductor layer 242B and the top surface of the insulator 222 is preferably greater than or equal to 60° and less than 70°. With such a shape, coverage with the insulator 254 and the like can be improved in a later step, so that defects such as voids can be reduced.

There is a curved surface between the side surface of the conductor layer 242B and the top surface of the conductor layer 242B. That is, an end portion of the side surface and an end portion of the top surface are preferably curved (such a shape is hereinafter also referred to as a rounded shape). The radius of curvature of the curved surface at the end portion of the conductor layer 242B is greater than or equal to 3 nm and less than or equal to 10 nm, preferably greater than or equal to 5 nm and less than or equal to 6 nm, for example. When the end portions are not angular, coverage with films in later deposition steps is improved.

Note that the insulating film 224A, the oxide film 230A, the oxide film 230B, and the conductive film 242A can be processed by a lithography method. A dry etching method or a wet etching method can be used for the processing. Processing by a dry etching method is suitable for microfabrication. The insulating film 224A, the oxide film 230A, the oxide film 230B, and the conductive film 242A may be processed under different conditions.

Figure 6A:
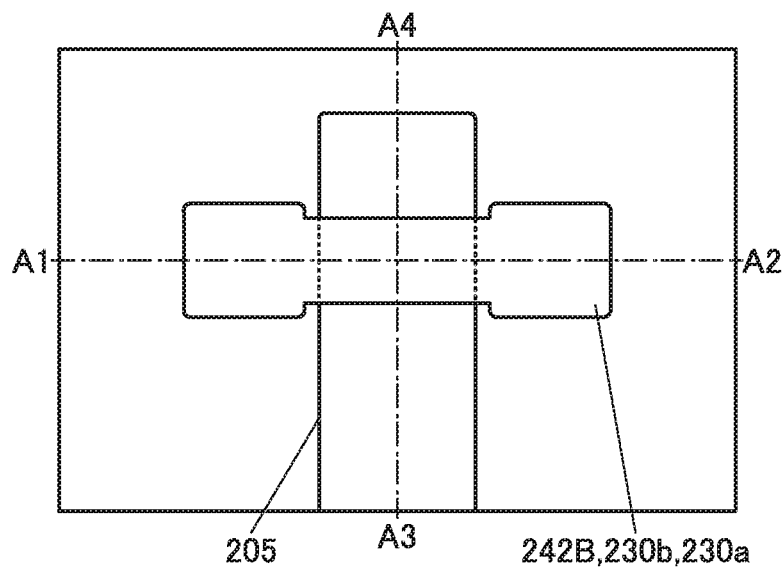
FIGS. 6A-6C A top view and cross-sectional views illustrating a method for manufacturing a semiconductor device according to one embodiment of the present invention.
Figure 6C:
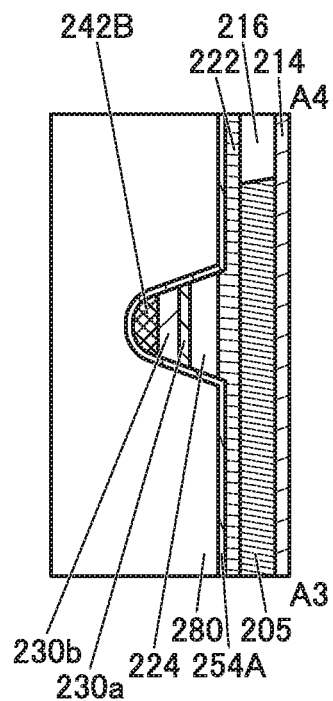
Figure 6B:
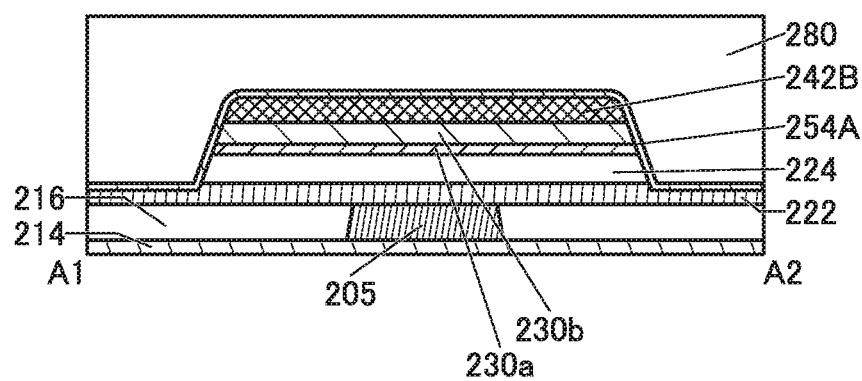
Figure 7A:
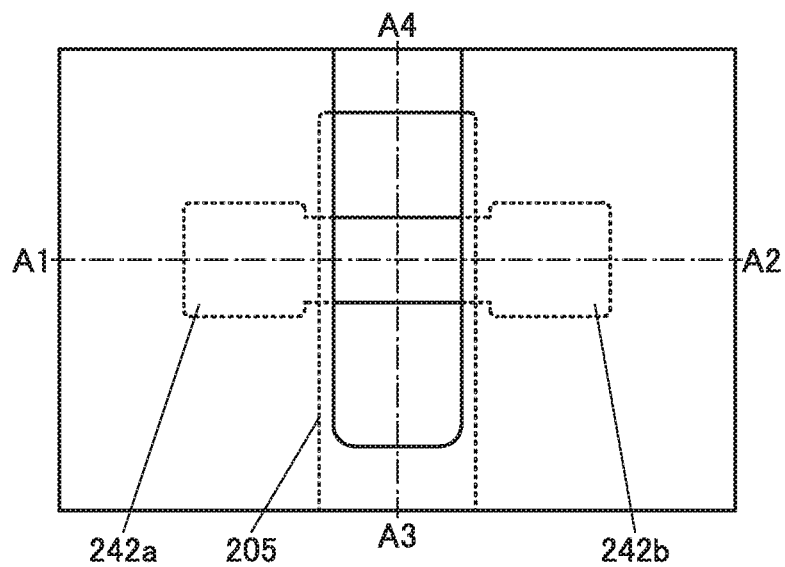
Figure 7C:
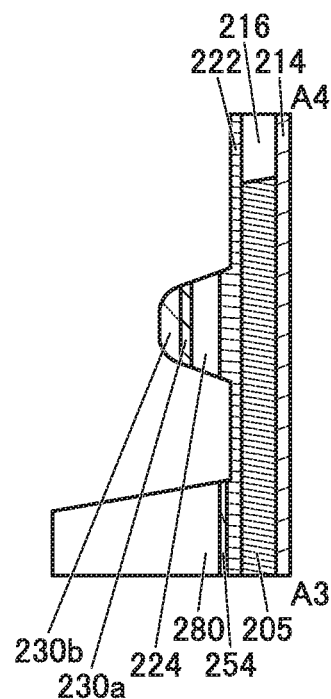
Figure 7B:
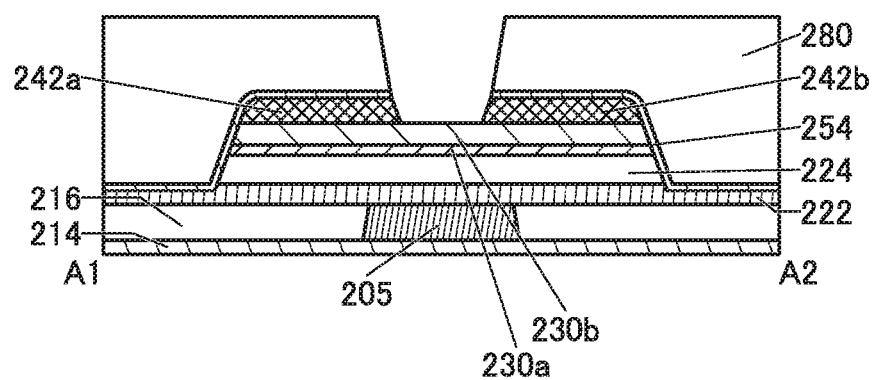
Figure 8A:
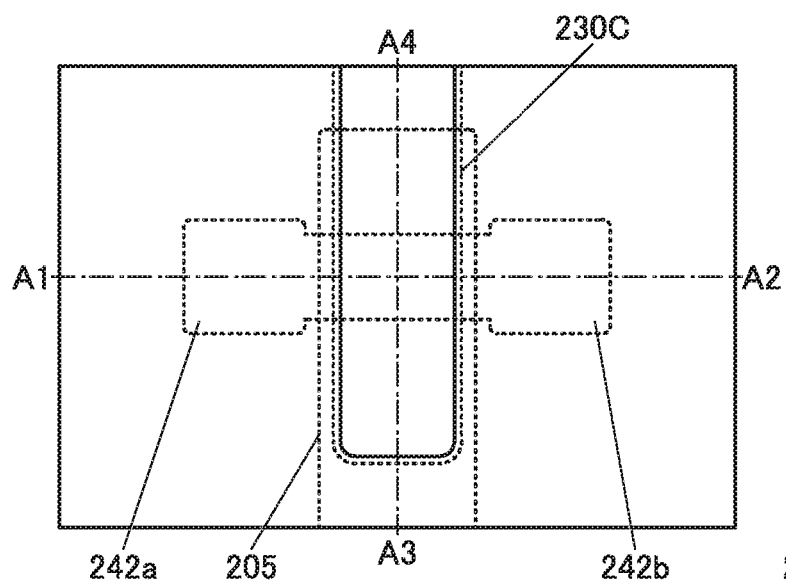
FIGS. 8A-8C A top view and cross-sectional views illustrating a method for manufacturing a semiconductor device according to one embodiment of the present invention.
Figure 8C:
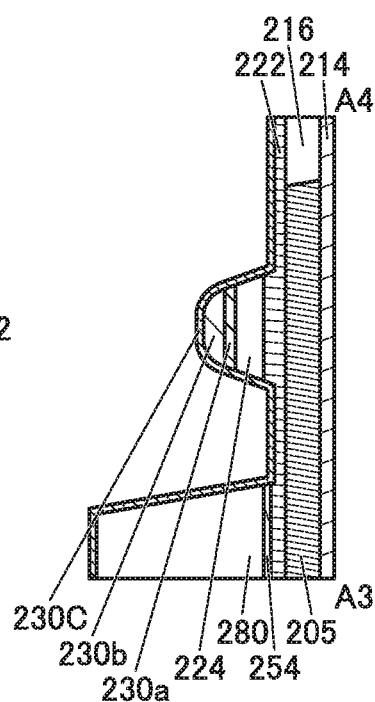
Figure 8B:
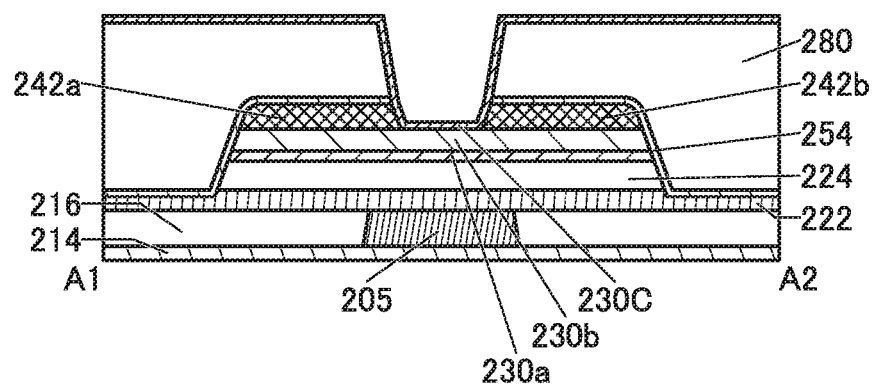
Figure 9A:
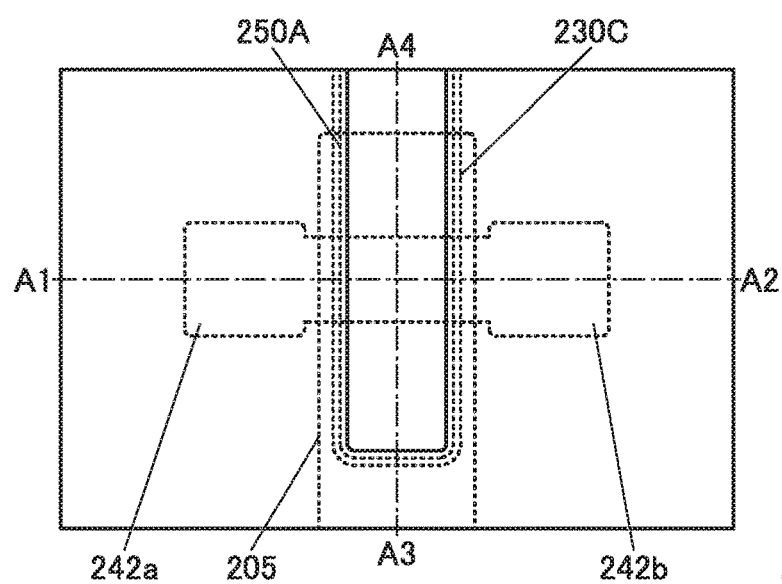
FIGS. 9A-9C A top view and cross-sectional views illustrating a method for manufacturing a semiconductor device according to one embodiment of the present invention.
Figure 9C:
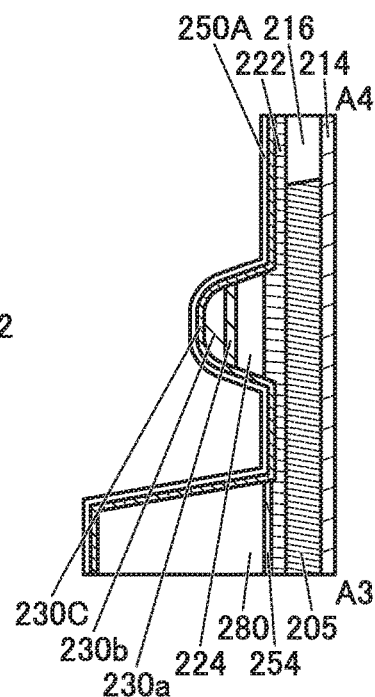
Figure 9B:
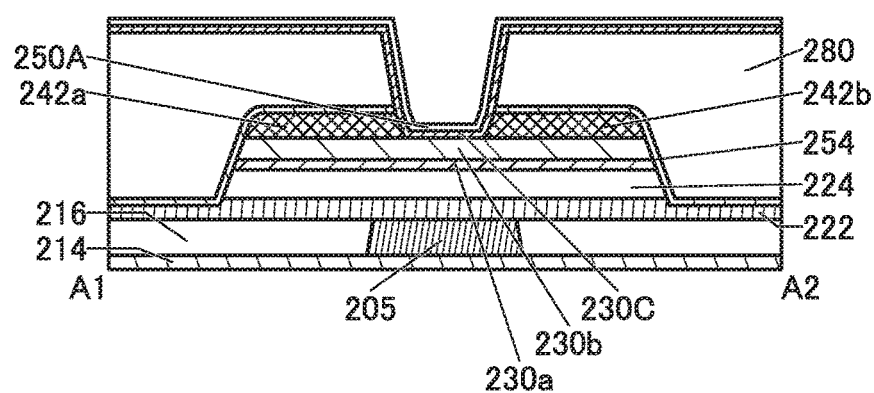
Figure 10A:
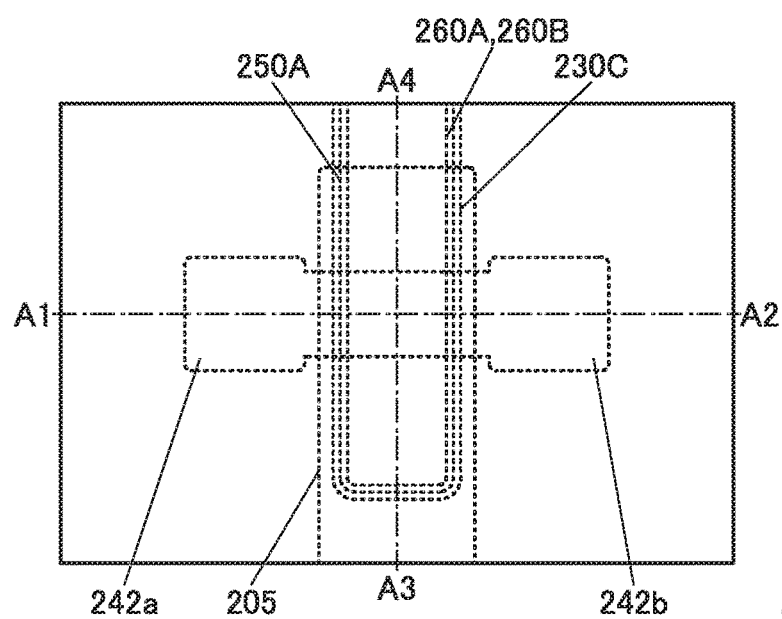
FIGS. 10A-10C A top view and cross-sectional views illustrating a method for manufacturing a semiconductor device according to one embodiment of the present invention.
Figure 10C:
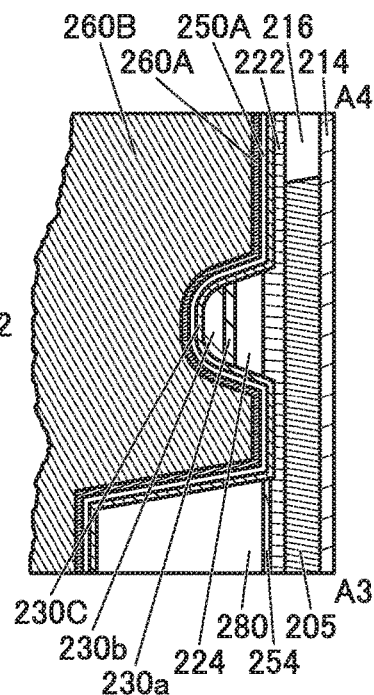
Figure 10B:
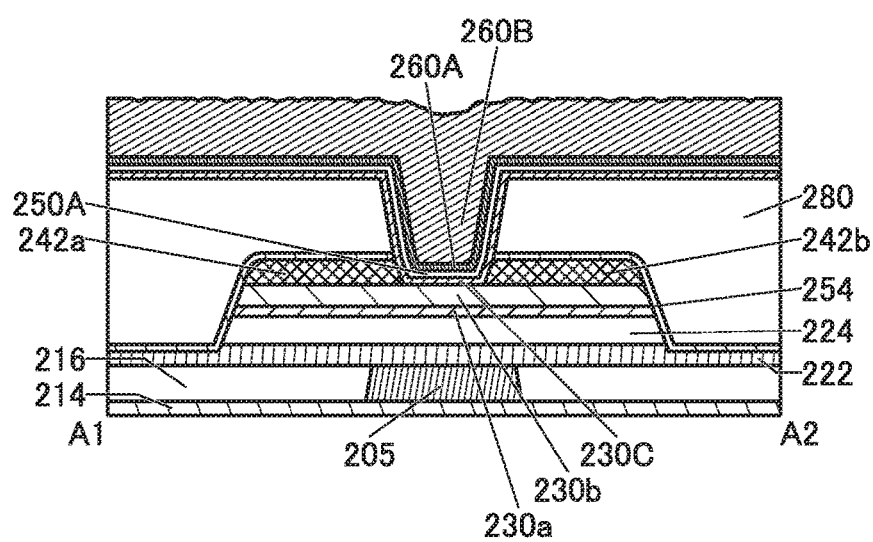

Next, an insulating film 254A is deposited over the insulator 222, the insulator 224, the oxide 230a, the oxide 230b, and the conductor layer 242B (see FIG. 6).

As the insulating film 254A, an insulating film having a function of inhibiting transmission of oxygen is preferably used. For example, an aluminum oxide film is preferably deposited by a sputtering method. When an aluminum oxide film is deposited by a sputtering method using a gas containing oxygen, oxygen can be injected into the insulator 224. That is, the insulator 224 can contain excess oxygen.

Next, an insulating film to be the insulator 280 is deposited over the insulating film 254A. The insulating film to be the insulator 280 can be deposited by a sputtering method, a CVD method, an MBE method, a PLD method, an ALD method, or the like. Next, the insulating film to be the insulator 280 is subjected to CMP treatment, so that the insulator 280 having a flat top surface is formed (see FIG. 6).

Then, part of the insulator 280, part of the insulating film 254A, and part of the conductor layer 242B are processed to form an opening reaching the oxide 230b. The opening is preferably formed to overlap with the conductor 205. The conductor 242a, the conductor 242b, and the insulator 254 are formed by the opening (see FIG. 7).

Part of the insulator 280, part of the insulating film 254A, and part of the conductor layer 242B may be processed under different conditions. For example, part of the insulator 280 may be processed by a dry etching method, part of the insulating film 254A may be processed by a wet etching method, and part of the conductor layer 242B may be processed by a dry etching method.

In some cases, the treatment such as the dry etching performed thus far causes impurities due to an etching gas or the like to be attached or diffused to the surface or the inside of the oxide 230a, the oxide 230b, and the like. Examples of the impurities include fluorine and chlorine.

In order to remove the impurities and the like, cleaning is performed. Examples of the cleaning method include wet cleaning using a cleaning solution and the like, plasma treatment using plasma, and cleaning by heat treatment, and any of these cleanings may be performed in appropriate combination.

The wet cleaning may be performed using an aqueous solution in which oxalic acid, phosphoric acid, hydrofluoric acid, or the like is diluted with carbonated water or pure water. Alternatively, ultrasonic cleaning using pure water or carbonated water may be performed.

Next, heat treatment may be performed. Heat treatment may be performed under reduced pressure, and an oxide film 230C may be successively deposited without exposure to the air. The treatment can remove moisture and hydrogen adsorbed onto the surface of the oxide 230b and the like, and further can reduce the moisture concentration and the hydrogen concentration of the oxide 230a and the oxide 230b. The heat treatment is preferably performed at a temperature higher than or equal to 100° C. and lower than or equal to 400° C. In this embodiment, the heat treatment is performed at 200° C. (see FIG. 8).

The oxide film 230C can be deposited by a sputtering method, a CVD method, an MBE method, a PLD method, an ALD method, or the like. An oxide film to be the oxide film 230C is deposited by a method similar to that for the oxide film to be the oxide film 230A or the oxide film 230B in accordance with characteristics required for the oxide film 230C. In this embodiment, the oxide film 230C is deposited by a sputtering method using an In—Ga—Zn oxide target with In:Ga:Zn=1:3:4 [atomic ratio] or In:Ga:Zn=4:2:4.1 [atomic ratio].

In particular, in the deposition of the oxide film 230C, part of oxygen contained in the sputtering gas is sometimes supplied to the oxide 230a and the oxide 230b. Therefore, the proportion of oxygen contained in the sputtering gas for the oxide film 230C is higher than or equal to 70%, preferably higher than or equal to 80%, further preferably 100%.

Next, heat treatment may be performed. Heat treatment may be performed under reduced pressure, and an insulating film 250A may be successively deposited without exposure to the air. The treatment can remove moisture and hydrogen adsorbed onto the surface of the oxide film 230C and the like, and further can reduce the moisture concentration and the hydrogen concentration of the oxide 230a, the oxide 230b, and the oxide film 230C. The heat treatment is preferably performed at a temperature higher than or equal to 100° C. and lower than or equal to 400° C. (see FIG. 9).

The insulating film 250A can be deposited by a sputtering method, a CVD method, an MBE method, a PLD method, an ALD method, or the like. For the insulating film 250A, silicon oxynitride is preferably deposited by a CVD method. Note that the deposition temperature at the time of depositing the insulating film 250A is preferably higher than or equal to 350° C. and lower than 450° C., particularly preferably approximately 400° C. When the insulating film 250A is deposited at 400° C., an insulating film having few impurities can be deposited.

Next, a conductive film 260A and a conductive film 260B are deposited. The conductive film 260A and the conductive film 260B can be deposited by a sputtering method, a CVD method, an MBE method, a PLD method, an ALD method, or the like. A CVD method is preferably used, for example. In this embodiment, the conductive film 260A is deposited by an ALD method, and the conductive film 260B is deposited by a CVD method (see FIG. 10).

Figure 11A:
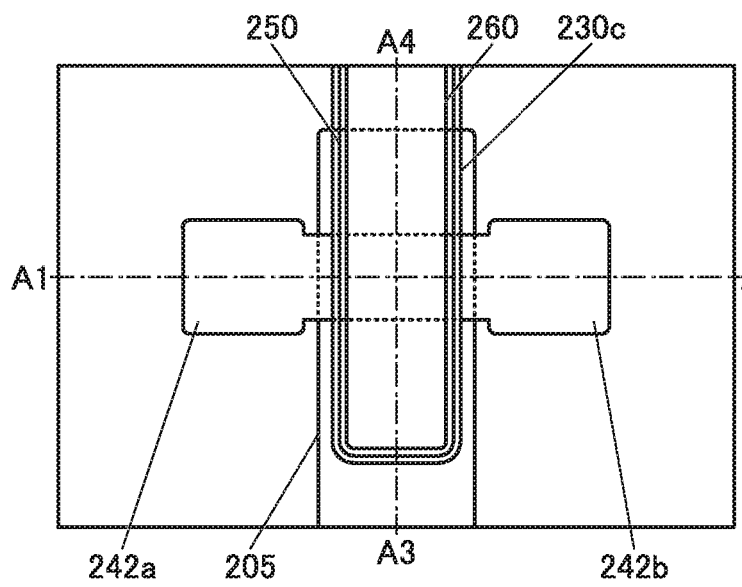
FIGS. 11A-11C A top view and cross-sectional views illustrating a method for manufacturing a semiconductor device according to one embodiment of the present invention.
Figure 11C:
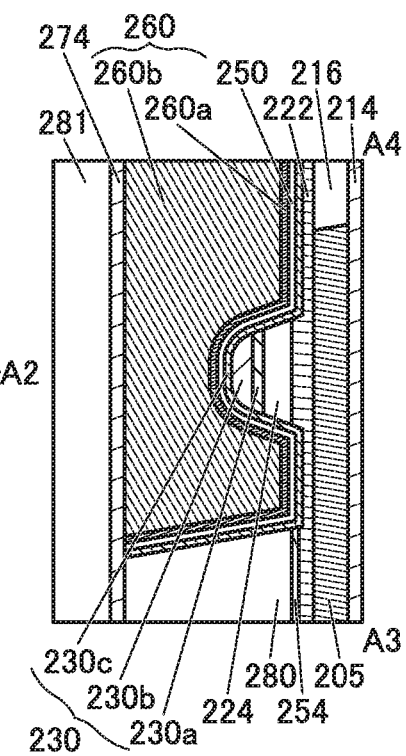
Figure 11B:
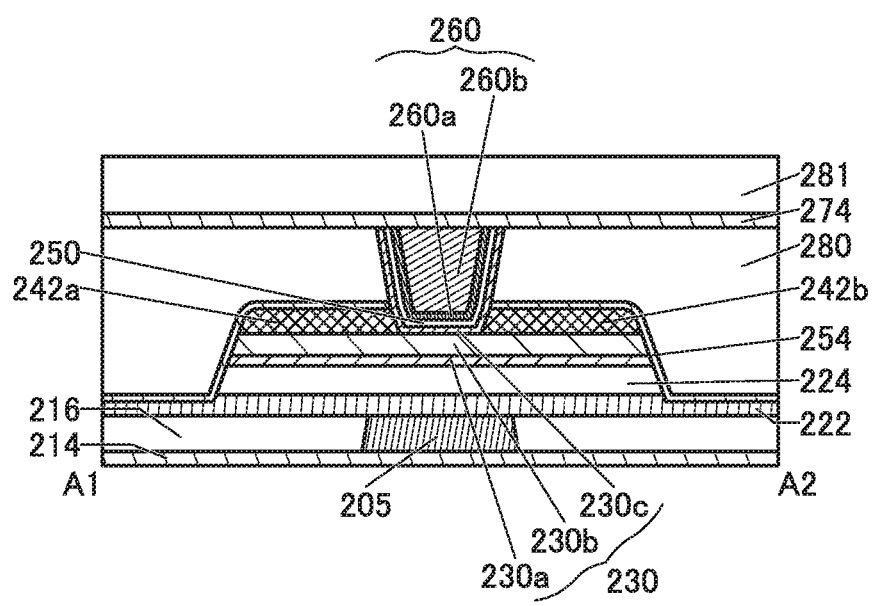

Then, the oxide film 230C, the insulating film 250A, the conductive film 260A, and the conductive film 260B are polished by CMP treatment until the insulator 280 is exposed, whereby the oxide 230c, the insulator 250, and the conductor 260 (the conductor 260a and the conductor 260b) are formed (see FIG. 11). Accordingly, the oxide 230c is positioned to cover the inner wall (the side wall and bottom surface) of the opening that reaches the oxide 230b. The insulator 250 is positioned to cover the inner wall of the opening with the oxide 230c therebetween. The conductor 260 is positioned to fill the opening with the oxide 230c and the insulator 250 therebetween.

Next, heat treatment may be performed. In this embodiment, the treatment is performed at 400° C. in a nitrogen atmosphere for one hour. The heat treatment can reduce the moisture concentration and the hydrogen concentration in the insulator 250 and the insulator 280.

Next, the insulator 274 may be formed over the oxide 230c, the insulator 250, the conductor 260, and the insulator 280. The insulator 274 can be deposited by a sputtering method, a CVD method, an MBE method, a PLD method, an ALD method, or the like. An aluminum oxide film is preferably deposited as the insulator 274 by a sputtering method, for example. When an aluminum oxide film is deposited by a sputtering method, diffusion of hydrogen contained in the insulator 281 into the oxide 230 can be inhibited in some cases. Forming the insulator 274 to be in contact with the conductor 260 is preferable, in which case oxidation of the conductor 260 can be inhibited. Moreover, the formation of the insulator 274 enables oxygen to be supplied to the insulator 280. Oxygen supplied to the insulator 280 is sometimes supplied to the region 234 included in the oxide 230b through the oxide 230c. Furthermore, when oxygen is supplied to the insulator 280, oxygen that is contained in the insulator 280 before the formation of the insulator 274 may be supplied to the region 234 included in the oxide 230b through the oxide 230c.

Next, heat treatment may be performed. For the heat treatment, the conditions for the above heat treatment can be used. The heat treatment can reduce the moisture concentration and hydrogen concentration in the insulator 280. Moreover, oxygen contained in the insulator 274 can be injected into the insulator 280.

Note that as a method for forming the insulator 274 over the insulator 280, the following may be performed: first, an insulating film made of the same material as the insulator 274 is formed by the same formation method as that for the insulator 274; next, heat treatment is performed using the above heat treatment conditions; then, the insulating film is removed by CMP treatment; next, the insulator 274 is formed; and then, heat treatment is performed using the above heat treatment conditions. By this method, a larger number of excess-oxygen regions can be formed in the insulator 280. Note that in the step of removing the insulating film, part of the insulator 280, part of the conductor 260, part of the insulator 250, and part of the oxide 230c are removed in some cases.

An insulator may be provided between the insulator 280 and the insulator 274. As the insulator, silicon oxide deposited by a sputtering method can be used, for example. Providing the insulator can form an excess-oxygen region in the insulator 280.

Next, an insulating film to be the insulator 281 may be deposited over the insulator 274. The insulating film to be the insulator 281 can be deposited by a sputtering method, a CVD method, an MBE method, a PLD method, an ALD method, or the like (see FIG. 11).

Then, openings that reach the conductor 242*a* and the conductor 242*b* are formed in the insulator 254, the insulator 280, the insulator 274, and the insulator 281. The openings are formed by a lithography method.

Next, an insulating film to be the insulator 241 is deposited and the insulating film is subjected to anisotropic etching, so that the insulator 241 is formed. The insulating film can be deposited by a sputtering method, a CVD method, an MBE method, a PLD method, an ALD method, or the like. As the insulating film, an insulating film having a function of inhibiting transmission of oxygen is preferably used. For example, an aluminum oxide film is preferably deposited by an ALD method. Alternatively, a silicon nitride film may be formed by an ALD method or a CVD method. In the case where a silicon nitride film is formed by an ALD method, a precursor containing silicon and halogen or precursors of aminosilanes can be used. As the precursor containing silicon and halogen, $SiCl_4$, $SiH_2Cl_2$, $Si_2Cl_6$, $Si_3Cl_8$, or the like can be used. As the precursors of aminosilanes, monovalent, divalent, or trivalent aminosilanes can be used. Moreover, as a nitriding gas, ammonia or hydrazine can be used. For the anisotropic etching, a dry etching method or the like may be employed, for example. When the side wall portions of the openings have such a structure, transmission of oxygen from the outside can be inhibited and oxidation of the conductor 240*a* and the conductor 240*b* to be formed next can be prevented. Furthermore, impurities such as water and hydrogen can be prevented from diffusing from the conductor 240*a* and the conductor 240*b* to the outside.

Next, a conductive film to be the conductor 240*a* and the conductor 240*b* is deposited. The conductive film desirably has a stacked-layer structure that includes a conductor having a function of inhibiting diffusion of impurities such as water and hydrogen. For example, a stack of tantalum nitride, titanium nitride, or the like and tungsten, molybdenum, copper, or the like can be employed. The conductive film can be formed by a sputtering method, a CVD method, an MBE method, a PLD method, an ALD method, or the like.

Next, part of the conductive film is removed by CMP treatment, so that the insulator 281 is exposed. As a result, the conductive film remains only in the openings, so that the conductor 240*a* and the conductor 240*b* having flat top surfaces can be formed (see FIG. 1). Note that the insulator 281 is partly removed by the CMP treatment in some cases.

Through the above process, the semiconductor device including the transistor 200 illustrated in FIG. 1 can be manufactured. As illustrated in FIG. 4 to FIG. 11, with the use of the method of manufacturing the semiconductor device described in this embodiment, the transistor 200 can be fabricated.

With one embodiment of the present invention, a semiconductor device with a high on-state current can be provided. With one embodiment of the present invention, a semiconductor device having high frequency characteristics can be provided. With one embodiment of the present invention, a highly reliable semiconductor device can be provided. With one embodiment of the present invention, a semiconductor device that can be scaled down or highly integrated can be provided. With one embodiment of the present invention, a semiconductor device having favorable electrical characteristics can be provided. With one embodiment of the present invention, a semiconductor device with a low off-state current can be provided. With one embodiment of the present invention, a semiconductor device with reduced power consumption can be provided. With one embodiment of the present invention, a semiconductor device with high productivity can be provided.

<Structure Example 2 of Semiconductor Device>

FIG. 12 shows a top view and cross-sectional views of a transistor 200A of one embodiment of the present invention and the periphery of the transistor 200A. The transistor 200A is a variation example of the transistor 200.

Figure 12A:
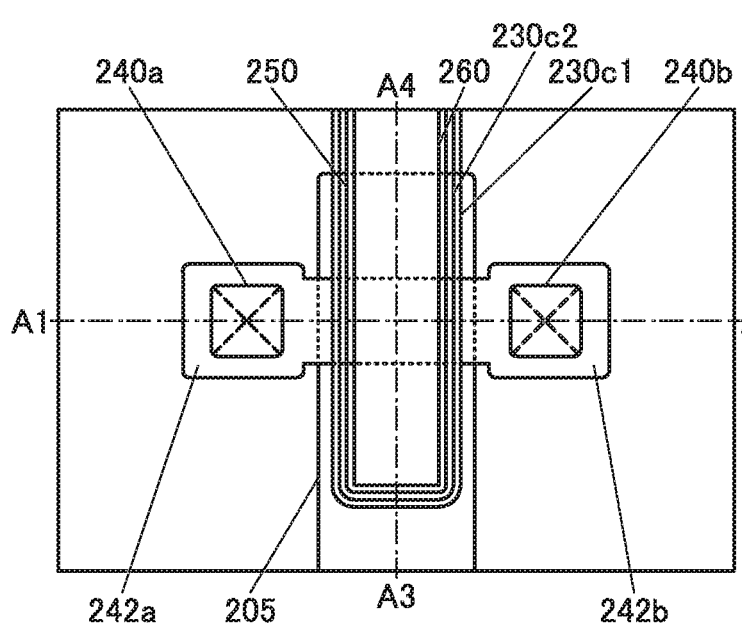
FIGS. 12A-12C A top view and cross-sectional views of a semiconductor device according to one embodiment of the present invention.
Figure 12C:
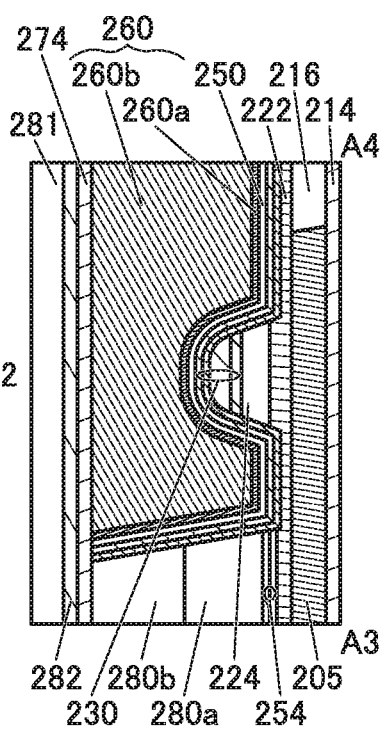
Figure 12B:
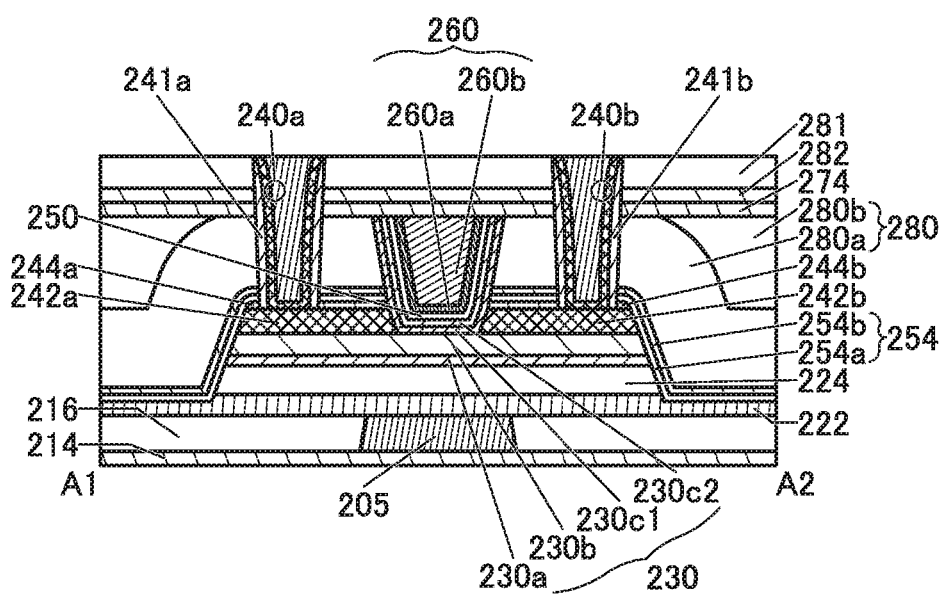

FIG. 12(A) is a top view of a semiconductor device including the transistor 200A. FIG. 12(B) and FIG. 12(C) are cross-sectional views of the semiconductor device. Here, FIG. 12(B) is a cross-sectional view of a portion indicated by a dashed-dotted line A1-A2 in FIG. 12(A), and is also a cross-sectional view in the channel length direction of the transistor 200A. FIG. 12(C) is a cross-sectional view of a portion indicated by a dashed-dotted line A3-A4 in FIG. 12(A), and is also a cross-sectional view in the channel width direction of the transistor 200A. Note that for clarification of the drawing, some components are not illustrated in the top view of FIG. 12(A).

Note that in the semiconductor device illustrated in FIG. 12, components having the same functions as the components configuring the semiconductor device described in <Structure example 1 of semiconductor device> are denoted by the same reference numerals.

The structure of the semiconductor device will be described below with reference to FIG. 12. Note that the materials described in detail in <Structure example 1 of semiconductor device> can be used as constituent materials of the semiconductor devices in this section.

[Transistor 200A]

As illustrated in FIG. 12, the transistor 200A includes the insulator 216 positioned over a substrate (not illustrated); the conductor 205 positioned to be embedded in the insulator 216; the insulator 222 positioned over the insulator 216 and the conductor 205; the insulator 224 positioned over the insulator 222; the oxide 230 (the oxide 230*a*, the oxide 230*b*, the oxide 230*c*1, and the oxide 230*c*2) positioned over the insulator 224; the insulator 250 positioned over the oxide 230; the conductor 260 (the conductor 260*a* and the conductor 260*b*) positioned over the insulator 250; the conductor 242*a* and the conductor 242*b* in contact with part of the top surface of the oxide 230*b*; a barrier film 244*a* positioned over the conductor 242*a*; a barrier film 244*b* positioned over the conductor 242*b*; and the insulator 254 (an insulator 254*a* and an insulator 254*b*) positioned in contact with part of the top surface of the insulator 222, the side surface of the insulator 224, the side surface of the oxide 230*a*, the side surface of the oxide 230*b*, the side surface of the conductor 242*a*, a top surface of the barrier film 244*a*, the side surface of the conductor 242*b*, and a top surface of the barrier film 244*b*.

The transistor 200A differs from the transistor 200 in that the insulator 254 has a structure in which two layers of the insulator 254*a* and the insulator 254*b* are stacked, that the oxide 230*c* has a structure in which two layers of the oxide 230*c*1 and the oxide 230*c*2 are stacked, and that the barrier film 244*a* and the barrier film 244*b* are included. The differences from the transistor 200 will be described below.

As illustrated in FIG. 12, the insulator 254 includes the insulator 254*a* and the insulator 254*b* positioned over the insulator 254*a*. For example, the insulator 254*a* preferably functions as a barrier film that inhibits diffusion of impurities such as water and hydrogen into the transistor 200A from the insulator 280 side. For example, the insulator 254*b* preferably inhibits diffusion of oxygen in the oxide 230 to the insulator 280 side. The structure in which such two layers are stacked can prevent entry of hydrogen into the channel formation region of the oxide 230. Furthermore, release of oxygen from the channel formation region of the oxide 230 can be prevented. Specifically, silicon nitride deposited by a sputtering method is used as the insulator 254a, and aluminum oxide deposited by an ALD method is used as the insulator 254b.

As another example, it is preferred that an insulating material including an excess-oxygen region or an insulating material in which an excess-oxygen region is likely to be formed be used for the insulator 254a, and an insulating material that is likely to form an excess-oxygen region in the film on which the material is formed be used for the insulator 254b. Specifically, silicon oxide deposited by a sputtering method is used as the insulator 254a, and aluminum oxide deposited by a sputtering method is used as the insulator 254b. The structure in which such two layers are stacked can efficiently supply excess oxygen contained in the insulator 254a to the oxide 230.

Note that in the case where the insulator 254a contains excess oxygen, it is preferred that the barrier film 244a be provided in contact with the top surface of the conductor 242a and the barrier film 244b be provided in contact with the top surface of the conductor 242b. The barrier film 244a and the barrier film 244b have a function of inhibiting transmission of oxygen and impurities such as water and hydrogen. Accordingly, excess oxygen in the oxide 230c and the insulator 250 can be prevented from diffusing into the conductor 242a and the conductor 242b. That is, surrounding excess oxygen can be prevented from being used for oxidation of the conductor 242a and the conductor 242b. Furthermore, an increase in electric resistance of the conductor 242a and the conductor 242b due to oxidation of the conductor 242a and the conductor 242b can be prevented. Note that the electric resistance of the conductors can be measured by a two-terminal method or the like.

For the barrier film 244a and the barrier film 244b, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride is used, for example.

For the barrier film 244a and the barrier film 244b, a conductive material through which impurities are less likely to pass may be used. When a conductive material is used for the barrier film 244a and the barrier film 244b, it is preferable to use a conductive material from which oxygen is less likely to be released or a conductive material on which oxygen is less likely to be absorbed. Note that a structure may be employed in which the barrier film 244a and the barrier film 244b are not provided.

Note that the insulator 254 is not limited to having the structure in which the insulator 254a and the insulator 254b are stacked, and may be a single layer or have a structure in which three layers of the insulator 254a, the insulator 254b, and an insulator 254c are stacked. In the case of employing the structure in which the three layers are stacked, it is preferred, for example, that an insulating material having a function of inhibiting diffusion of oxygen and impurities such as water and hydrogen be used for the insulator 254a, an insulating material including an excess-oxygen region be used for the insulator 254b, and an insulating material having a function of inhibiting diffusion of oxygen be used for the insulator 254c. The structure in which such three layers are stacked can inhibit diffusion of excess oxygen contained in the insulator 254b to the outside of the insulator 254a and the insulator 254c. Thus, excess oxygen contained in the insulator 254b can be efficiently supplied to the oxide 230.

When the insulator 254 has a structure in which two or more layers are stacked, a combination and the stacking order of insulating materials used for the insulator 254 are designed as appropriate for required transistor characteristics.

As illustrated in FIG. 12, the oxide 230c includes the oxide 230c1 and the oxide 230c2 positioned over the oxide 230c1. The oxide 230c1 preferably contains at least one of the metal elements contained in the metal oxide used as the oxide 230b, and further preferably contains all of these metal elements. Accordingly, the density of defect states at the interface between the oxide 230b and the oxide 230c1 can be decreased. The oxide 230c2 is preferably a metal oxide that inhibits diffusion or transmission of oxygen, compared to the oxide 230c1. Providing the oxide 230c2 between the insulator 250 and the oxide 230c1 can inhibit diffusion of oxygen contained in the insulator 280 into the insulator 250. Therefore, the oxygen is more likely to be supplied to the oxide 230 through the oxide 230c1.

It is preferable that the oxide 230c1 and the oxide 230c2 have crystallinity, and it is more preferable that the crystallinity of the oxide 230c2 be higher than that of the oxide 230c1. In particular, a CAAC-OS is preferably used as the oxide 230c1 and the oxide 230c2; the c-axes of crystals included in the oxide 230c1 and the oxide 230c2 are preferably aligned in a direction substantially perpendicular to the formation surfaces or the top surfaces of the oxide 230c1 and the oxide 230c2. The CAAC-OS has a property such that oxygen is less likely to be moved in the c-axis direction. Therefore, providing the oxide 230c2 between the oxide 230c1 and the insulator 250 can inhibit diffusion of oxygen contained in the oxide 230c1 into the insulator 250 and efficiently supply the oxygen to the oxide 230.

Specifically, a metal oxide with In:Ga:Zn=4:2:3 [atomic ratio] is used as the oxide 230c1, and a metal oxide with In:Ga:Zn=1:3:4 [atomic ratio] is used as the oxide 230c2. When the atomic ratio of In to the constituent elements in the metal oxide used as the oxide 230c2 is made lower than the atomic ratio of In to the constituent elements in the metal oxide used as the oxide 230c1, diffusion of In to the insulator 250 side can be inhibited. Since the insulator 250 functions as a gate insulator, the transistor exhibits poor characteristics when In enters the insulator 250 and the like. Thus, when the oxide 230c has a stacked-layer structure, a highly reliable semiconductor device can be provided.

The insulator 280 may be provided to have a stacked-layer structure of two layers. In the case where the insulator 280 includes an insulator 280a and an insulator 280b positioned over the insulator 280a as illustrated in FIG. 12, the insulator 280a preferably includes an excess-oxygen region. Since the insulator 280a has a shorter physical distance to the channel formation region of the oxide 230 than the insulator 280b, oxygen contained in the insulator 280 can be efficiently supplied to the channel formation region of the oxide 230.

Specifically, silicon oxide deposited by a sputtering method is used as the insulator 280a, and silicon oxynitride deposited by a CVD method is used as the insulator 280b. The thickness of the insulator 280a is preferably greater than or equal to 30 nm and less than or equal to 100 nm, further preferably greater than or equal to 40 nm and less than or equal to 80 nm. Although the insulator 280 has a stacked-layer structure in the transistor 200A, the present invention is not limited thereto. For example, the insulator 280 may be provided as a single layer or to have a stacked-layer structure of three or more layers.

As illustrated in FIG. 12, an insulator 282 may be provided between the insulator 274 and the insulator 281. As the insulator 282, an insulating film having a function of inhibiting diffusion of oxygen and impurities such as hydrogen is preferably used. For example, silicon nitride, aluminum oxide, or the like is preferably deposited by a sputtering method or an ALD method. Providing the insulator 282 can inhibit diffusion of oxygen contained in the insulator 280, the insulator 250, and the like to the insulator 281 side.

The structure, method, and the like described above in this embodiment can be used in combination as appropriate with the structures, methods, and the like described in the other embodiments.

Embodiment 2

An example of a semiconductor device including a transistor 200B of one embodiment of the present invention will be described below.

<Structure Example 3 of Semiconductor Device>

FIG. 13(A) to FIG. 13(D) are a top view and cross-sectional views of the transistor 200B of one embodiment of the present invention and the periphery of the transistor 200B. The transistor 200B is a variation example of the transistor 200.

Note that in the semiconductor device described in this embodiment, components having the same functions as the components in the semiconductor device described in the foregoing embodiment are denoted by the same reference numerals. In addition, the description in the foregoing embodiment can be referred to for the details of components, materials, and the like of the semiconductor device in this embodiment that are common to the components, materials, and the like of the semiconductor device in the foregoing embodiment and for the details of the components, materials, and the like denoted by the same reference numerals.

Figure 13A:
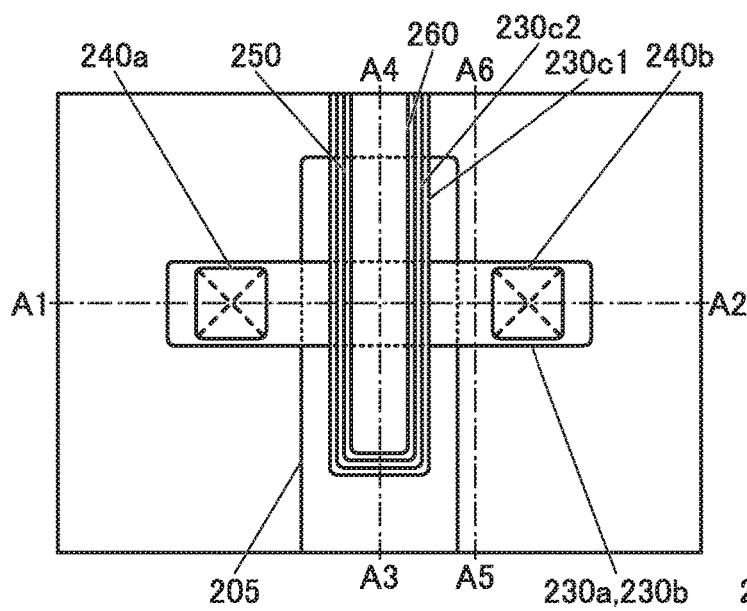
FIGS. 13A-13D A top view and cross-sectional views of a semiconductor device according to one embodiment of the present invention.
Figure 13C:
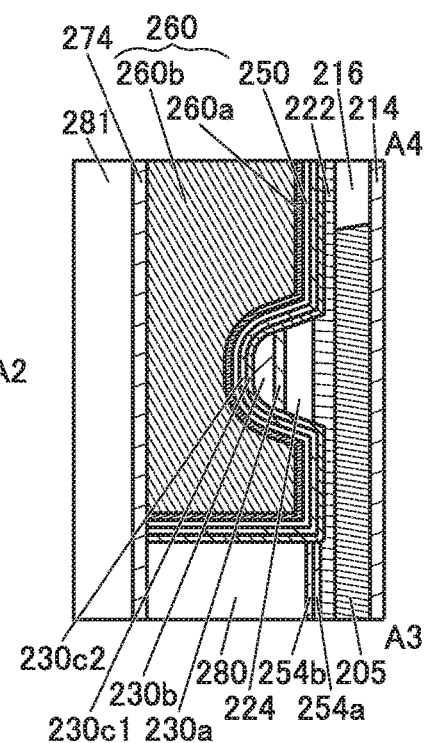
Figure 13B:
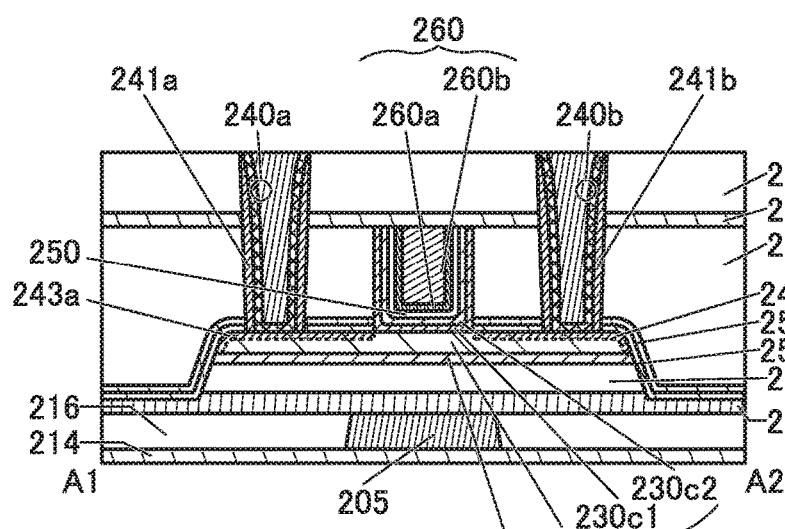
Figure 13D:
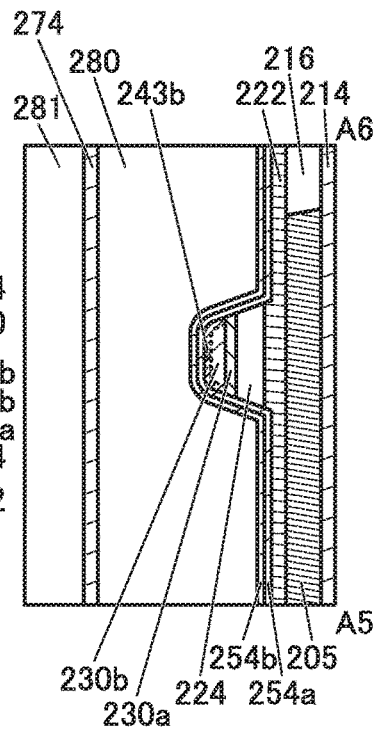

FIG. 13(A) is a top view of a semiconductor device including the transistor 200B. FIG. 13(B) to FIG. 13(D) are cross-sectional views of the semiconductor device. Here, FIG. 13(B) is a cross-sectional view of a portion indicated by a dashed-dotted line A1-A2 in FIG. 13(A), and is also a cross-sectional view in the channel length direction of the transistor 200B. FIG. 13(C) is a cross-sectional view of a portion indicated by a dashed-dotted line A3-A4 in FIG. 13(A), and is also a cross-sectional view in the channel width direction of the transistor 200B. FIG. 13(D) is a cross-sectional view of a portion indicated by a dashed-dotted line A5-A6 in FIG. 13(A), and is also a cross-sectional view of the vicinity of the region 243b functioning as a low-resistance region of the transistor 200B. Note that for clarity of the drawing, some components are not illustrated in the top view of FIG. 13(A).

The semiconductor device of one embodiment of the present invention includes the transistor 200B and the insulator 214, the insulator 280, the insulator 274, and the insulator 281 that function as interlayer films. The conductor 240 (the conductor 240a and the conductor 240b) that is electrically connected to the transistor 200B and functions as a plug is also included. Note that the insulator 241 (the insulator 241a and the insulator 241b) is provided in contact with a side surface of the conductor 240 functioning as a plug.

In contact with a side wall of an opening in the insulator 254 (the insulator 254a and the insulator 254b), the insulator 280, the insulator 274, and the insulator 281, the insulator 241 is provided. In contact with its side surface, a first conductor of the conductor 240 is provided, and a second conductor of the conductor 240 is further provided on the inner side. Here, a top surface of the conductor 240 and a top surface of the insulator 281 can be substantially level with each other. Note that although the transistor 200B having a structure in which the first conductor of the conductor 240 and the second conductor of the conductor 240 are stacked is illustrated, the present invention is not limited thereto. For example, the conductor 240 may be provided as a single layer or to have a stacked-layer structure of three or more layers. When a component has a stacked-layer structure, layers may be distinguished by ordinal numbers corresponding to the formation order.

[Transistor 200B]

As illustrated in FIG. 13, the transistor 200B includes the insulator 216 placed over a substrate (not illustrated); the conductor 205 placed to be embedded in the insulator 216; the insulator 222 placed over the insulator 216 and the conductor 205; the insulator 224 placed over the insulator 222; the oxide 230 (the oxide 230a, the oxide 230b, the oxide 230c1, and the oxide 230c2) placed over the insulator 224; the insulator 250 placed over the oxide 230; the conductor 260 (the conductor 260a and the conductor 260b) placed over the insulator 250; and the insulator 254 (the insulator 254a and the insulator 254b) placed in contact with part of the top surface of the insulator 222, the side surface of the insulator 224, the side surface of the oxide 230a, the side surface of the oxide 230b, and the top surface of the oxide 230b.

Note that hereinafter the oxide 230c1 and the oxide 230c2 may be collectively referred to as the oxide 230c.

As illustrated in FIG. 13, the region 243a and the region 243b are formed separately from each other on the top surface of the oxide 230b. In addition, an opening formed to overlap with a region between the region 243a and the region 243b is provided in the insulator 280.

The conductor 260 functions as a gate electrode of the transistor, and the region 243a and the region 243b function as a source region and a drain region. In the transistor 200B, the conductor 260 is formed in a self-aligned manner to be embedded in an opening formed in the insulator 280 and the insulator 254 and a region sandwiched between the region 243a and the region 243b. The formation of the conductor 260 in this manner allows the conductor 260 to be positioned certainly in the region between the region 243a and the region 243b without alignment. Therefore, the area occupied by the transistor 200B can be reduced. Accordingly, miniaturization and high integration of the semiconductor device can be achieved.

Note that the conductor 260 preferably includes the conductor 260a and the conductor 260b positioned over the conductor 260a. For example, the conductor 260a is preferably positioned to cover the bottom surface and side surface of the conductor 260b. Moreover, as illustrated in FIG. 13(B), the top surface of the conductor 260 is preferably substantially aligned with the top surfaces of the insulator 250, the oxide 230c, and the insulator 280.

The oxide 230 preferably includes the oxide 230a positioned over the insulator 224, the oxide 230b positioned over the oxide 230a, the oxide 230c1 that is positioned over the oxide 230b and is at least partly in contact with the top surface of the oxide 230b, and the oxide 230c2 positioned over the oxide 230c1.

Note that the transistor 200B has a structure in which four layers of the oxide 230a, the oxide 230b, the oxide 230c1, and the oxide 230c2 are stacked in the channel formation region and its vicinity; however, the present invention is not limited thereto. For example, any of the following structures may be provided: a single layer of the oxide 230b; a two-layer structure of the oxide 230a and the oxide 230b; a two-layer structure of the oxide 230b and the oxide 230c; a three-layer structure of the oxide 230a, the oxide 230b, and the oxide 230c1; a three-layer structure of the oxide 230a, the oxide 230b, and the oxide 230c2; and a stacked-layer structure of five or more layers. Alternatively, each of the oxide 230a and the oxide 230b may have a stacked-layer structure of two or more layers. Alternatively, the oxide 230c may have a single-layer structure or a stacked-layer structure of three or more layers.

For example, in the case where the oxide 230c has a stacked-layer structure of the oxide 230c1 and the oxide 230c2 over the oxide 230c1, it is preferred that the oxide 230c1 have a composition similar to that of the oxide 230b and the oxide 230c2 have a composition similar to that of the oxide 230a.

In the transistor 200B, as the oxide 230 (the oxide 230a, the oxide 230b, the oxide 230c1, and the oxide 230c2) including the channel formation region, a metal oxide functioning as a semiconductor (hereinafter also referred to as an oxide semiconductor) is preferably used.

The transistor 200B using an oxide semiconductor in the channel formation region exhibits extremely low leakage current inn-conduction state (off-state current); thus, a semiconductor device with low power consumption can be provided. An oxide semiconductor can be deposited by a sputtering method or the like, and can be used in the transistor 200B constituting a highly integrated semiconductor device.

For example, as the oxide 230, a metal oxide such as an In-M-Zn oxide (the element M is one kind or a plurality of kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used for the element M. Furthermore, indium oxide, zinc oxide, an In—Ga oxide, an In—Zn oxide, a Ga—Zn oxide, or gallium oxide may be used as the oxide 230.

Here, when an element that forms an oxygen vacancy or an element that is bonded to an oxygen vacancy is added to the oxide 230, the carrier density is increased and the resistance is lowered in some cases. Typical examples of the element include boron and phosphorus. Hydrogen, carbon, nitrogen, fluorine, sulfur, chlorine, titanium, a rare gas, and the like can be used as well as boron and phosphorus. Typical examples of the rare gas include helium, neon, argon, krypton, and xenon. Furthermore, any one or more metal elements selected from metal elements such as aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum may be added to the oxide 230. Among the above-described elements, boron or phosphorus is preferable as the element to be added. Since an apparatus in a manufacturing line for amorphous silicon or low-temperature polysilicon can be used for the addition of boron or phosphorus, capital investment can be reduced. The concentration of the element is measured by SIMS or the like.

Figure 14A:
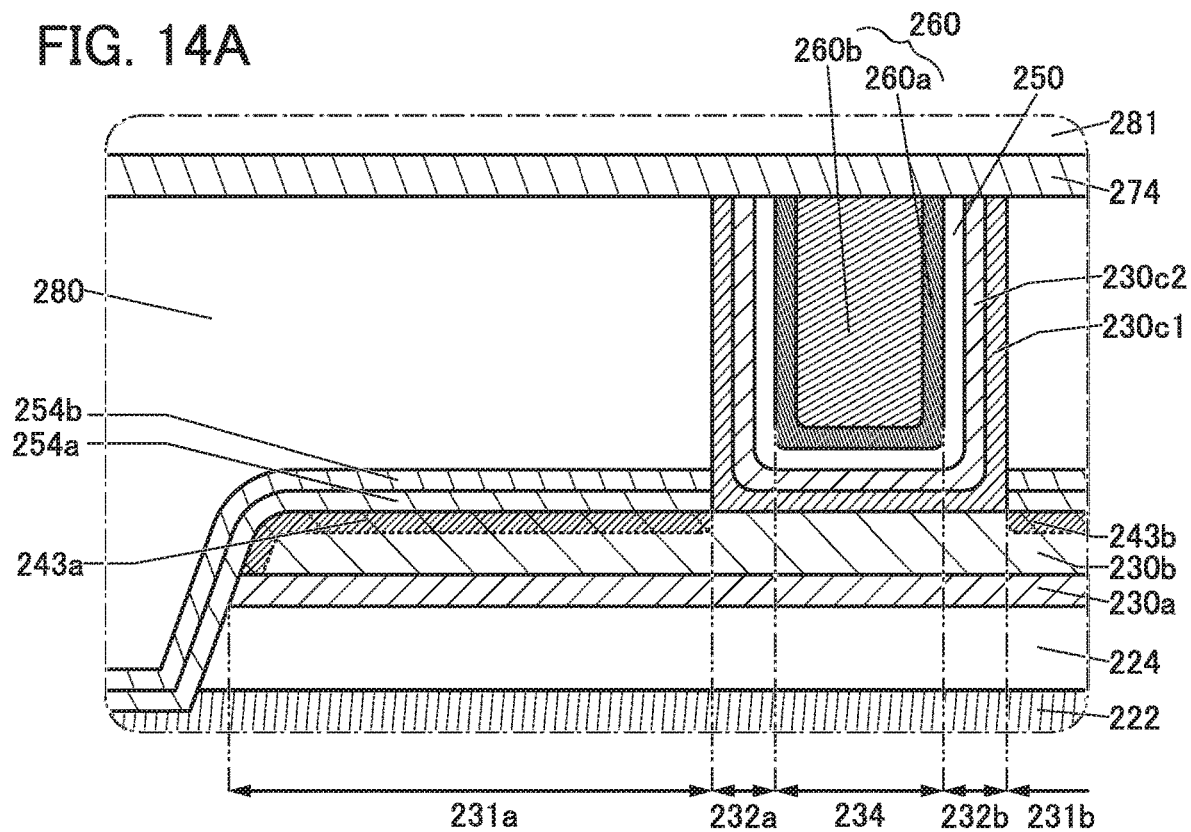
FIGS. 14A-14B Cross-sectional views of a semiconductor device according to one embodiment of the present invention.

FIG. 14(A) is an enlarged view of a region of part of the transistor 200B illustrated in FIG. 13(B). The region 243 is a region formed by addition of the above element to the oxide 230. As illustrated in FIG. 13(B) and FIG. 14(A), the region 243a and the region 243b are formed to face each other with the conductor 260 placed therebetween, and their top surfaces are preferably in contact with the insulator 254. In the top view, it is preferred that the side surfaces of the region 243a and the region 243b on the conductor 260 side be aligned with the side surface of the conductor 260, or that the region 243a and the region 243b partly overlap with the conductor 260. Here, the concentration of the above element in the region 243 is preferably equivalent to or higher than the concentration of the element in a portion of the oxide 230 where the region 243 is not formed. Moreover, the amount of oxygen vacancies in the region 243 is preferably equivalent to or higher than the amount of oxygen vacancies in the portion of the oxide 230 where the region 243 is not formed. Thus, the region 243 has a higher carrier density and a lower resistance than the portion of the oxide 230 where the region 243 is not formed.

In the oxide 230, a region overlapping with the conductor 260 is denoted as the region 234, a region overlapping with the insulator 254 is denoted as the region 231 (the region 231a and the region 231b), and a region between the region 234 and the region 231 is denoted as a region 232 (a region 232a and a region 232b). As illustrated in FIG. 14(A), the region 234 is positioned between the region 231a and the region 231b, the region 232a is positioned between the region 231a and the region 234, and the region 232b is positioned between the region 231b and the region 234. Here, the region 231 has a higher carrier density and a lower resistance than the region 234. The region 232 has a higher carrier density and a lower resistance than the region 234, and has a lower carrier density and a higher resistance than the region 231. Alternatively, the region 232 may have a carrier density and a resistance equivalent to those of the region 231. Accordingly, the region 234 functions as a channel formation region of the transistor 200B, the region 231 functions as a source region or a drain region, and the region 232 functions as a junction region.

Such a structure can prevent an offset region from being formed between the channel formation region and the source region or the drain region in the oxide 230, and inhibit the effective channel length from being larger than the width of the conductor 260. Thus, the on-state current of the transistor 200B can be increased, the S value (also referred to as Subthreshold Swing or SS) can be made favorable, and the frequency characteristics can be improved.

The formation of the region 231 functioning as the source region or the drain region in the oxide 230 enables the conductor 240 functioning as a plug to be connected to the region 231 without providing a source electrode and a drain electrode that are formed of a metal. If a source electrode and a drain electrode formed of a metal are provided in contact with the oxide 230, when high-temperature heat treatment is performed in the process of manufacturing the transistor 200B or the subsequent process, the source electrode and the drain electrode formed of a metal may be oxidized to cause degradation of the on-state current, S value, and frequency characteristics of the transistor 200B. However, in the semiconductor device described in this embodiment, it is not necessary to provide a source electrode and a drain electrode formed of a metal. Thus, even when high-temperature heat treatment is performed in the process of manufacturing the transistor 200B or the subsequent process, a semiconductor device that exhibits favorable on-state current, S value, and frequency characteristics can be provided. For example, in the semiconductor device described in this embodiment, a process where a high temperature of approximately higher than or equal to 750° C. and lower than or equal to 800° C. is applied can be performed after the transistor 200B is fabricated.

When an element that forms an oxygen vacancy is added to the region 243 and heat treatment is performed as described, hydrogen contained in the region 234 functioning as a channel formation region can be trapped by an oxygen vacancy included in the region 243 in some cases. Thus, the transistor 200B can have stable electrical characteristics and increased reliability.

Note that although the region 243 is formed in the vicinity of the interface between the oxide 230b and the insulator 254 in the film thickness direction of the oxide 230b in FIG. 14(A), the present invention is not limited thereto. For example, the region 243 may have substantially the same thickness as the oxide 230b or may also be formed in the oxide 230a. Although the region 243 is formed only in the region 231 in FIG. 14(A), the present invention is not limited thereto. For example, the region 243 may be formed in the region 231 and the region 232, in the region 231 and part of the region 232, or in the region 231, the region 232, and part of the region 234.

In the oxide 230, the boundaries between the regions are difficult to detect clearly in some cases. The concentrations of a metal element and an impurity element such as hydrogen and nitrogen, which are detected in each region, may be not only gradually changed between the regions, but also continuously changed (also referred to as gradation) in each region. That is, the region closer to the channel formation region has lower concentrations of a metal element and an impurity element such as hydrogen and nitrogen.

As illustrated in FIG. 13(B), the insulator 254 is preferably positioned between the insulator 280 and the insulator 224, the oxide 230a, and the oxide 230b. Here, the insulator 254 is preferably in contact with the top surface and side surface of the region 243a, the top surface and side surface of the region 243b, the side surfaces of the oxide 230a and the oxide 230b, the side surface of the insulator 224, and the top surface of the insulator 222. Thus, the insulator 280 is isolated from the insulator 224, the oxide 230a, and the oxide 230b by the insulator 254. This inhibits entry of impurities such as hydrogen contained in the insulator 280, the insulator 281, and the like into the insulator 224, the oxide 230a, and the oxide 230b.

Alternatively, the insulator 254 may have a stacked-layer structure including the insulator 254a and the insulator 254b. In that case, the insulator 254a is preferably provided in contact with the top surface and side surface of the region 243a, the top surface and side surface of the region 243b, the side surfaces of the oxide 230a and the oxide 230b, the side surface of the insulator 224, and the top surface of the insulator 222. Moreover, the insulator 254b is preferably provided over the insulator 254a and provided in contact with the insulator 280. In the case where the insulator 254 has a stacked-layer structure as described above, one of the insulator 254a and the insulator 254b may have a function of inhibiting diffusion of hydrogen and the other may have a function of inhibiting diffusion of oxygen.

The insulator 254a may have a function of supplying oxygen to the insulator 224, the oxide 230a, and the oxide 230b.

The insulator 274 is in contact with the top surfaces of the conductor 260, the insulator 250, the oxide 230c, and the insulator 280. As illustrated in FIG. 14(A), the transistor 200B of one embodiment of the present invention has a structure in which the insulator 274 and the insulator 250 are directly in contact with each other. Such a structure can inhibit entry of impurities such as hydrogen contained in the insulator 281 and the like into the insulator 250. Thus, adverse effects on the electrical characteristics of the transistor and the reliability of the transistor can be suppressed.

Figure 14B:
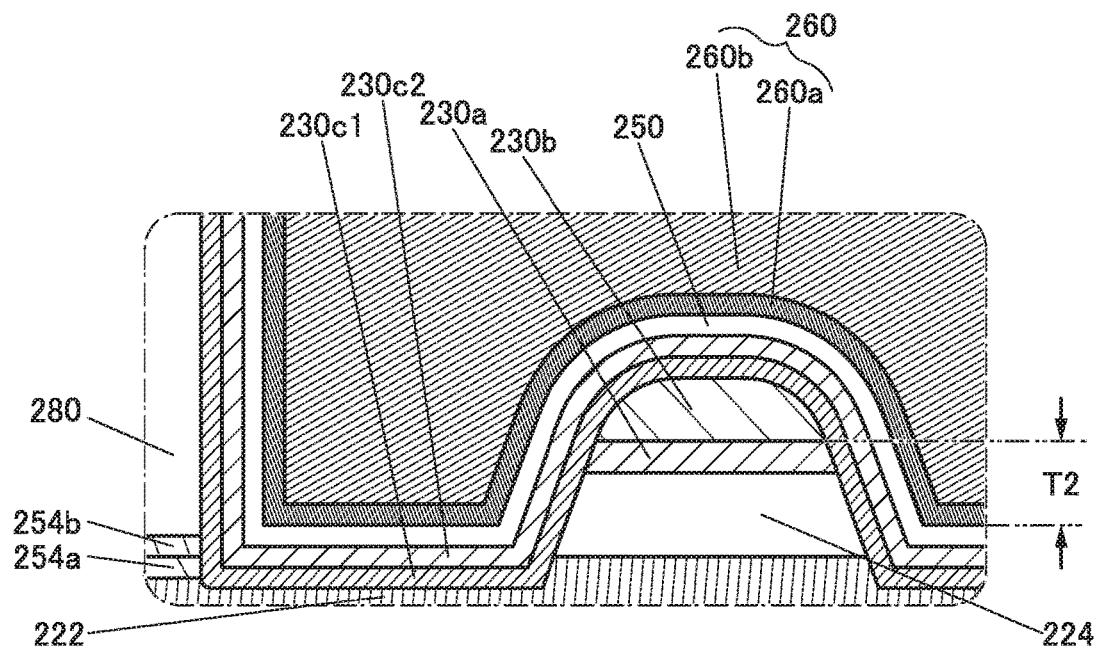
Figure 15A:
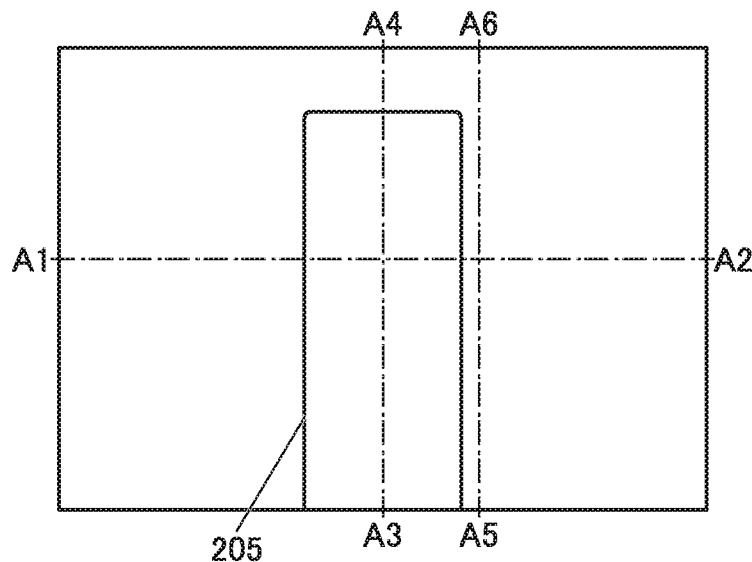
FIGS. 15A-15D A top view and cross-sectional views illustrating a method for manufacturing a semiconductor device according to one embodiment of the present invention.
Figure 15C:
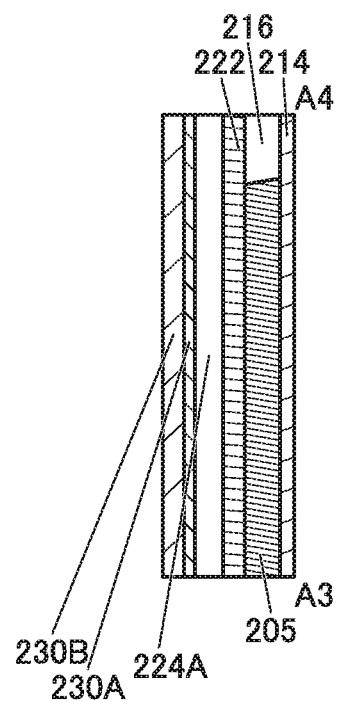
Figure 15B:
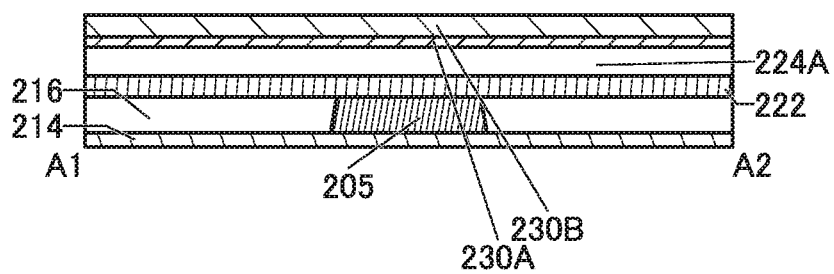
Figure 15D:
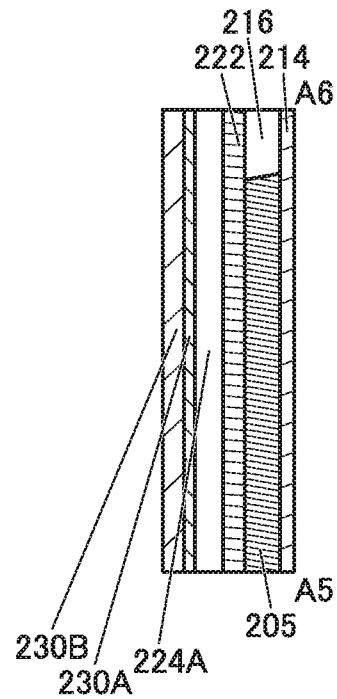
Figure 16A:
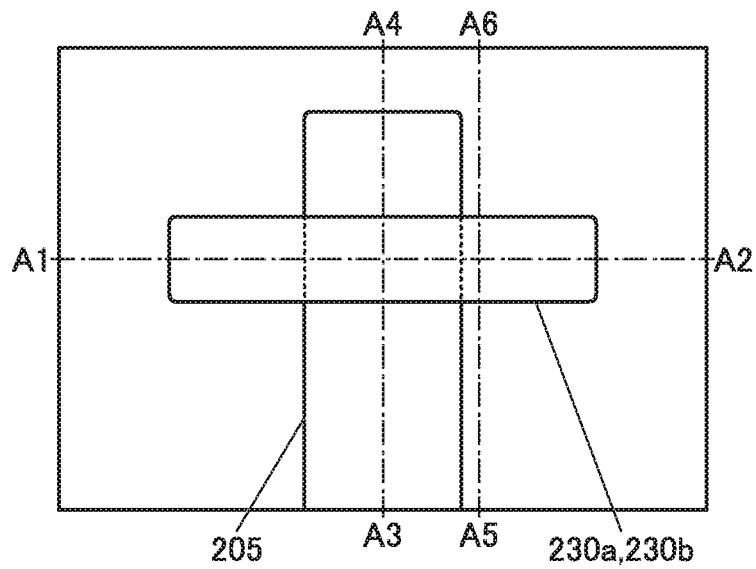
FIGS. 16A-16D A top view and cross-sectional views illustrating a method for manufacturing a semiconductor device according to one embodiment of the present invention.
Figure 16C:
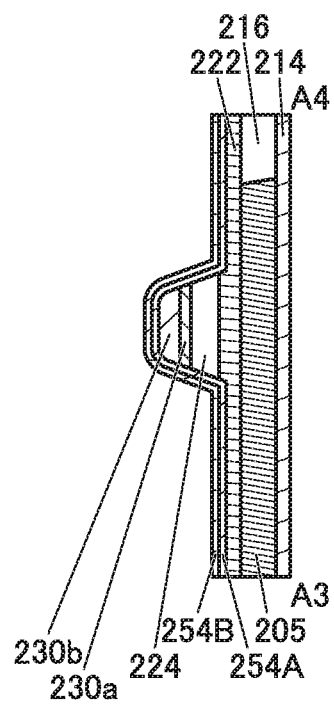
Figure 16B:
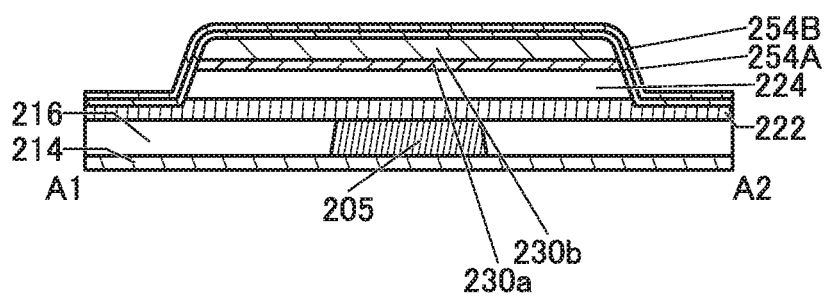
Figure 16D:
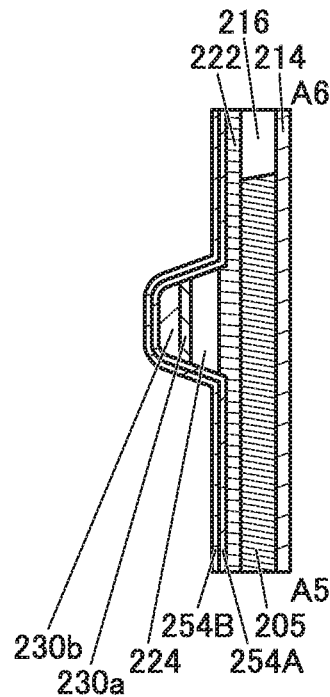
Figure 17A:
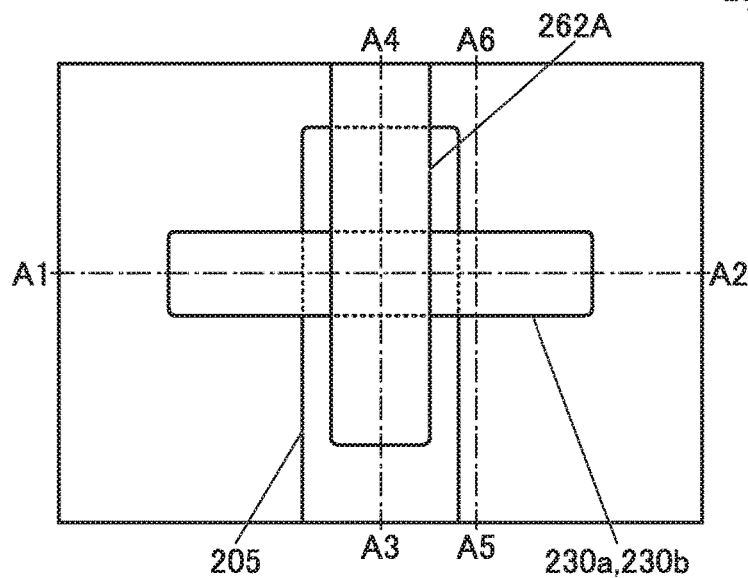
FIGS. 17A-17D A top view and cross-sectional views illustrating a method for manufacturing a semiconductor device according to one embodiment of the present invention.
Figure 17C:
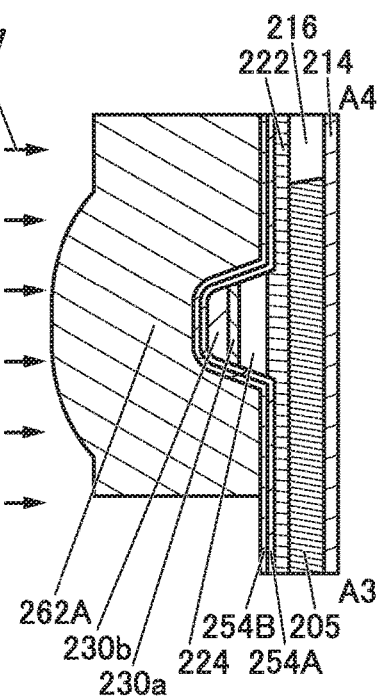
Figure 17B:
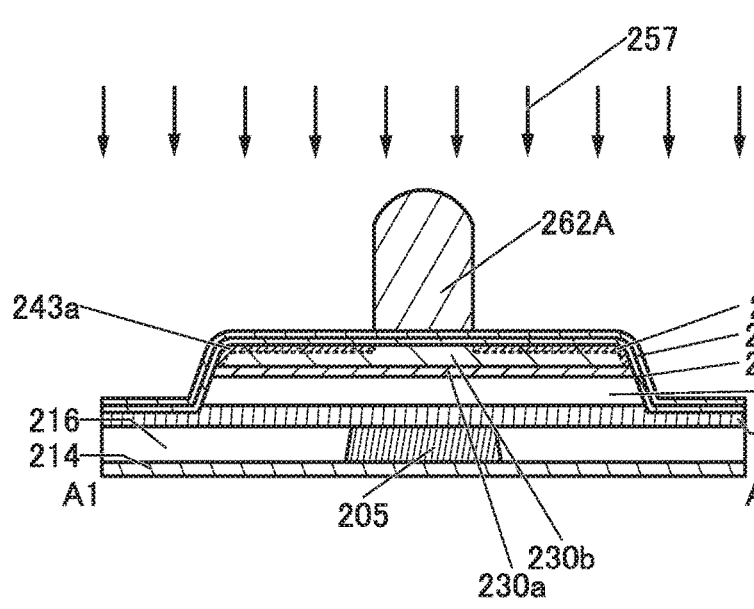
Figure 17D:
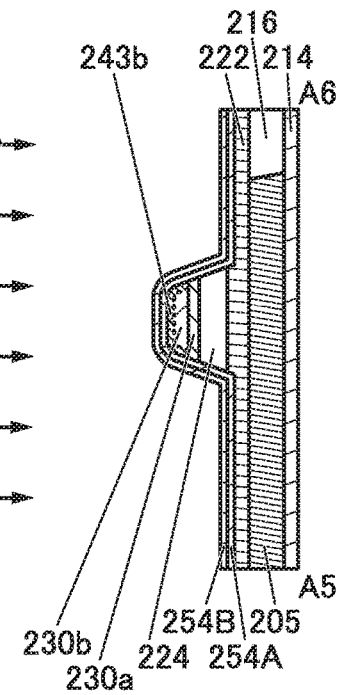
Figure 18A:
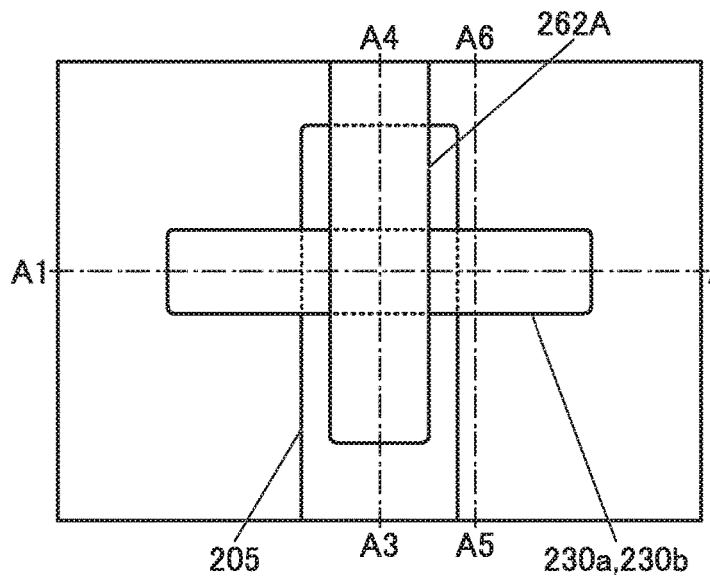
FIGS. 18A-18D A top view and cross-sectional views illustrating a method for manufacturing a semiconductor device according to one embodiment of the present invention.
Figure 18C:
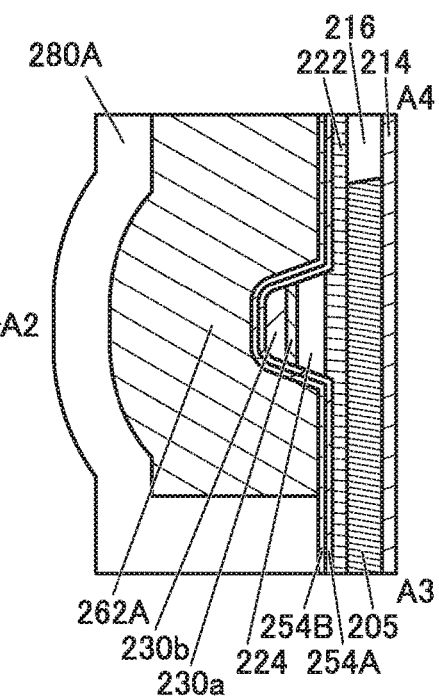
Figure 18B:
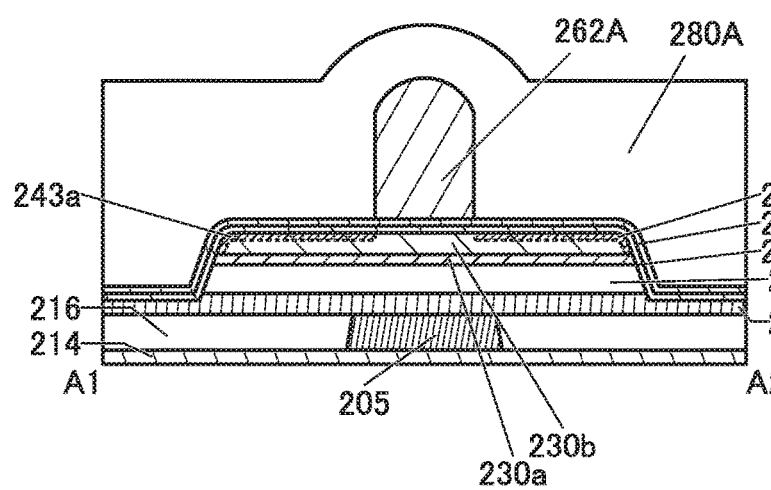
Figure 18D:
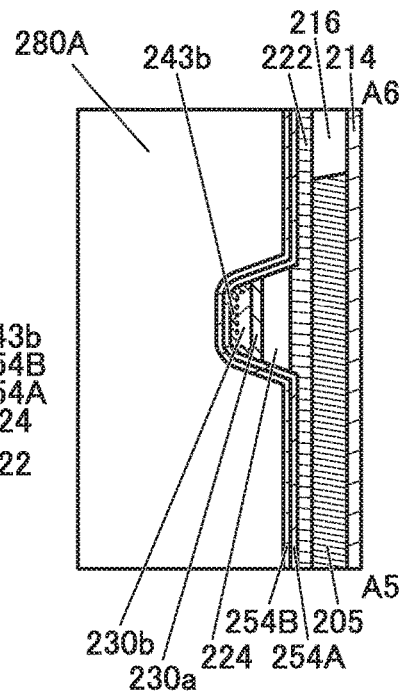
Figure 19A:
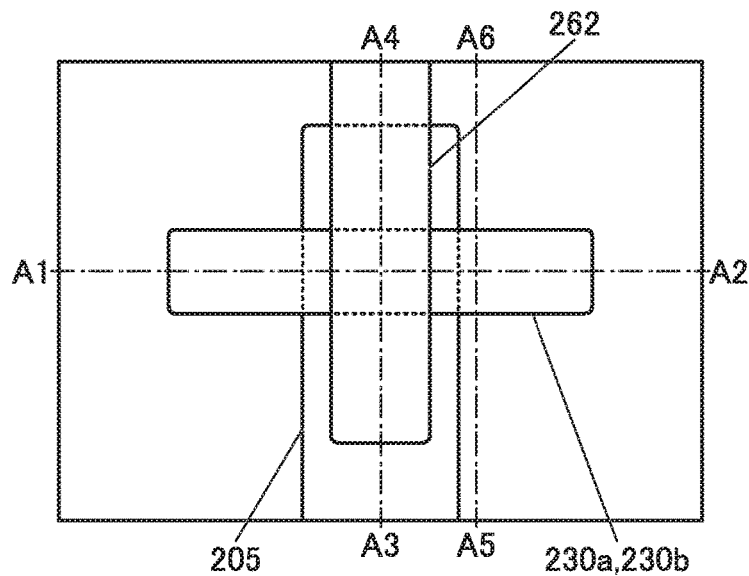
FIGS. 19A-19D A top view and cross-sectional views illustrating a method for manufacturing a semiconductor device according to one embodiment of the present invention.
Figure 19C:
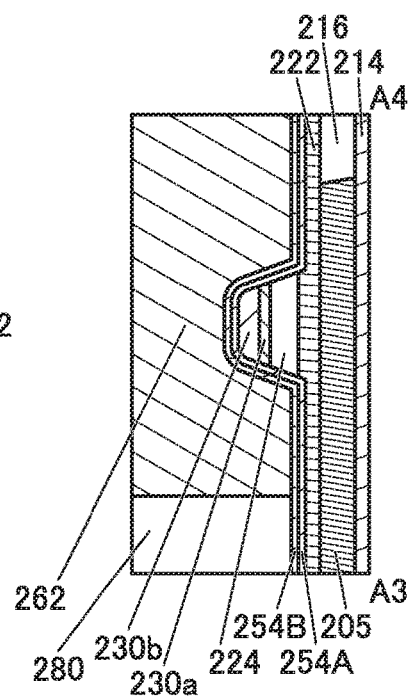
Figure 19B:
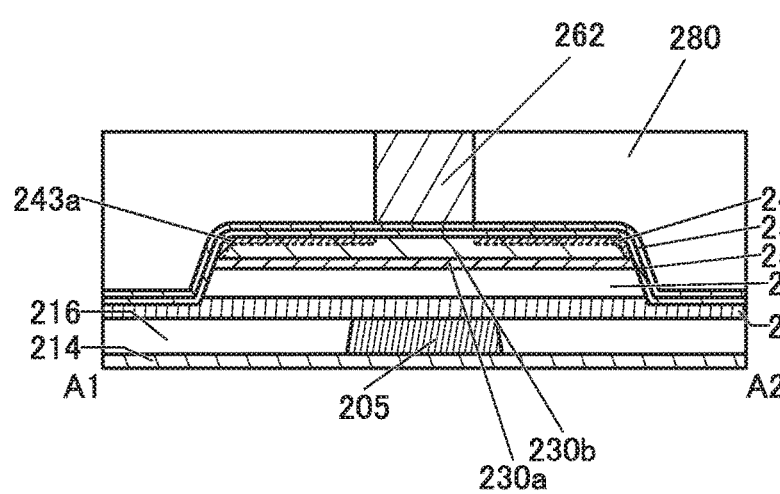
Figure 19D:
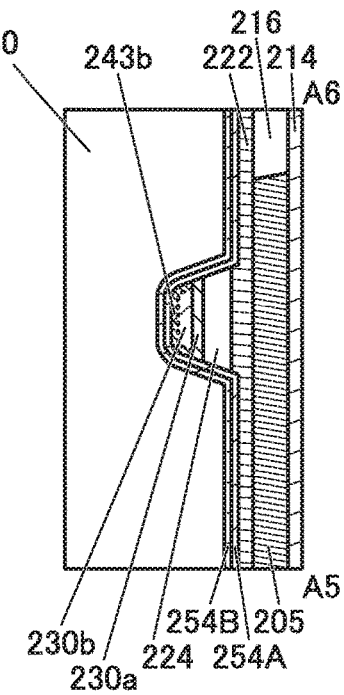
Figure 20A:
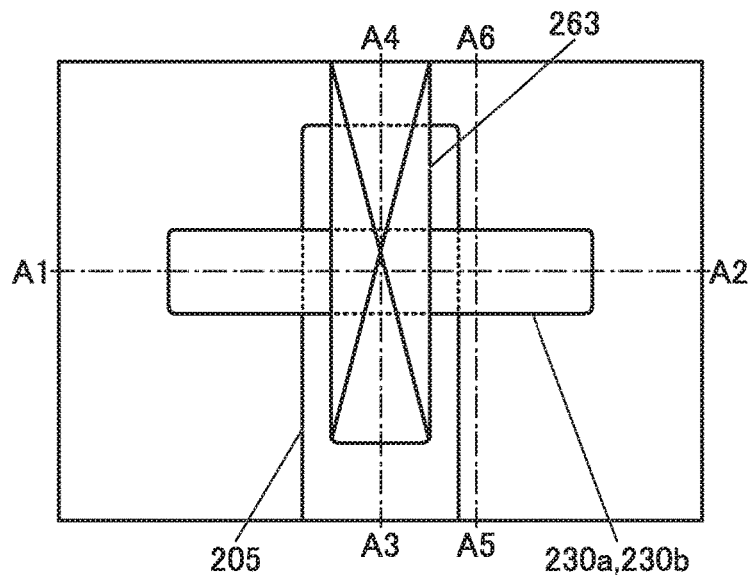
FIGS. 20A-20D A top view and cross-sectional views illustrating a method for manufacturing a semiconductor device according to one embodiment of the present invention.
Figure 20C:
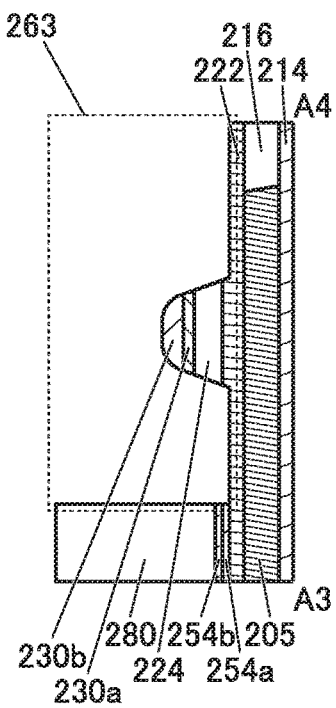
Figure 20B:
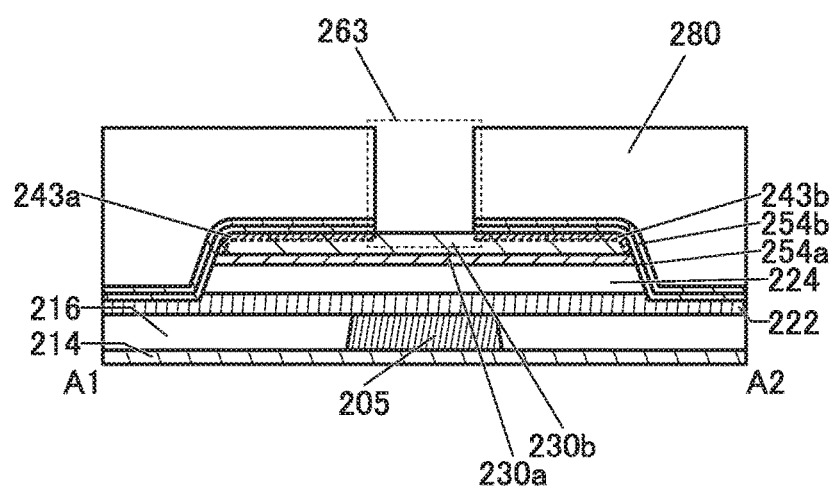
Figure 20D:
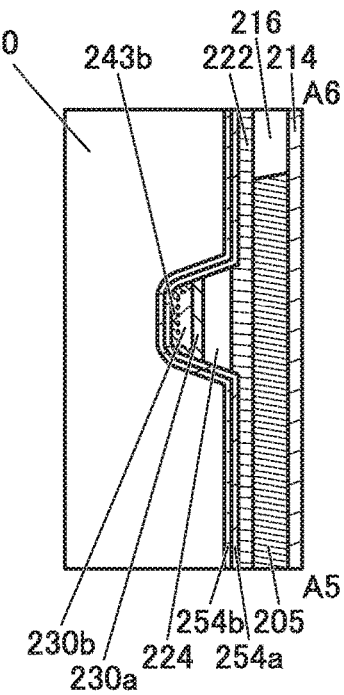
Figure 21A:
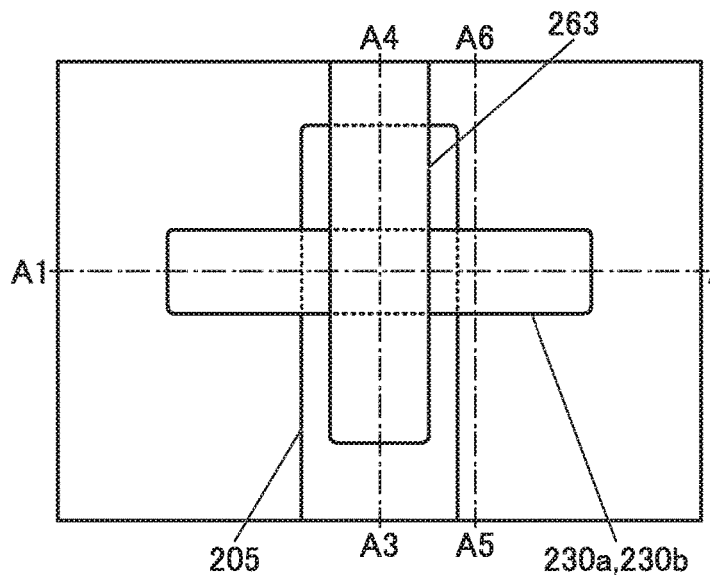
FIGS. 21A-21D A top view and cross-sectional views illustrating a method for manufacturing a semiconductor device according to one embodiment of the present invention.
Figure 21C:
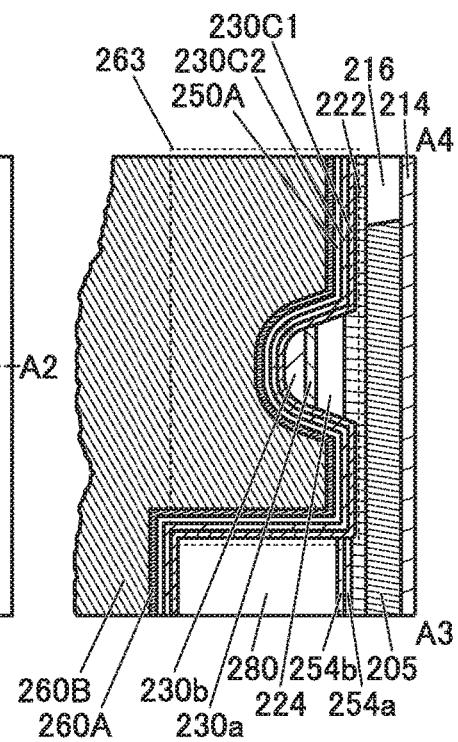
Figure 21B:
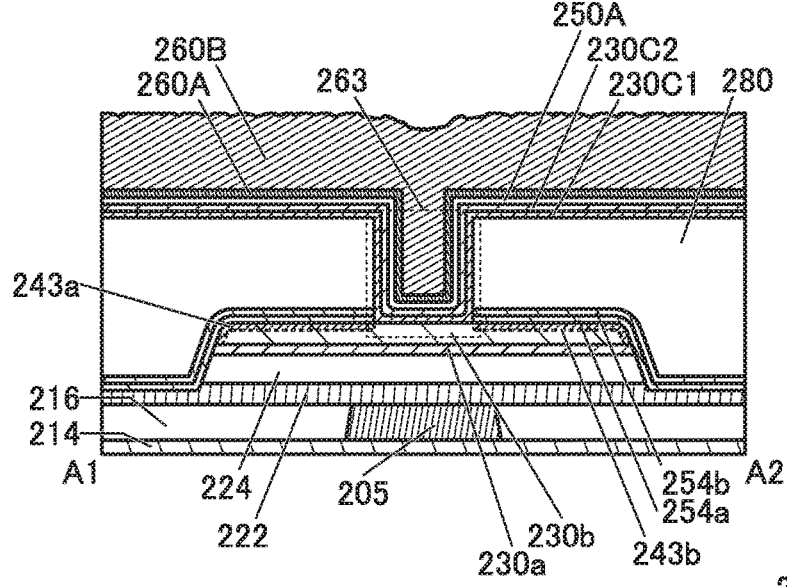
Figure 21D:
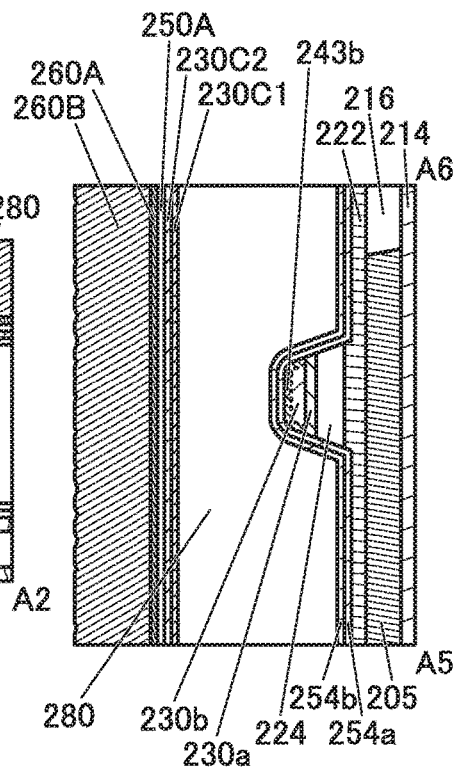
Figure 22A:
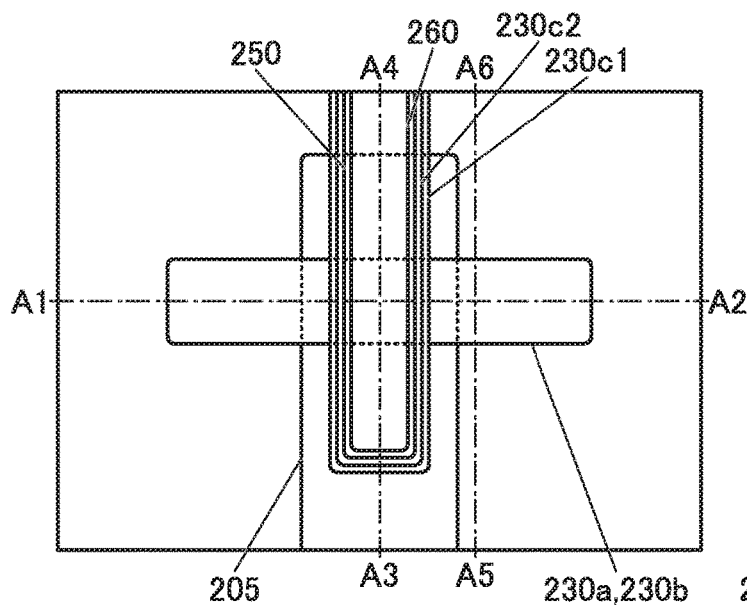
FIGS. 22A-22D A top view and cross-sectional views illustrating a method for manufacturing a semiconductor device according to one embodiment of the present invention.
Figure 22B:
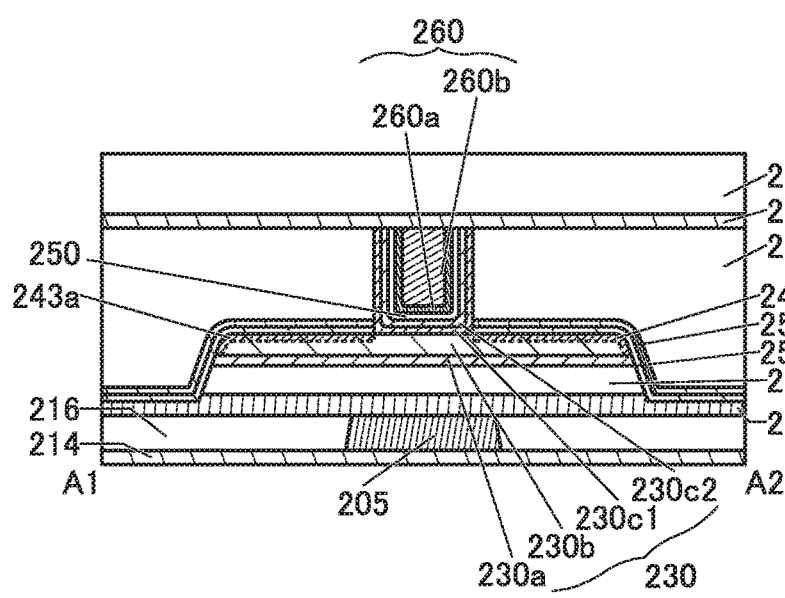
Figure 22C:
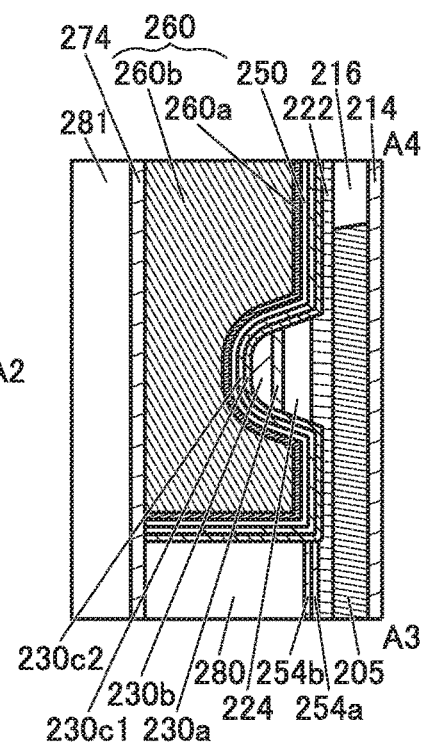
Figure 22D:
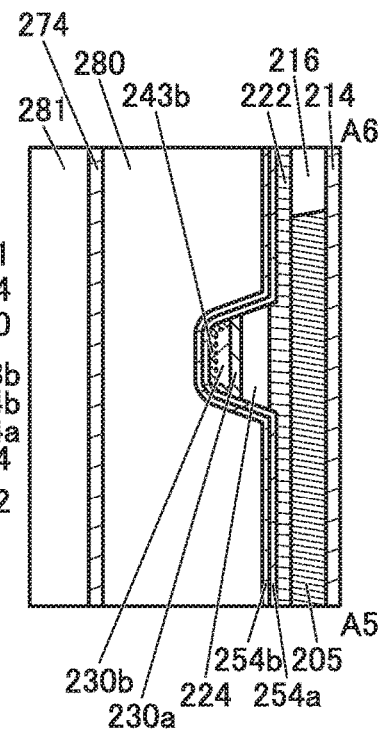

FIG. 14(B) shows an enlarged view of a region of part of the transistor 200B illustrated in FIG. 13(C). As illustrated in FIG. 13(C) and FIG. 14(B), in the channel width direction of the transistor 200B, with reference to the bottom surface of the insulator 222, the height of the bottom surface of the conductor 260 in a region where the conductor 260 and the oxide 230b do not overlap with each other is preferably lower than the height of the bottom surface of the oxide 230b. When the conductor 260, which functions as a gate electrode, covers the side surface and the top surface of the oxide 230b in the channel formation region with the oxide 230c and the insulator 250 therebetween, electric fields of the conductor 260 are likely to affect the entire region 234 of the oxide 230b. Thus, the on-state current of the transistor 200B can be increased and the frequency characteristics can be improved. When the difference between the height of the bottom surface of the conductor 260 in the region where the oxide 230a and the oxide 230b do not overlap with the conductor 260 and the height of the bottom surface of the oxide 230b is T2, T2 is greater than or equal to 0 nm and less than or equal to 100 nm, preferably greater than or equal to 3 nm and less than or equal to 50 nm, further preferably greater than or equal to 5 nm and less than or equal to 20 nm.

As illustrated in FIG. 14(B), in the channel width direction of the transistor 200B, at least part of the oxide 230c in a region that does not overlap with the oxide 230b, the oxide 230a, and the insulator 224 is preferably in contact with the insulator 222. With such a structure, oxygen contained in the oxide 230c can be prevented from diffusing to the outside of the transistor 200B through the insulator 224. Alternatively, oxygen contained in the oxide 230b and the oxide 230a can be prevented from diffusing to the outside of the transistor 200B through the insulator 224. Alternatively, a decrease in the area of the insulator 224 reduces the amount of oxygen taken into the insulator 224, thereby suppressing a reduction in the amount of oxygen supplied to the oxide 230. Accordingly, oxygen contained in the oxide 230c can be efficiently supplied to the oxide 230b and the oxide 230a, thereby inhibiting a reduction in the resistance of the oxide 230 in the region 234. Thus, it is possible to suppress variations in electrical characteristics of the transistor, achieve stable electrical characteristics, and increase the reliability.

Alternatively, employing the above structure can inhibit entry of impurities such as hydrogen contained in the insulator 224 and the like into the oxide 230. That is, a reduction in the resistance of the oxide 230 can be inhibited. Accordingly, it is possible to suppress variations in electrical characteristics of the transistor, achieve stable electrical characteristics, and increase the reliability. Note that the structure can be formed by removing the insulator 224 in a region that does not overlap with the oxide 230b and the oxide 230a.

As illustrated in FIG. 14(B), the insulator 224 is preferably formed into an island shape in a manner similar to those of the oxide 230a and the oxide 230b, by removing the insulator 224 in a region that does not overlap with the oxide 230b and the oxide 230a. With such a structure, in the channel width direction of the transistor 200B, with reference to the bottom surface of the insulator 222, the height of the bottom surface of the conductor 260 in a region where the oxide 230a and the oxide 230b do not overlap with the conductor 260 is likely to be lower than the height of the bottom surface of the oxide 230b. Thus, the on-state current of the transistor 200B can be increased, and the frequency characteristics can be improved.

Accordingly, a semiconductor device including a transistor having a high on-state current can be provided. A semiconductor device including a transistor having high frequency characteristics can be provided. A semiconductor device having suppressed variation in electrical characteristics, stable electrical characteristics, and improved reliability can be provided. In addition, a semiconductor device including a transistor having a low off-state current can be provided.

The detailed structure of the semiconductor device including the transistor 200B of one embodiment of the present invention will be described below. Note that the description in the foregoing embodiment can be referred to for the details of the components, materials, and the like of the semiconductor device in this embodiment that are common to the components, materials, and the like of the semiconductor device in the foregoing embodiment and for the details of the components, materials, and the like denoted by the same reference numerals.

The oxide 230b and the oxide 230c preferably have crystallinity. For example, a CAAC-OS is preferably used. An oxide having crystallinity, such as a CAAC-OS, has a dense structure with small amounts of impurities and defects (e.g., oxygen vacancies) and high crystallinity. By using such an oxide 230, the transistor 200B is stable with respect to high temperatures in the manufacturing process (what is called thermal budget).

As illustrated in FIG. 13(B) and FIG. 13(C), the insulator 254 is preferably in contact with part of the side surface of the oxide 230c; the top surface and side surface of the region 243a and the top surface and side surface of the region 243b, that is, part of the top surface and part of the side surface of the oxide 230b; the side surface of the oxide 230a; the side surface of the insulator 224; and the top surface of the insulator 222. With such a structure, the insulator 280 is isolated from the insulator 224 and the oxide 230 by the insulator 254. Accordingly, hydrogen contained in the insulator 280 can be inhibited from diffusing into the oxide 230 through the top surfaces or side surfaces of the oxide 230a, the oxide 230b, and the insulator 224; hence, the transistor 200B can be provided with favorable electrical characteristics and reliability.

Although described later, the insulator 254 may have a function of a protective film at the time of forming the region 243a and the region 243b. When ion implantation or ion doping is used to form the region 243a and the region 243b, it is preferable to provide the insulator 254 as a protective film, in which case the surface of the oxide 230 is not directly exposed to ions and plasma and thus damage to the oxide 230 in the formation of the region 243a and the region 243b can be reduced. Here, damage to the oxide 230 refers to, for example, formation of an excessive amount of oxygen vacancies in the oxide 230 and an excessive reduction in crystallinity of the oxide 230. For example, for the insulator 254, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used.

Note that the insulator 254 has a stacked-layer structure in this embodiment. In the case where the insulator 254 has a stacked-layer structure of the insulator 254a and the insulator 254b, the insulator 254a may be deposited by a sputtering method in an atmosphere containing oxygen, and then, the insulator 254b may be deposited by an ALD method, for example. An ALD method is a deposition method that provides good coverage, and thus can prevent formation of disconnection or the like due to unevenness of the insulator 254a. Note that for the insulator 254a and the insulator 254b, the same material selected from the above-described materials may be used or different materials may be used. For example, a stacked-layer structure of silicon oxide, silicon oxynitride, silicon nitride oxide, or silicon nitride and an insulator having a function of inhibiting transmission of oxygen and impurities such as hydrogen may be employed. As the insulator having a function of inhibiting transmission of oxygen and impurities such as hydrogen, an insulator containing an oxide of one or both of aluminum and hafnium can be used, for example. Note that although FIG. 13 shows that the insulator 254 has a two-layer structure, the insulator 254 may have a single-layer structure or a stacked-layer structure of three or more layers.

The insulator 280 is provided over the insulator 222, the insulator 224, and the oxide 230 with the insulator 254 therebetween.

The insulator 241a is provided in contact with a side wall of the opening in the insulator 281, the insulator 274, the insulator 280, and the insulator 254, and the first conductor of the conductor 240a is formed on the side surface. The region 243a is positioned on at least part of the bottom portion of the opening, and the conductor 240a is in contact with the region 243a. Similarly, the insulator 241b is provided in contact with a side wall of the opening in the insulator 281, the insulator 274, the insulator 280, and the insulator 254, and the first conductor of the conductor 240b is formed on the side surface. The region 243b is positioned on at least part of the bottom portion of the opening, and the conductor 240b is in contact with the region 243b.

In the case where the conductor 240 has a stacked-layer structure, a conductive material having a function of inhibiting transmission of impurities such as water and hydrogen is preferably used for the conductor in contact with the oxide 230a, the oxide 230b, the insulator 254, the insulator 280, the insulator 274, and the insulator 281.

<Method for Manufacturing Semiconductor Device>

Next, a method for manufacturing a semiconductor device including the transistor 200B of one embodiment of the present invention, which is illustrated in FIG. 13, will be described with reference to FIG. 15 to FIG. 22. In FIG. 15 to FIG. 22, (A) in each drawing is a top view. Furthermore, (B) in each drawing is a cross-sectional view corresponding to a portion indicated by a dashed-dotted line A1-A2 in (A), and is also a cross-sectional view of the transistor 200B in the channel length direction. Moreover, (C) in each drawing is a cross-sectional view corresponding to a portion indicated by a dashed-dotted line A3-A4 in (A), and is also a cross-sectional view of the transistor 200B in the channel width direction. In addition, (D) in each drawing is a cross-sectional view corresponding to a portion indicated by a dashed-dotted line A5-A6 in (A), and is also a cross-sectional view of the vicinity of the region 243b in the transistor 200B. Note that for simplification of the drawings, some components are not illustrated in the top view of (A) of each drawing. Note that the description of portions that are similar to those in Embodiment 1 is omitted.

First, a substrate (not illustrated) is prepared, and the insulator 214 is deposited over the substrate, the conductor 205 and the insulator 216 are formed over the insulator 214, the insulator 222 is deposited over the conductor 205 and the insulator 216, the insulating film 224A is deposited over the insulator 222, and the oxide film 230A and the oxide film 230B are deposited in this order over the insulating film 224A (see FIG. 15).

Note that the steps up to the deposition of the oxide film 230B in the method for manufacturing the semiconductor device including the transistor 200B are similar to those for the semiconductor device including the transistor 200 described in Embodiment 1; therefore, the detailed description of the steps up to the deposition of the oxide film 230B is omitted.

Then, the insulating film 224A, the oxide film 230A, and the oxide film 230B are processed into island shapes to form the insulator 224, the oxide 230a, and the oxide 230b. Note that in this step, the thickness of the insulator 222 in a region that does not overlap with the insulator 224 is reduced in some cases (see FIG. 16).

Here, the insulator 224, the oxide 230a, and the oxide 230b are formed to at least partly overlap with the conductor 205. It is preferable that the side surfaces of the insulator 224, the oxide 230a, and the oxide 230b be substantially perpendicular to the top surface of the insulator 222. When the side surfaces of the insulator 224, the oxide 230a, and the oxide 230b are substantially perpendicular to the top surface of the insulator 222, a plurality of transistors 200B can be provided in a smaller area and at a higher density. Alternatively, a structure may be employed in which the angle formed by the side surfaces of the insulator 224, the oxide 230a, and the oxide 230b and the top surface of the insulator 222 is an acute angle. In that case, the angle formed by the side surfaces of the insulator 224, the oxide 230a, and the oxide 230b and the top surface of the insulator 222 is preferably greater than or equal to 60° and less than 70°. With such a shape, coverage with the insulator 254 and the like can be improved in a later step, so that defects such as voids can be reduced.

There is a curved surface between the side surface of the oxide 230b and the top surface of the oxide 230b. That is, an end portion of the side surface and an end portion of the top surface are preferably curved (such a shape is hereinafter also referred to as a rounded shape). The radius of curvature of the curved surface at the end portion of the oxide 230b is greater than or equal to 3 nm and less than or equal to 10 nm, preferably greater than or equal to 5 nm and less than or equal to 6 nm, for example. When the end portions are not angular, coverage with films in later deposition steps is improved.

Note that the insulating film 224A, the oxide film 230A, and the oxide film 230B are processed by a lithography method. A dry etching method or a wet etching method can be used for the processing. Processing by a dry etching method is suitable for microfabrication. The insulating film 224A, the oxide film 230A, and the oxide film 230B may be processed under different conditions.

In some cases, the treatment such as dry etching causes impurities due to an etching gas or the like to be attached or diffused to the surface or the inside of the oxide 230a, the oxide 230b, and the like. Examples of the impurities include fluorine and chlorine.

In order to remove the impurities and the like, cleaning is performed. Examples of the cleaning method include wet cleaning using a cleaning solution and the like, plasma treatment using plasma, and cleaning by heat treatment, and any of these cleanings may be performed in appropriate combination.

The wet cleaning may be performed using an aqueous solution in which oxalic acid, phosphoric acid, hydrofluoric acid, or the like is diluted with carbonated water or pure water. Alternatively, ultrasonic cleaning using pure water or carbonated water may be performed. In this embodiment, the ultrasonic cleaning using pure water or carbonated water is performed.

Then, heat treatment may be performed. For the conditions of the heat treatment, the conditions for the above heat treatment can be used. Alternatively, heat treatment is preferably performed before deposition of the insulating film 254A. The heat treatment is performed at a temperature higher than or equal to 100° C. and lower than or equal to 400° C., and is performed at 200° C., for example. Alternatively, the heat treatment is preferably performed at the same temperature as the deposition temperature of the insulating film 254A. Here, the deposition temperature is not limited to the substrate temperature during the deposition, and includes the set temperature of the deposition apparatus. For example, in the case where the insulating film 254A is deposited at 200° C., the heat treatment is preferably performed at 200° C. The heat treatment is preferably performed under reduced pressure, and for example, may be performed in a vacuum atmosphere. A vacuum atmosphere is kept by evacuation with a turbomolecular pump or the like. The pressure in a vacuum atmosphere of the treatment chamber is lower than or equal to $1\times10^{-2}$ Pa, preferably lower than or equal to $1\times10^{-3}$ Pa.

Next, the insulating film 254A to be the insulator 254a is deposited over the insulator 222, the insulator 224, the oxide 230a, and the oxide 230b (see FIG. 16). The insulating film 254A can be deposited by a sputtering method, a CVD method, an MBE method, a PLD method, an ALD method, or the like. The insulating film 254A is preferably formed using an insulator having a function of inhibiting transmission of oxygen and impurities such as water and hydrogen. In this embodiment, silicon nitride is deposited by a sputtering method.

Next, an insulating film 254B to be the insulator 254b is deposited over the insulating film 254A (see FIG. 16). The insulating film 254B can be deposited by a sputtering method, a CVD method, an MBE method, a PLD method, an ALD method, or the like. The insulating film 254B is preferably formed using an insulator having a function of inhibiting transmission of oxygen and impurities such as water and hydrogen. For example, an aluminum oxide film is preferably deposited by a sputtering method. When an aluminum oxide film is deposited by a sputtering method using a gas containing oxygen, oxygen can be injected into the insulator 224. That is, the insulator 224 can contain excess oxygen.

Alternatively, aluminum oxide may be deposited as the insulating film 254B while the substrate is heated at a high temperature. The substrate heating temperature during the deposition of the insulating film 254B is higher than or equal to 200° C., preferably higher than or equal to 250° C., further preferably higher than or equal to 350° C. In this embodiment, aluminum oxide is deposited by a sputtering method.

Next, a dummy gate film to be a dummy gate layer 262A is deposited over the insulating film 254B. The dummy gate film is processed to be used as a dummy gate. The dummy gate is a temporary gate electrode. That is, a temporary gate electrode is formed by processing the dummy gate film, the dummy gate is removed in a later step, and a gate electrode is formed using a conductive film or the like instead. Thus, a film that is easily processed minutely and easily removed is preferably used as the dummy gate film.

The dummy gate film can be deposited by a sputtering method, a CVD method, an MBE method, a PLD method, an ALD method, or the like. An insulator, a semiconductor, or a conductor can be used, for example. Specifically, a silicon film of polysilicon, microcrystalline silicon, amorphous silicon, or the like or a metal film of aluminum, titanium, tungsten, or the like is used, for example. Alternatively, a film containing carbon, SOG (Spin On Glass), a resin film, or the like may be formed by a coating method. Examples of materials for the resin film include a photoresist, polyester, polyolefin, polyamide (nylon, aramid, and the like), polyimide, polycarbonate, and acrylic. When SOG or the resin film is formed by a coating method, a surface of the dummy gate film can be made flat. When the surface of the dummy gate film is made flat in this manner, the dummy gate film can be easily processed minutely and easily removed.

The dummy gate film can be a multilayer film using different kinds of films. For example, the dummy gate film can have a two-layer structure in which a conductive film and a resin film over the conductive film are formed. When the dummy gate film has such a structure, the conductive film may function as a stopper film for CMP treatment in a later CMP process, for example. Alternatively, the end point of the CMP treatment can be detected in some cases, so that processing variations can be reduced in some cases.

Then, the dummy gate film is etched by a lithography method, so that the dummy gate layer 262A is formed (see FIG. 17). The dummy gate layer 262A is formed to at least partly overlap with the conductor 205 and the oxide 230.

Next, a dopant 257 is added to the oxide 230b using the dummy gate layer 262A as a mask (see FIG. 17). Accordingly, the region 243a and the region 243b each including the dopant 257 are formed in a region of the oxide 230b that does not overlap with the dummy gate layer 262A. Note that FIG. 17 illustrates a state in which the dopant 257 is not added to a region of the oxide 230b that overlaps with the dummy gate layer 262A. However, this embodiment is not limited thereto. For example, the dopant 257 is sometimes diffused and added to a region overlapping with the dummy gate layer 262A (e.g., the region 232 illustrated in FIG. 14(A)). In that case, part of the region 243a and part of the region 243b are also formed in the region overlapping with the dummy gate layer 262A. In this manner, the distance between the region 243a and the region 243b, that is, the channel length can be controlled.

As a method for adding the dopant 257, an ion implantation method in which an ionized source gas is subjected to mass separation and then added, an ion doping method in which an ionized source gas is added without mass separation, a plasma immersion ion implantation method, or the like can be used. In the case of performing mass separation, an ion species to be added and its concentration can be adjusted precisely. On the other hand, in the case of not performing mass separation, ions at a high concentration can be added in a short time. Alternatively, an ion doping method in which atomic or molecular clusters are generated and ionized may be used. Note that a dopant may be referred to as an ion, donor, acceptor, impurity, element, and the like.

As the dopant 257, any of the above-described elements that form an oxygen vacancy or are bonded to an oxygen vacancy, or the like is used. Typical examples of such elements include boron and phosphorus. Hydrogen, carbon, nitrogen, fluorine, sulfur, chlorine, titanium, a rare gas element, or the like can also be used. Typical examples of the rare gas element include helium, neon, argon, krypton, and xenon. Furthermore, any one or more metal elements selected from metal elements such as aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum may be added. Among the above, boron and phosphorus are preferable as the dopant 257. In the case where boron or phosphorus is used as the dopant 257, manufacturing line apparatuses for amorphous silicon or low-temperature polysilicon can be used; thus, capital investment can be reduced.

Although the dopant 257 is added substantially perpendicularly to the top surface of the insulator 214 in FIG. 17, this embodiment is not limited thereto, and the dopant 257 may be added obliquely to the top surface of the insulator 214. When the dopant is added obliquely to the top surface of the insulator 214, the region 243a and the region 243b can be formed easily in part of the region overlapping with the dummy gate layer 262A.

In the manufacturing method in this embodiment, the dopant 257 is added to the oxide 230 through the insulating film 254A and the insulating film 254B. With this manufacturing method, the dopant 257 is also added to the insulating film 254A and the insulating film 254B. That is, both the oxide 230 and the insulating films 254A and 254B contain an element contained in the dopant 257. When the insulating film 254A and the insulating film 254B contain excess oxygen, the dopant 257 can inhibit diffusion of excess oxygen to the outside in some cases.

The region 243 is formed in the above manner, whereby the conductor 260 formed in a later step can be arranged in a self-aligned manner between the region 243a and the region 243b.

Next, an insulating film 280A to be the insulator 280 is deposited over the insulating film 254B and the dummy gate layer 262A (see FIG. 18). The insulating film 280A can be deposited by a sputtering method, a CVD method, an MBE method, a PLD method, an ALD method, or the like.

Then, the insulating film 280A and the dummy gate layer 262A are partly removed until part of the dummy gate layer 262A is exposed, so that the insulator 280 and a dummy gate 262 are formed (see FIG. 19). CMP treatment is preferably used to from the insulator 280 and the dummy gate 262.

As described above, when the dummy gate layer 262A is a film having a two-layer structure in which a first layer and a second layer over the first layer are formed, for example, the first layer may function as a stopper film for CMP treatment in a CMP process. Alternatively, the end point of the CMP treatment can be detected with the first layer in some cases, so that variations in the height of the dummy gate 262 can be reduced in some cases. As illustrated FIG. 19(B), the top surface of the dummy gate 262 is substantially aligned with the top surface of the insulator 280.

Next, the dummy gate 262 and part of the insulating films 254A and 254B overlapping with the dummy gate 262 are removed to form the opening 263 (see FIG. 20). The dummy gate 262, the insulating film 254A, and the insulating film 254B can be removed by wet etching, dry etching, ashing, or the like. Alternatively, a plurality of above treatments may be performed in appropriate combination. For example, wet etching treatment may be performed after ashing treatment. By partly removing the insulating film 254A and the insulating film 254B, the insulator 254a and the insulator 254b are formed. By removing the dummy gate 262, the insulating film 254A, and the insulating film 254B, part of the surface of the oxide 230b is exposed at the opening 263. At this time, part of the surface of the region 243 is sometimes exposed at the opening 263.

Next, heat treatment is preferably performed before deposition of an oxide film 230C1. The heat treatment is performed at a temperature higher than or equal to 100° C. and lower than or equal to 400° C., and is performed at 200° C., for example. Alternatively, the heat treatment is preferably performed at the same temperature as the deposition temperature of the oxide film 230C1 or an oxide film 230C2. Here, the deposition temperature is not limited to the substrate temperature during the deposition, and includes the set temperature of the deposition apparatus. For example, in the case where the oxide film 230C1 or the oxide film 230C2 is deposited at 300° C., the heat treatment is preferably performed at 300° C. The heat treatment is preferably performed under reduced pressure, and for example, may be performed in a vacuum atmosphere. A vacuum atmosphere is kept by evacuation with a turbomolecular pump or the like. The pressure in a vacuum atmosphere of the treatment chamber is lower than or equal to $1\times10^{-2}$ Pa, preferably lower than or equal to $1\times10^{-3}$ Pa.

Next, the oxide film 230C1 and the oxide film 230C2 are formed in this order to fill the opening 263 (see FIG. 21). The oxide film 230C1 and the oxide film 230C2 are preferably deposited successively without being exposed to the air after the heat treatment. For example, it is preferable that the heat treatment and the deposition treatment be successively performed in different chambers by using a multi-chamber type deposition apparatus described later, or the like. Performing the treatments in such a manner can remove impurities such as moisture, hydrogen, and carbon adsorbed onto the surfaces or the like of the oxide 230a and the oxide 230b, and can reduce the moisture concentration and hydrogen concentration in the oxide 230a and the oxide 230b. Impurities that are removed by the heat treatment include an impurity having a bond of hydrogen and carbon, an impurity having a bond of hydrogen and oxygen, and the like. Furthermore, it is possible to prevent reentry of impurities such as hydrogen into the oxide 230 by performing the heat treatment and the deposition successively without exposure to the air.

The oxide film 230C1 and the oxide film 230C2 can be deposited by a sputtering method, a CVD method, an MBE method, a PLD method, an ALD method, or the like. The oxide film 230C1 and the oxide film 230C2 are deposited by a method similar to that for the oxide film 230A or the oxide film 230B in accordance with characteristics required for the oxide film 230C1 and the oxide film 230C2. An In—Ga—Zn oxide or an oxide that does not contain In can be used for the oxide film 230C1 and the oxide film 230C2. As the oxide that does not contain In, a Ga—Zn oxide, gallium oxide, or the like can be used. Alternatively, for the oxide film 230C1 and the oxide film 230C2, a stacked-layer structure of an In—Ga—Zn oxide and an oxide that does not contain In may be used. The oxide film 230C1 and the oxide film 230C2 are deposited by a sputtering method using an oxide target with In:Ga:Zn=1:3:4 [atomic ratio], In:Ga:Zn=4:2:4.1 [atomic ratio], Ga:Zn=2:1 [atomic ratio], or Ga:Zn=2:5 [atomic ratio]. In this embodiment, the oxide film 230C1 is deposited by a sputtering method using an oxide target with In:Ga:Zn=4:2:4.1 [atomic ratio], and the oxide film 230C2 is deposited by a sputtering method using an oxide target with In:Ga:Zn=1:3:4 [atomic ratio].

That is, the oxide film 230C1 may be formed using a target similar to that used for forming the oxide film 230B, and the oxide film 230C2 may be formed using a target similar to that used for forming the oxide film 230A.

The oxide film 230C1 and the oxide film 230C2 are preferably deposited while the substrate is heated. At this time, when the substrate temperature is set higher than or equal to 300° C., oxygen vacancies in the oxide 230a, the oxide 230b, the oxide film 230C1, and the oxide film 230C2 can be reduced. Alternatively, for example, the oxide film 230C1 and the oxide film 230C2 may be deposited at the same temperature as the deposition temperature of the insulating film 250A described later. Furthermore, when the oxide film 230C1 and the oxide film 230C2 are deposited while the substrate is heated in this manner, the crystallinity of the oxide 230a, the oxide 230b, the oxide film 230C1, and the oxide film 230C2 can be improved.

In particular, in the deposition of the oxide film 230C1 and the oxide film 230C2, part of oxygen contained in the sputtering gas may be supplied to the oxide 230a and the oxide 230b. Therefore, the proportion of oxygen contained in the sputtering gas for the oxide film 230C1 and the oxide film 230C2 is higher than or equal to 70%, preferably higher than or equal to 80%, further preferably 100%. Furthermore, when the deposition is performed while the substrate is heated, the crystallinity of the oxide films can be improved.

Next, heat treatment is preferably performed before deposition of the insulating film 250A. The heat treatment is performed at a temperature higher than or equal to 100° C. and lower than or equal to 400° C., and is performed at 200° C., for example. Alternatively, the heat treatment is preferably performed at the same temperature as the deposition temperature of the insulating film 250A. Here, the deposition temperature is not limited to the substrate temperature during the deposition, and includes the set temperature of the deposition apparatus. For example, in the case where the insulating film 250A is deposited at 350° C., the heat treatment is preferably performed at 350° C. The heat treatment is preferably performed under reduced pressure, and for example, may be performed in a vacuum atmosphere. A vacuum atmosphere is kept by evacuation with a turbomolecular pump or the like. The pressure in a vacuum atmosphere of the treatment chamber is lower than or equal to $1\times10^{-2}$ Pa, preferably lower than or equal to $1\times10^{-3}$ Pa.

Next, the insulating film 250A is deposited (see FIG. 21). The insulating film 250A can be deposited by a sputtering method, a CVD method, an MBE method, a PLD method, an ALD method, or the like. As the insulating film 250A, silicon oxide, hafnium oxide, gallium oxide, or the like is preferably deposited by an ALD method. For example, a stacked-layer film of silicon oxide and gallium oxide over the silicon oxide can be used as the insulating film 250A. Note that the deposition temperature at the time of depositing the insulating film 250A is preferably higher than or equal to 300° C. and lower than 450° C., further preferably higher than or equal to 350° C. and lower than or equal to 400° C. For example, when the insulating film 250A is deposited at 400° C., a dense film having few impurities can be deposited.

Note that when oxygen is excited by microwaves to generate high-density oxygen plasma and the insulating film 250A is exposed to the oxygen plasma, oxygen can be introduced into the insulating film 250A.

Furthermore, heat treatment may be performed. For the heat treatment, the conditions for the above heat treatment can be used. The heat treatment can reduce the moisture concentration and hydrogen concentration in the insulating film 250A.

Next, the conductive film 260A and the conductive film 260B are deposited. The conductive film 260A and the conductive film 260B can be deposited by a sputtering method, a CVD method, an MBE method, a PLD method, an ALD method, or the like. A CVD method is preferably used, for example. In this embodiment, the conductive film 260A is deposited by an ALD method, and the conductive film 260B is deposited by a CVD method (see FIG. 21).

Then, the oxide film 230C1, the oxide film 230C2, the insulating film 250A, the conductive film 260A, and the conductive film 260B are polished by CMP treatment until the insulator 280 is exposed, whereby the oxide 230c (the oxide 230c1 and the oxide 230c2), the insulator 250, and the conductor 260 (the conductor 260a and the conductor 260b) are formed (see FIG. 22). Accordingly, the oxide 230c is positioned to cover the inner wall (the side wall and bottom surface) of the opening that reaches the oxide 230b. The insulator 250 is positioned to cover the inner wall of the opening with the oxide 230c therebetween. The conductor 260 is positioned to fill the opening with the oxide 230c and the insulator 250 therebetween.

Next, heat treatment may be performed. The heat treatment is performed at a temperature higher than or equal to 100° C. and lower than or equal to 400° C., and is performed at 200° C., for example. Alternatively, the heat treatment is preferably performed at the same temperature as the deposition temperature of the insulator 274. Here, the deposition temperature is not limited to the substrate temperature during the deposition, and includes the set temperature of the deposition apparatus. For example, in the case where the insulator 274 is deposited at 250° C., the heat treatment is preferably performed at 250° C. The heat treatment is preferably performed under reduced pressure, and for example, may be performed in a vacuum atmosphere. A vacuum atmosphere is kept by evacuation with a turbomolecular pump or the like. The pressure in a vacuum atmosphere of the treatment chamber is lower than or equal to $1 \times 10^{-2}$ Pa, preferably lower than or equal to $1 \times 10^{-3}$ Pa. The heat treatment can reduce the moisture concentration and hydrogen concentration in the insulator 280.

Next, the insulator 274 may be formed over the oxide 230c, the insulator 250, the conductor 260, and the insulator 280. The insulator 274 can be deposited by a sputtering method, a CVD method, an MBE method, a PLD method, an ALD method, or the like. An aluminum oxide film is preferably deposited as the insulator 274 by a sputtering method, for example. When an aluminum oxide film is deposited by a sputtering method, diffusion of hydrogen contained in the insulator 281 into the oxide 230 can be inhibited in some cases. Forming the insulator 274 to be in contact with the conductor 260 is preferable, in which case oxidation of the conductor 260 can be inhibited. Moreover, the formation of the insulator 274 enables oxygen to be supplied to the insulator 280. Oxygen supplied to the insulator 280 is sometimes supplied to the region 234 included in the oxide 230b through the oxide 230c1. Furthermore, when oxygen is supplied to the insulator 280, oxygen contained in the insulator 280 before the formation of the insulator 274 may be supplied to the region 234 included in the oxide 230b through the oxide 230c1.

Next, heat treatment may be performed. For the heat treatment, the conditions for the above heat treatment can be used. The heat treatment can reduce the moisture concentration and hydrogen concentration in the insulator 280. Moreover, oxygen contained in the insulator 274 can be injected into the insulator 280.

Note that as a method for forming the insulator 274 over the insulator 280, the following may be performed: first, an insulating film made of the same material as the insulator 274 is formed by the same formation method as that for the insulator 274; next, heat treatment is performed using the above heat treatment conditions; then, the insulating film is removed by CMP treatment; next, the insulator 274 is formed; and then, heat treatment is performed using the above heat treatment conditions. By this method, a larger number of excess-oxygen regions can be formed in the insulator 280. Note that in the step of removing the insulating film, part of the insulator 280, part of the conductor 260, part of the insulator 250, and part of the oxide 230c are removed in some cases.

An insulator may be provided between the insulator 280 and the insulator 274. As the insulator, silicon oxide deposited by a sputtering method can be used, for example. Providing the insulator can form an excess-oxygen region in the insulator 280.

Next, an insulating film to be the insulator 281 may be deposited over the insulator 274. The insulating film to be the insulator 281 can be deposited by a sputtering method, a CVD method, an MBE method, a PLD method, an ALD method, or the like (see FIG. 22).

Then, openings that reach the region 243a and the region 243b are formed in the insulator 254, the insulator 280, the insulator 274, and the insulator 281. The openings are formed by a lithography method.

Note that in the semiconductor device including the transistor 200B, the steps after the formation of the above openings are similar to those for the semiconductor device including the transistor 200 described in Embodiment 1; therefore, the detailed description of the steps after the formation of the openings is omitted.

According to one embodiment of the present invention, a semiconductor device with a high on-state current can be provided. According to one embodiment of the present invention, a semiconductor device having high frequency characteristics can be provided. According to one embodiment of the present invention, a highly reliable semiconductor device can be provided. According to one embodiment of the present invention, a semiconductor device that can be scaled down or highly integrated can be provided. According to one embodiment of the present invention, a semiconductor device having favorable electrical characteristics can be provided. According to one embodiment of the present invention, a semiconductor device with a low off-state current can be provided. According to one embodiment of the present invention, a semiconductor device with reduced power consumption can be provided. According to one embodiment of the present invention, a semiconductor device with high productivity can be provided.

The structure, method, and the like described above in this embodiment can be used in combination as appropriate with the structures, methods, and the like described in the other embodiments.

Embodiment 3

In this embodiment, one embodiment of a semiconductor device will be described with reference to FIG. 23 to FIG. 26.

[Memory Device 1]

Figure 23:
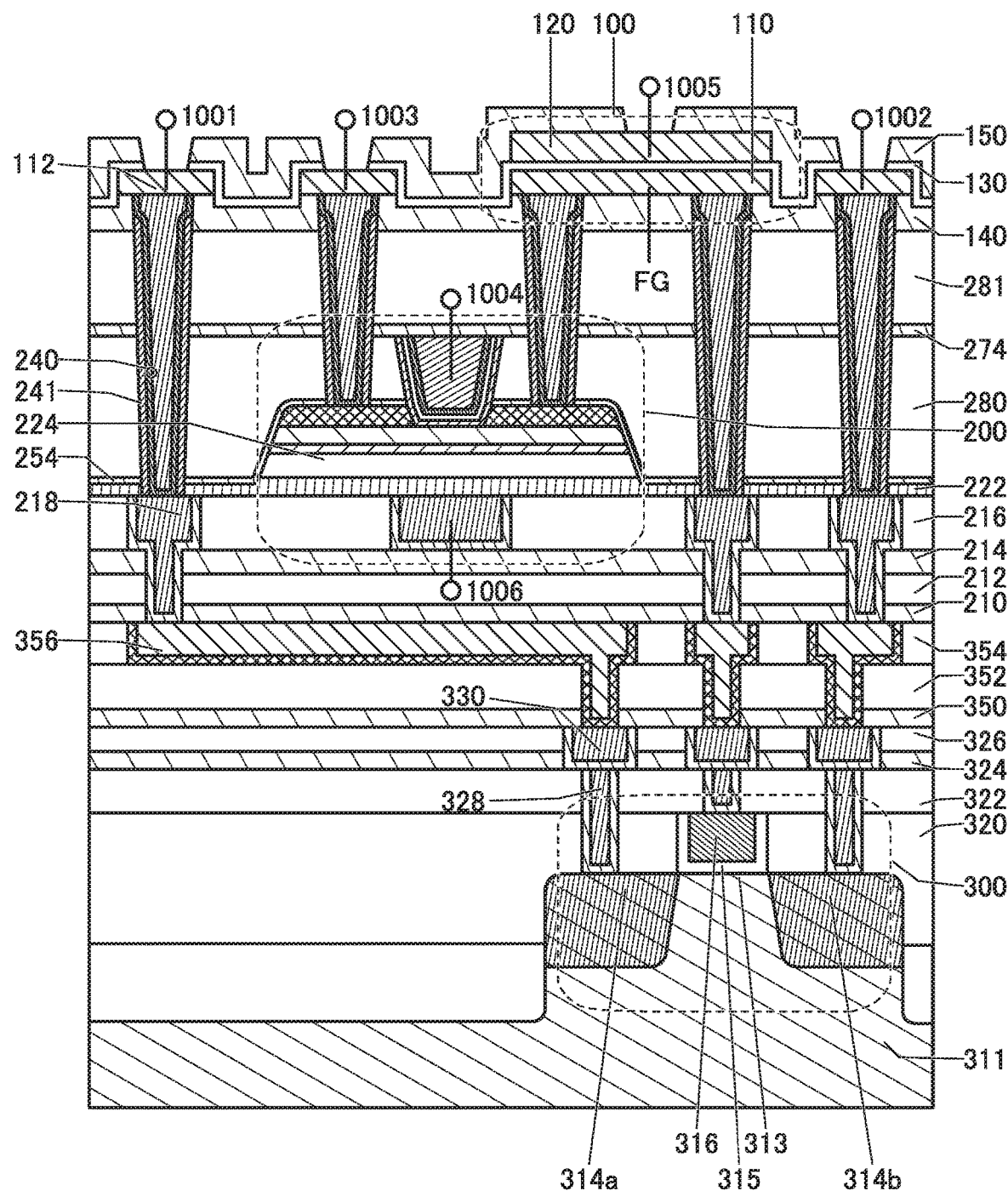
FIG. 23 A cross-sectional view illustrating a structure of a memory device according to one embodiment of the present invention.

FIG. 23 illustrates an example of a semiconductor device (memory device) using the transistor of one embodiment of the present invention. In a semiconductor device of one embodiment of the present invention, the transistor 200 is provided above a transistor 300, and a capacitor 100 is provided above the transistor 300 and the transistor 200. Note that the transistor 200 described in the foregoing embodiment, for example, can be used as the transistor 200.

The transistor 200 is a transistor in which a channel is formed in a semiconductor layer including an oxide semiconductor. The off-state current of the transistor 200 is low; thus, by using the transistor 200 in a memory device, stored data can be retained for a long time. In other words, such a memory device does not require refresh operation or has extremely low frequency of the refresh operation, which leads to a sufficient reduction in power consumption of the memory device.

In the semiconductor device illustrated in FIG. 23, a wiring 1001 is electrically connected to a source of the transistor 300, and a wiring 1002 is electrically connected to a drain of the transistor 300. A wiring 1003 is electrically connected to one of a source and a drain of the transistor 200, a wiring 1004 is electrically connected to a first gate of the transistor 200, and a wiring 1006 is electrically connected to a second gate of the transistor 200. A gate of the transistor 300 and the other of the source and the drain of the transistor 200 are electrically connected to one electrode of the capacitor 100, and a wiring 1005 is electrically connected to the other electrode of the capacitor 100. Note that a node where the gate of the transistor 300, the other of the source and the drain of the transistor 200, and the one electrode of the capacitor 100 are connected to each other is hereinafter referred to as a node FG in some cases.

The semiconductor device illustrated in FIG. 23 enables data writing, retention, and reading by having the capability of retaining the potential of the gate of the transistor 300 (the node FG) by switching of the transistor 200.

Furthermore, by arranging the memory devices illustrated in FIG. 23 in a matrix, a memory cell array can be formed.
<Transistor 300>

The transistor 300 is provided on a substrate 311 and includes a conductor 316 functioning as a gate electrode, an insulator 315 functioning as a gate insulator, a semiconductor region 313 that is part of the substrate 311, and a low-resistance region 314a and a low-resistance region 314b functioning as a source region and a drain region. The transistor 300 is either a p-channel transistor or an n-channel transistor.

Here, in the transistor 300 illustrated in FIG. 23, the semiconductor region 313 (part of the substrate 311) in which a channel is formed has a convex shape. In addition, the conductor 316 is provided to cover a side surface and a top surface of the semiconductor region 313 with the insulator 315 therebetween. Note that a material adjusting a work function may be used for the conductor 316. Such a transistor 300 is also referred to as a FIN-type transistor because it utilizes a convex portion of a semiconductor substrate. Note that an insulator functioning as a mask for forming the convex portion may be included in contact with an upper portion of the convex portion. Furthermore, although the case where the convex portion is formed by processing part of the semiconductor substrate is described here, a semiconductor film having a convex shape may be formed by processing an SOI substrate.

Note that the transistor 300 illustrated in FIG. 23 is only an example and the structure is not limited thereto; a transistor appropriate for a circuit configuration or a driving method is used.
<Capacitor 100>

The capacitor 100 is provided above the transistor 200. The capacitor 100 includes a conductor 110 functioning as a first electrode, a conductor 120 functioning as a second electrode, and an insulator 130 functioning as a dielectric.

For example, a conductor 112 and the conductor 110 over the conductor 240 can be formed at the same time. Note that the conductor 112 has a function of a plug or a wiring that is electrically connected to the capacitor 100, the transistor 200, or the transistor 300.

Although the conductor 112 and the conductor 110 each having a single-layer structure are illustrated in FIG. 23, the structure is not limited thereto, and a stacked-layer structure of two or more layers may be employed. For example, between a conductor having a barrier property and a conductor having high conductivity, a conductor that is highly adhesive to the conductor having a barrier property and the conductor having high conductivity may be formed.

The insulator 130 can be provided to have stacked layers or a single layer using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like.

For example, it is preferable to use a stacked-layer structure of a material with high dielectric strength, such as silicon oxynitride, and a high-permittivity (high-k) material for the insulator 130. In the capacitor 100 having such a structure, sufficient capacitance can be secured because a high-permittivity (high-k) insulator is included, and dielectric strength can be improved because an insulator with high dielectric strength is included; hence, the electrostatic breakdown of the capacitor 100 can be inhibited.

Note that insulators that are high-permittivity (high-k) materials (materials with a high dielectric constant) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, a nitride containing silicon and hafnium, and the like.

Materials with high dielectric strength (materials with a low dielectric constant) include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, and the like.
<Wiring Layer>

Wiring layers provided with an interlayer film, a wiring, a plug, and the like may be provided between the components. In addition, a plurality of wiring layers can be provided in accordance with design. Here, a plurality of conductors having functions of plugs or wirings are collectively denoted by the same reference numeral in some cases. Furthermore, in this specification and the like, a wiring and a plug electrically connected to the wiring may be a single component. That is, there are a case where part of a conductor functions as a wiring and a case where part of a conductor functions as a plug.

For example, an insulator 320, an insulator 322, an insulator 324, and an insulator 326 are stacked in this order as interlayer films over the substrate 311. Note that the insulator 315 and the conductor 316 are provided to be embedded in the insulator 320. In addition, a conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 function as a plug or a wiring.

The insulators functioning as interlayer films may also function as planarization films that cover uneven shapes therebelow. For example, a top surface of the insulator 322 may be planarized by planarization treatment using a chemical mechanical polishing (CMP) method or the like to improve planarity.

A wiring layer may be provided over the insulator 326 and the conductor 330. For example, in FIG. 23, an insulator 350, an insulator 352, and an insulator 354 are stacked in this order. Furthermore, a conductor 356 is formed in the insulator 350, the insulator 352, and the insulator 354. The conductor 356 functions as a plug or a wiring.

An insulator 210, an insulator 212, the insulator 214, and the insulator 216 are stacked in this order over the insulator 354 and the conductor 356. A conductor 218, a conductor (the conductor 205) included in the transistor 200, and the like are embedded in the insulator 210, the insulator 212, the insulator 214, and the insulator 216. Note that the conductor 218 has a function of a plug or a wiring that is electrically connected to the capacitor 100 or the transistor 300. In addition, an insulator 150 is provided over the conductor 120 and the insulator 130.

Examples of an insulator that can be used as an interlayer film include an insulating oxide, an insulating nitride, an insulating oxynitride, an insulating nitride oxide, an insulating metal oxide, an insulating metal oxynitride, and an insulating metal nitride oxide.

For example, when a material having a low dielectric constant is used for the insulator functioning as an interlayer film, parasitic capacitance generated between wirings can be reduced. Thus, a material is preferably selected depending on the function of an insulator.

For example, the insulator 212, the insulator 352, the insulator 354, and the like each preferably include an insulator having a low dielectric constant. For example, the insulators preferably include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulators preferably have a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low dielectric constant. Examples of the resin include polyester, polyolefin, polyamide (e.g., nylon and aramid), polyimide, polycarbonate, and acrylic.

It is preferable that one or both of the insulator 130 and the insulator 150 provided over the conductor 112 or the conductor 120 be an insulator having a resistivity higher than or equal to $1.0 \times 10^{12}$ Ωcm and lower than or equal to $1.0 \times 10^{15}$ Ωcm, preferably higher than or equal to $5.0 \times 10^{12}$ Ωcm and lower than or equal to $1.0 \times 10^{14}$ Ωcm, further preferably higher than or equal to $1.0 \times 10^{13}$ Ωcm and lower than or equal to $5.0 \times 10^{13}$ Ωcm. One or both of the insulator 130 and the insulator 150 are preferably an insulator having resistivity in the above range because the insulator or the insulators can disperse electric charge accumulated between the transistor 200, the transistor 300, the capacitor 100, and wirings such as the conductor 112 and the conductor 120 and can inhibit poor characteristics and electrostatic breakdown of the transistor and a memory device including the transistor due to the electric charge, while maintaining the insulating property. For such an insulator, silicon nitride or silicon nitride oxide can be used.

In addition, as the insulator having resistivity in the above range, the insulator 140 may be provided below the conductor 112. In that case, the insulator 140 is formed over the insulator 281; an opening portion is formed in the insulator 140, the insulator 281, the insulator 274, the insulator 280, the insulator 254, and the like; and the insulator 241 is formed or the conductor 240 that is electrically connected to the transistor 200, the conductor 218, and the like is formed in the opening portion. For the insulator 140, a material similar to that of the insulator 130 or the insulator 150 can be used.

When a transistor using an oxide semiconductor is surrounded by an insulator having a function of inhibiting transmission of oxygen and impurities such as hydrogen, the electrical characteristics of the transistor can be stable. Therefore, an insulator having a function of inhibiting transmission of oxygen and impurities such as hydrogen is used as the insulator 210, the insulator 350, and the like.

For the insulator having a function of inhibiting transmission of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum are used. Specifically, for the insulator having a function of inhibiting transmission of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon oxide nitride; silicon nitride; or the like can be used.

For the conductor that can be used as a wiring or a plug, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. A semiconductor having high electrical conductivity, typified by polycrystalline silicon containing an impurity element such as phosphorus, or silicide such as nickel silicide may be used.

For example, as the conductor 328, the conductor 330, the conductor 356, the conductor 218, the conductor 110, the conductor 112, the conductor 120, and the like, a single layer or a stacked layer of a conductive material such as a metal material, an alloy material, a metal nitride material, a metal oxide material, and the like that are formed using the above materials can be used. It is particularly preferred to use a high-melting-point material that has both heat resistance and conductivity, such as tungsten or molybdenum; it is particularly preferred to use tungsten. Alternatively, it is preferable to use a low-resistance conductive material such as aluminum or copper. The use of a low-resistance conductive material can reduce wiring resistance.

《Wiring or Plug In Layer Provided with Oxide Semiconductor》

Note that in the case where an oxide semiconductor is used for the transistor 200, an insulator including an excess-oxygen region is provided in the vicinity of the oxide semiconductor in some cases. In that case, an insulator having a barrier property is preferably provided between the insulator including the excess-oxygen region and a conductor provided in the insulator including the excess-oxygen region.

For example, in FIG. 23, the insulator 241 is preferably provided between the insulators 280 and 281 and the conductor 240. When the insulator 241 is placed between the insulators 280 and 281 and the conductor 240, it is possible to inhibit absorption of oxygen contained in the insulator 280 and the insulator 281 by the conductor 240, that is, oxidation of the conductor 240.

That is, when the insulator 241 is provided, absorption of excess oxygen contained in the insulator 280 by the conductor 240 can be inhibited. In addition, when the insulator 241 is included, diffusion of hydrogen, which is an impurity, into the transistor 200 through the conductor 240 can be inhibited.

Note that an insulating material having a function of inhibiting diffusion of oxygen and impurities such as water and hydrogen is preferably used for the insulator 241. For example, aluminum oxide, hafnium oxide, or the like is preferably used. Alternatively, for example, a metal oxide such as magnesium oxide, gallium oxide, germanium oxide, yttrium oxide, zirconium oxide, lanthanum oxide, neodymium oxide, or tantalum oxide, silicon nitride oxide, silicon nitride, or the like can be used.

The above is the description of the structure example. With the use of this structure, changes in electrical characteristics can be inhibited and reliability can be improved in a semiconductor device using a transistor including an oxide semiconductor. A transistor that includes an oxide semiconductor and has a high on-state current can be provided. A transistor that includes an oxide semiconductor and has a low off-state current can be provided. A semiconductor device with low power consumption can be provided.

[Memory Device 2]

Figure 24:
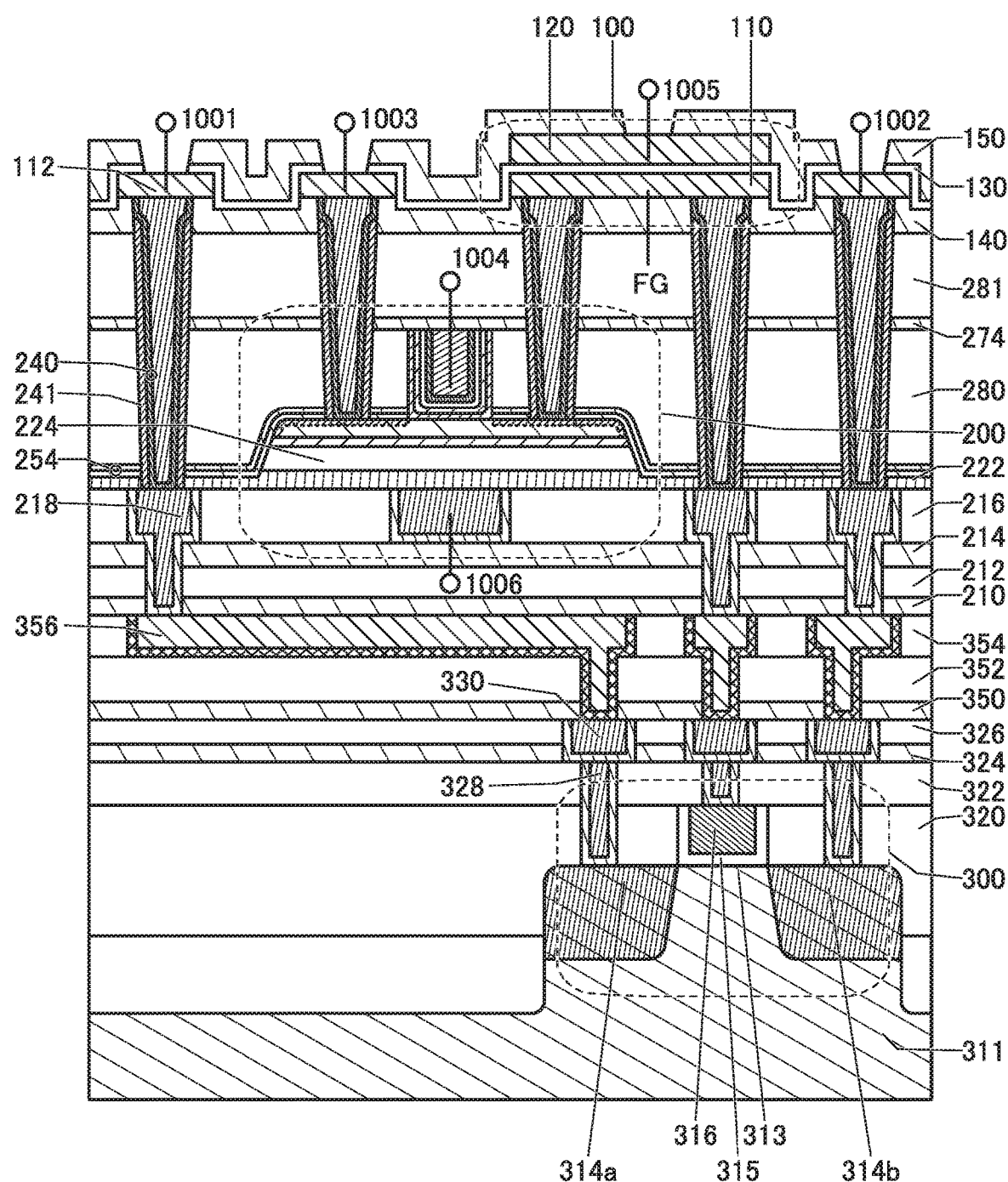
FIG. 24 A cross-sectional view illustrating a structure of a memory device according to one embodiment of the present invention.

FIG. 24 illustrates an example of a semiconductor device (memory device) using the transistor of one embodiment of the present invention. In a semiconductor device of one embodiment of the present invention, the transistor 200 is provided above the transistor 300, and the capacitor 100 is provided above the transistor 300 and the transistor 200. Note that the transistor 200B described in the foregoing embodiment, for example, can be used as the transistor 200.

Note that in the semiconductor device (memory device) described in [Memory device 2], components having the same functions as the components included in the semiconductor device (memory device) described in [Memory device 1] are denoted by the same reference numerals. In addition, the foregoing description can be referred to for the details of components, materials, and the like of the semiconductor device (memory device) in [Memory device 2] that are common to those of the semiconductor device (memory device) in [Memory device 1] and for the details of the components, materials, and the like denoted by the same reference numerals.

[Memory Device 3]

Figure 25:
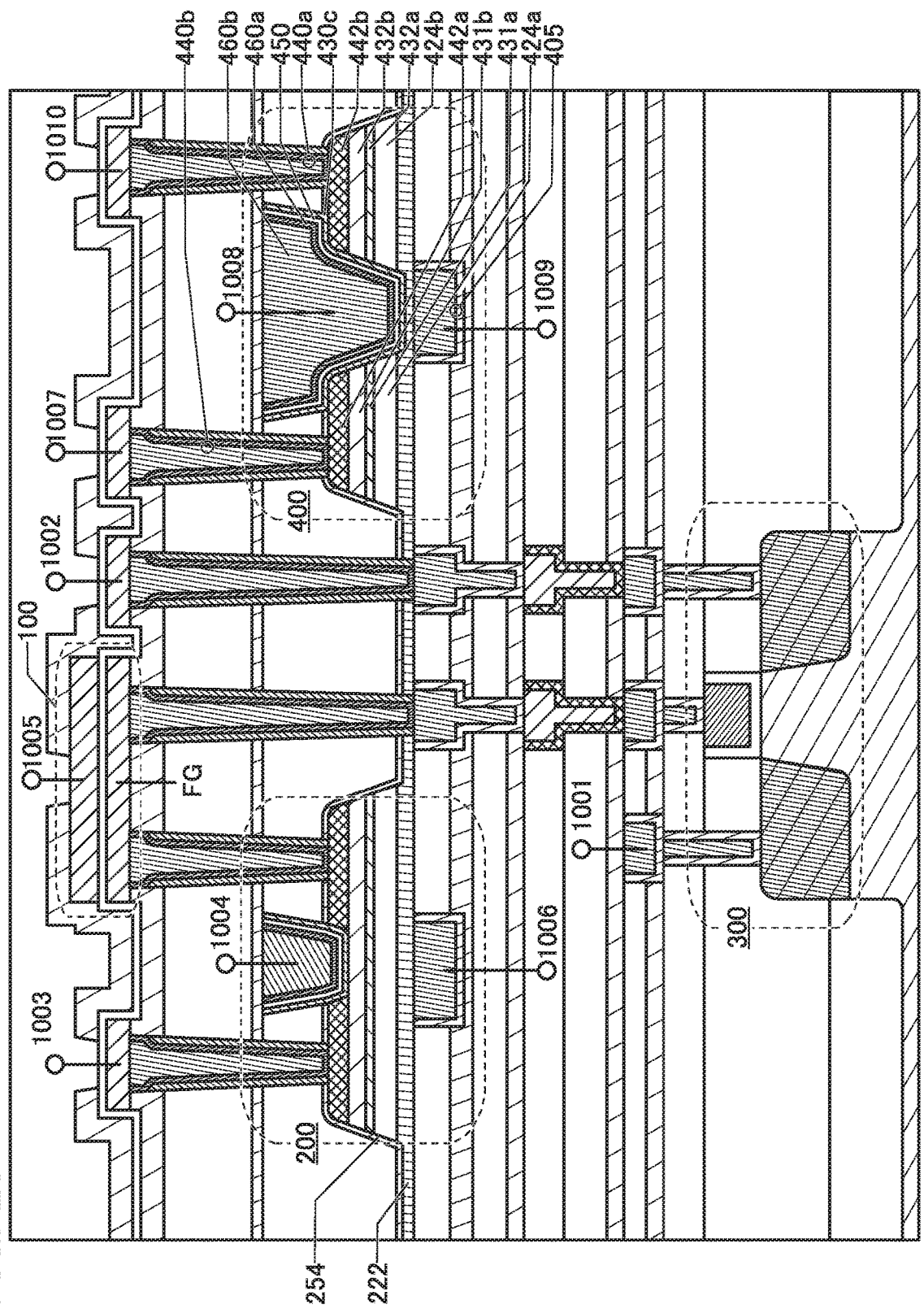
FIG. 25 A cross-sectional view illustrating a structure of a memory device according to one embodiment of the present invention.

FIG. 25 illustrates an example of a memory device using the semiconductor device of one embodiment of the present invention. The memory device illustrated in FIG. 25 includes a transistor 400 in addition to the semiconductor device including the transistor 200, the transistor 300, and the capacitor 100 illustrated in FIG. 23.

The transistor 400 can control a second gate voltage of the transistor 200. For example, a structure is employed in which a first gate and a second gate of the transistor 400 are diode-connected to a source of the transistor 400, and the source of the transistor 400 is connected to the second gate of the transistor 200. When a negative potential of the second gate of the transistor 200 is retained in this structure, a voltage between the first gate and the source and a voltage between the second gate and the source of the transistor 400 become 0 V. In the transistor 400, a drain current at the time when a second gate voltage and a first gate voltage are 0 V is extremely low; thus, the negative potential of the second gate of the transistor 200 can be maintained for a long time even without power supply to the transistor 200 and the transistor 400. Accordingly, the memory device including the transistor 200 and the transistor 400 can retain stored data for a long time.

Hence, in FIG. 25, the wiring 1001 is electrically connected to the source of the transistor 300, and the wiring 1002 is electrically connected to the drain of the transistor 300. In addition, the wiring 1003 is electrically connected to one of the source and the drain of the transistor 200, the wiring 1004 is electrically connected to the gate of the transistor 200, and the wiring 1006 is electrically connected to the second gate of the transistor 200. The gate of the transistor 300 and the other of the source and the drain of the transistor 200 are electrically connected to one electrode of the capacitor 100, and the wiring 1005 is electrically connected to the other electrode of the capacitor 100. A wiring 1007 is electrically connected to the source of the transistor 400, a wiring 1008 is electrically connected to the gate of the transistor 400, a wiring 1009 is electrically connected to the second gate of the transistor 400, and a wiring 1010 is electrically connected to a drain of the transistor 400. Here, the wiring 1006, the wiring 1007, the wiring 1008, and the wiring 1009 are electrically connected to each other.

When the memory devices illustrated in FIG. 25 are arranged in a matrix like the memory devices illustrated in FIG. 23, a memory cell array can be formed. Note that one transistor 400 can control the second gate voltages of a plurality of transistors 200. For this reason, the number of transistors 400 is preferably smaller than the number of transistors 200.

<Transistor 400>

The transistor 400 and the transistor 200 are formed in the same layer and thus can be fabricated in parallel. The transistor 400 includes a conductor 460 (a conductor 460a and a conductor 460b) functioning as a first gate electrode; a conductor 405 (a conductor 405a and a conductor 405b) functioning as a second gate electrode; the insulator 222, an insulator 424a, an insulator 424b, and an insulator 450 each functioning as a gate insulator; an oxide 430c including a region where a channel is formed; a conductor 442a, an oxide 431a, and an oxide 431b functioning as one of a source and a drain; a conductor 442b, an oxide 432a, and an oxide 432b functioning as the other of the source and the drain; and a conductor 440 (a conductor 440a and a conductor 440b).

In the transistor 400, the conductor 405 is formed in the same layer as the conductor 205. The insulator 424a and the insulator 424b are formed in the same layer as the insulator 224. The oxide 431a and the oxide 432a are formed in the same layer as the oxide 230a, and the oxide 431b and the oxide 432b are formed in the same layer as the oxide 230b. The conductor 442 is formed in the same layer as the conductor 242. The oxide 430c is formed in the same layer as the oxide 230c. The insulator 450 is formed in the same layer as the insulator 250. The conductor 460 is formed in the same layer as the conductor 260.

Note that the components formed in the same layer can be formed at the same time. For example, the oxide 430c can be formed by processing an oxide film to be the oxide 230c.

In the oxide 430c functioning as an active layer of the transistor 400, oxygen vacancies and impurities such as water and hydrogen are reduced, as in the oxide 230 and the like. Accordingly, the threshold voltage of the transistor 400 can be further increased, the off-state current can be reduced, and the drain current at the time when the second gate voltage and the first gate voltage are 0 V can be extremely low.

«Dicing Line»

A dicing line (also referred to as a scribe line, a dividing line, or a cutting line in some cases) that is provided when a large-sized substrate is divided into semiconductor elements so that a plurality of semiconductor devices are obtained in a chip form will be described below. Examples of a dividing method include the case where a groove (a dicing line) for dividing the semiconductor elements is formed on the substrate, and then the substrate is cut along the dicing line to divide (split) it into a plurality of semiconductor devices.

At the periphery of the transistor 200 described in the foregoing embodiment and the transistor 400 described in this embodiment, the insulator 254 and the insulator 222 are in contact with each other as illustrated in FIG. 25. For this reason, when design is made such that the region where the insulator 254 and the insulator 222 are in contact with each other serves as the dicing line, the design flexibility of the dicing line can be high. At this time, the insulator 222 and the insulator 254 may be formed using the same material and the same method. When the insulator 222 and the insulator 254 are formed using the same material and the same method, the adhesion can be increased. For example, an aluminum oxide is preferably used.

With this structure, the insulator 224, the transistor 200, and the transistor 400 can be enclosed with the insulator 222 and the insulator 254. Since the insulator 222 and the insulator 254 have a function of inhibiting diffusion of oxygen, hydrogen, and water, even when the substrate is divided into circuit regions including the semiconductor elements of this embodiment to be processed into a plurality of chips, impurities such as water and hydrogen can be prevented from entering from the direction of a side surface of the divided substrate and diffusing into the transistor 200 and the transistor 400.

Furthermore, with this structure, excess oxygen in the insulator 224 can be prevented from diffusing to the outside of the insulator 254 and the insulator 222. Accordingly, excess oxygen in the insulator 224 is efficiently supplied to the oxide where the channel of the transistor 200 or the transistor 400 is formed. The oxygen can reduce oxygen vacancies in the oxide where the channel of the transistor 200 or the transistor 400 is formed. Thus, the oxide where the channel of the transistor 200 or the transistor 400 is formed can be an oxide semiconductor having a low density of defect states and stable characteristics. That is, variations in electrical characteristics of the transistor 200 or the transistor 400 can be reduced and the reliability can be improved.

[Memory Device 4]

Figure 26:
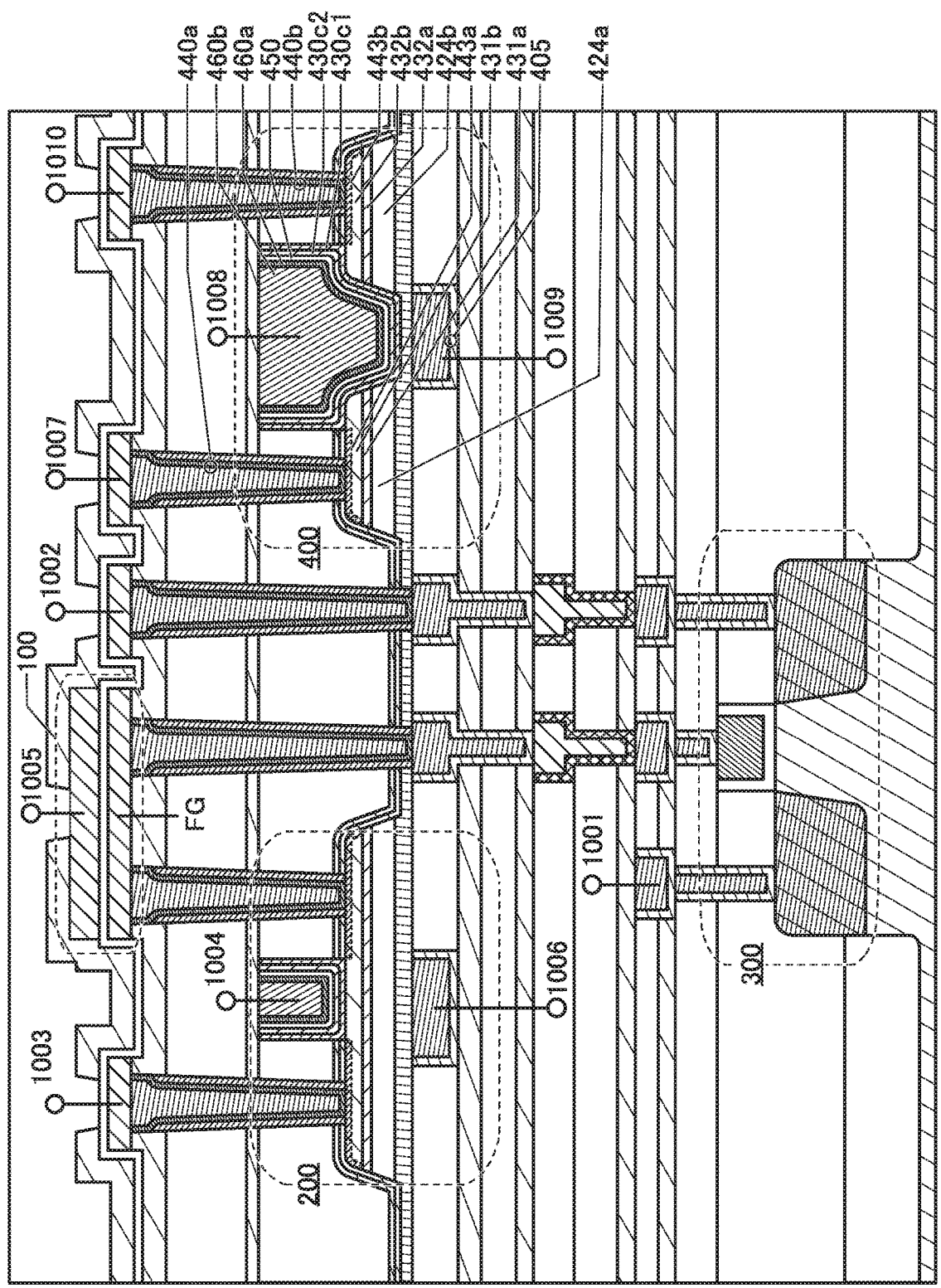
FIG. 26 A cross-sectional view illustrating a structure of a memory device according to one embodiment of the present invention.

FIG. 26 illustrates an example of a memory device using the semiconductor device of one embodiment of the present invention. The memory device illustrated in FIG. 26 includes the transistor 400 in addition to the semiconductor device including the transistor 200, the transistor 300, and the capacitor 100 illustrated in FIG. 24.

Note that in the memory device described in [Memory device 4], components having the same functions as the components included in the memory device described in [Memory device 3] are denoted by the same reference numerals. In addition, the foregoing description can be referred to for the details of components, materials, and the like of the memory device in [Memory device 4] that are common to those of the memory device in [Memory device 3] and for the details of the components, materials, and the like denoted by the same reference numerals.

<Transistor 400>

The transistor 400 and the transistor 200 are formed in the same layer and thus can be fabricated in parallel. The transistor 400 includes the conductor 460 (the conductor 460a and the conductor 460b) functioning as a first gate electrode; the conductor 405 (the conductor 405a and the conductor 405b) functioning as a second gate electrode; the insulator 222, the insulator 424a, the insulator 424b, and the insulator 450 each functioning as a gate insulator; the oxide 430c (an oxide 430c1 and an oxide 430c2) including a region where a channel is formed; a region 443a, the oxide 431a, and the oxide 431b functioning as one of a source and a drain; a region 443b, the oxide 432a, and the oxide 432b functioning as the other of the source and the drain; and the conductor 440 (the conductor 440a and the conductor 440b).

In the transistor 400, the conductor 405 is formed in the same layer as the conductor 205. The insulator 424a and the insulator 424b are formed in the same layer as the insulator 224. The oxide 431a and the oxide 432a are formed in the same layer as the oxide 230a, and the oxide 431b and the oxide 432b are formed in the same layer as the oxide 230b. The region 443a and the region 443b are formed in the same step as the region 243a and the region 243b. The oxide 430c1 is formed in the same layer as the oxide 230c1, and the oxide 430c2 is formed in the same layer as the oxide 230c2. The insulator 450 is formed in the same layer as the insulator 250. The conductor 460 is formed in the same layer as the conductor 260.

This embodiment can be implemented in an appropriate combination with the structures described in the other embodiments and the like.

Embodiment 4

In this embodiment, a memory device of one embodiment of the present invention including a transistor in which an oxide is used for a semiconductor (hereinafter referred to as an OS transistor in some cases) and a capacitor (hereinafter such a memory device is also referred to as an OS memory device in some cases) will be described with reference to FIG. 27 and FIG. 28. The OS memory device is a memory device including at least a capacitor and an OS transistor that controls charge and discharge of the capacitor. Since the off-state current of the OS transistor is extremely low, the OS memory device has excellent retention characteristics and can function as a nonvolatile memory.

<Structure Example of Memory Device>

Figure 27A:
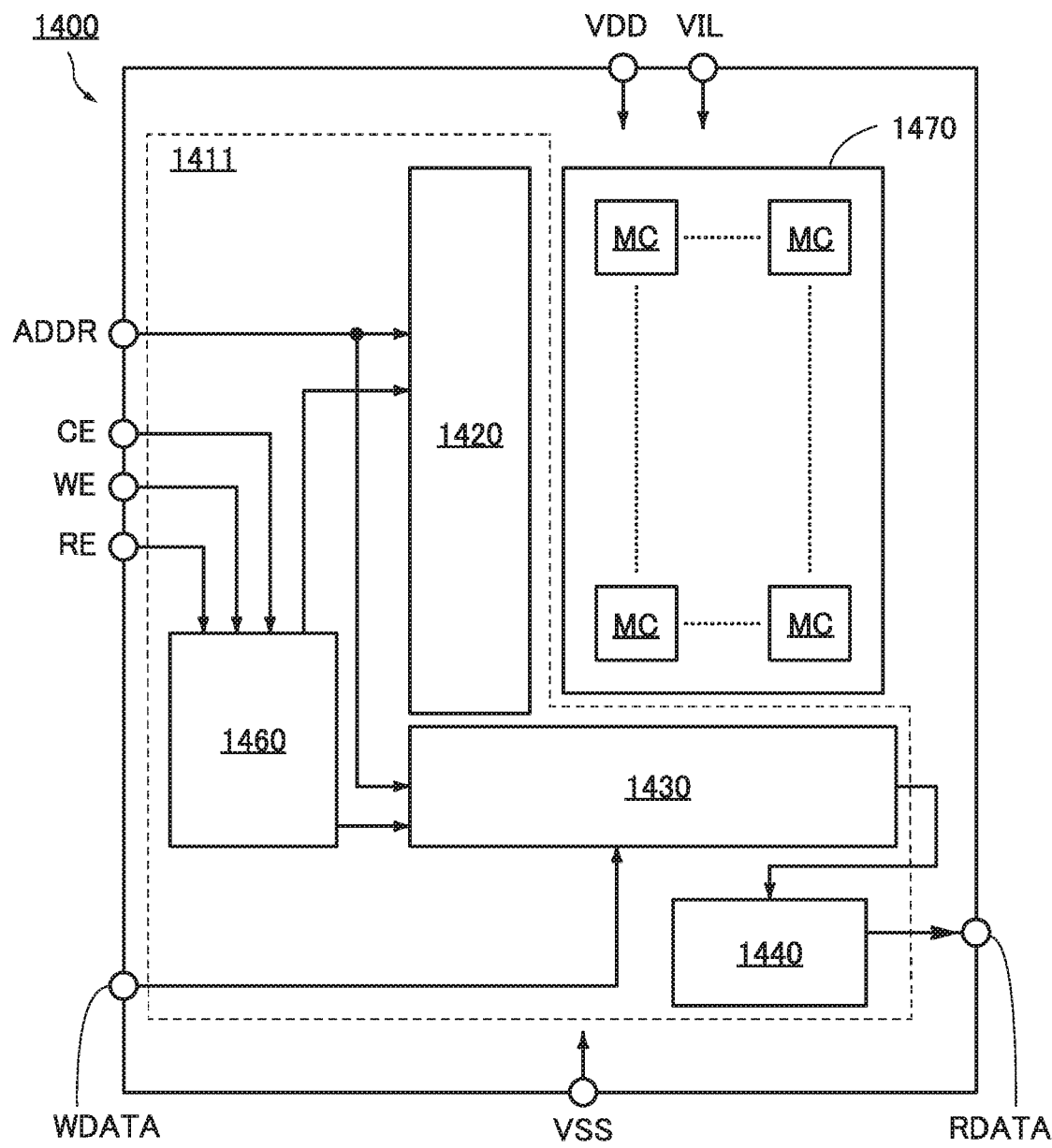
FIGS. 27A-27B Block diagrams illustrating structure examples of a memory device according to one embodiment of the present invention.

FIG. 27(A) illustrates a structure example of the OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes a column decoder, a precharge circuit, a sense amplifier, and a write circuit, for example. The precharge circuit has a function of precharging wirings. The sense amplifier has a function of amplifying a data signal read from a memory cell. Note that the wirings are wirings connected to memory cells included in the memory cell array 1470, which will be described in detail later. An amplified data signal is output to the outside of the memory device 1400 as a data signal RDATA through the output circuit 1440. The row circuit 1420 includes a row decoder and a word line driver circuit, for example, and can select a row to be accessed.

As power supply voltages, a low power supply voltage (VSS), a high power supply voltage (VDD) for the peripheral circuit 1411, and a high power supply voltage (VIL) for the memory cell array 1470 are supplied to the memory device 1400 from the outside. In addition, control signals (CE, WE, and RE), an address signal ADDR, and a data signal WDATA are input to the memory device 1400 from the outside. The address signal ADDR is input to the row decoder and the column decoder, and the data signal WDATA is input to the write circuit.

The control logic circuit 1460 processes the control signals (CE, WE, and RE) from the outside, and generates control signals for the row decoder and the column decoder. The control signal CE is a chip enable signal, the control signal WE is a write enable signal, and the control signal RE is a read-out enable signal. Signals processed by the control logic circuit 1460 are not limited thereto, and other control signals are input as necessary.

The memory cell array 1470 includes a plurality of memory cells MC and a plurality of wirings arranged in a matrix. Note that the number of wirings that connect the memory cell array 1470 and the row circuit 1420 depends on the structure of the memory cell MC, the number of memory cells MC included in one column, and the like. Furthermore, the number of wirings that connect the memory cell array 1470 and the column circuit 1430 depends on the structure of the memory cell MC, the number of memory cells MC included in one row, and the like.

Figure 27B:
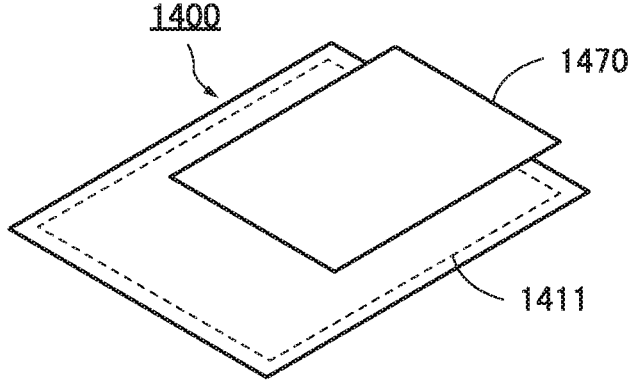

Note that FIG. 27(A) illustrates an example in which the peripheral circuit 1411 and the memory cell array 1470 are formed on the same plane; however, this embodiment is not limited thereto. For example, as illustrated in FIG. 27(B), the memory cell array 1470 may be provided over the peripheral circuit 1411 to partly overlap with the peripheral circuit 1411. For example, a structure may be employed in which the sense amplifier is provided below the memory cell array 1470 to overlap with the memory cell array 1470.

FIG. 28 illustrate structure examples of memory cells applicable to the memory cell MC.

[DOSRAM]

Figure 28A:
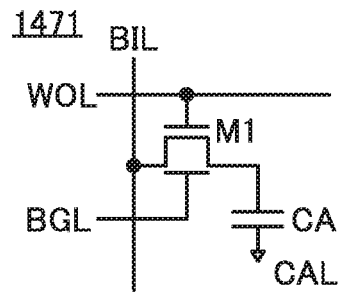
FIGS. 28A-28H Circuit diagrams each illustrating a structure example of a memory device according to one embodiment of the present invention.
Figure 28B:
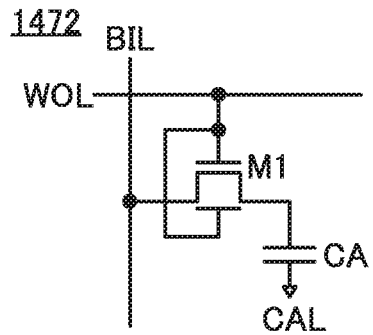
Figure 28C:
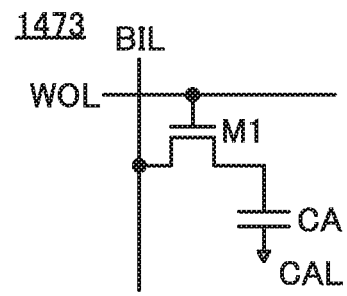
Figure 28D:
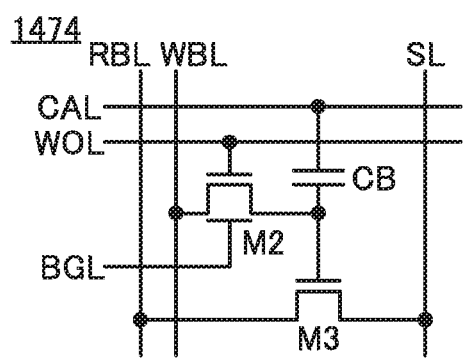
Figure 28E:
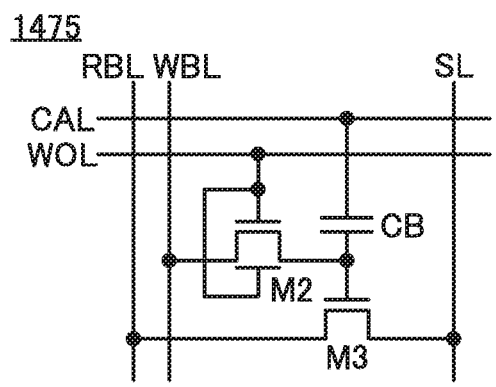
Figure 28F:
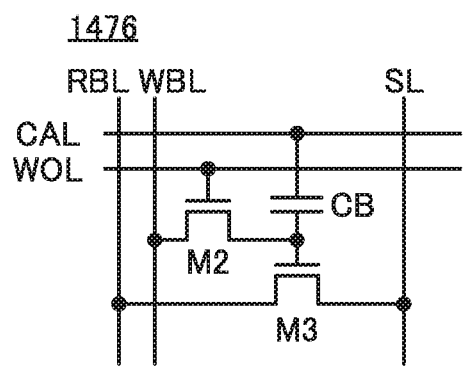
Figure 28G:
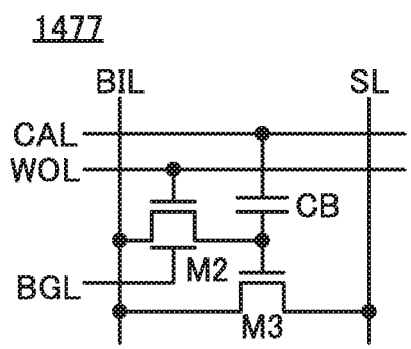

FIGS. 28(A) to 28(C) illustrate circuit structure examples of a memory cell of a DRAM. In this specification and the like, a DRAM using a memory cell including one OS transistor and one capacitor is sometimes referred to as a DOSRAM. A memory cell 1471 illustrated in FIG. 28(A) includes a transistor M1 and a capacitor CA. Note that the transistor M1 includes a gate (sometimes referred to as a top gate) and a back gate.

A first terminal of the transistor M1 is connected to a first terminal of the capacitor CA. A second terminal of the transistor M1 is connected to a wiring BIL. The gate of the transistor M1 is connected to a wiring WOL. The back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. In data writing and reading, a low-level potential is preferably applied to the wiring CAL. The wiring BGL functions as a wiring for applying a potential to the back gate of the transistor M1. By applying a given potential to the wiring BGL, the threshold voltage of the transistor M1 can be increased or decreased.

The memory cell MC is not limited to the memory cell 1471, and its circuit configuration can be changed. For example, in the memory cell MC, the back gate of the transistor M1 may be connected to the wiring WOL instead of the wiring BGL as in a memory cell 1472 illustrated in FIG. 28(B). As another example, the memory cell MC may be configured with a single-gate transistor, that is, the transistor M1 that does not have a back gate, like a memory cell 1473 illustrated in FIG. 28(C).

In the case where the semiconductor device described in the above embodiment is used in the memory cell 1471 and the like, the transistor 200 can be used as the transistor M1, and the capacitor 100 can be used as the capacitor CA. When an OS transistor is used as the transistor M1, the leakage current of the transistor M1 can be extremely low. That is, written data can be retained for a long time by the transistor M1; thus, the frequency of refresh of the memory cell can be reduced. Alternatively, the refresh operation of the memory cell can be omitted. In addition, the extremely low leakage current allows multi-level data or analog data to be retained in the memory cell 1471, the memory cell 1472, and the memory cell 1473.

In the DOSRAM, providing a sense amplifier below the memory cell array 1470 so that they overlap with each other as described above can shorten the bit line. This reduces the bit line capacity, which reduces the storage capacity of the memory cell.

[NOSRAM]

FIGS. 28(D) to 28(G) each illustrate a circuit structure example of a gain-cell memory cell including two transistors and one capacitor. A memory cell 1474 illustrated in FIG. 28(D) includes a transistor M2, a transistor M3, and a capacitor CB. Note that the transistor M2 includes a top gate (sometimes simply referred to as a gate) and a back gate. In this specification and the like, a memory device including a gain-cell memory cell using an OS transistor as the transistor M2 is referred to as a NOSRAM (registered trademark) (Nonvolatile Oxide Semiconductor RAM) in some cases.

A first terminal of the transistor M2 is connected to a first terminal of the capacitor CB. A second terminal of the transistor M2 is connected to a wiring WBL. The gate of the transistor M2 is connected to the wiring WOL. The back gate of the transistor M2 is connected to the wiring BGL. A second terminal of the capacitor CB is connected to the wiring CAL. A first terminal of the transistor M3 is connected to a wiring RBL. A second terminal of the transistor M3 is connected to a wiring SL. A gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. In data writing, data retention, and data reading, a low-level potential is preferably applied to the wiring CAL. The wiring BGL functions as a wiring for applying a potential to the back gate of the transistor M2. By applying a given potential to the wiring BGL, the threshold voltage of the transistor M2 can be increased or decreased.

The memory cell MC is not limited to the memory cell 1474, and its circuit configuration can be changed as appropriate. For example, in the memory cell MC, the back gate of the transistor M2 may be connected to the wiring WOL instead of the wiring BGL as in a memory cell 1475 illustrated in FIG. 28(E). As another example, the memory cell MC may be configured with a single-gate transistor, that is, the transistor M2 that does not have a back gate, like a memory cell 1476 illustrated in FIG. 28(F). As another example, the memory cell MC may have a structure in which the wiring WBL and the wiring RBL are combined into one wiring BIL as in a memory cell 1477 illustrated in FIG. 28(G).

In the case where the semiconductor device described in the above embodiment is used in the memory cell 1474 and the like, the transistor 200 can be used as the transistor M2, the transistor 300 can be used as the transistor M3, and the capacitor 100 can be used as the capacitor CB. When an OS transistor is used as the transistor M2, the leakage current of the transistor M2 can be made extremely low. Consequently, written data can be retained for a long time by the transistor M2; thus, the frequency of refresh of the memory cell can be reduced. Alternatively, the refresh operation of the memory cell can be omitted. Furthermore, since the leakage current is extremely low, multi-level data or analog data can be retained in the memory cell 1474. The same applies to the memory cell 1475 to the memory cell 1477.

Note that the transistor M3 may be a transistor containing silicon in a channel formation region (hereinafter such a transistor is referred to as a Si transistor in some cases). The conductivity type of the Si transistor may be an n-channel type or a p-channel type. A Si transistor has higher field-effect mobility than an OS transistor in some cases. Therefore, a Si transistor may be used as the transistor M3 functioning as a read transistor. Furthermore, the use of a Si transistor as the transistor M3 enables the transistor M2 to be stacked over the transistor M3, in which case the area occupied by the memory cell can be reduced and high integration of the memory device can be achieved.

Alternatively, the transistor M3 may be an OS transistor. When OS transistors are used as the transistor M2 and the transistor M3, the circuit of the memory cell array 1470 can be configured using only n-channel transistors.

Figure 28H:
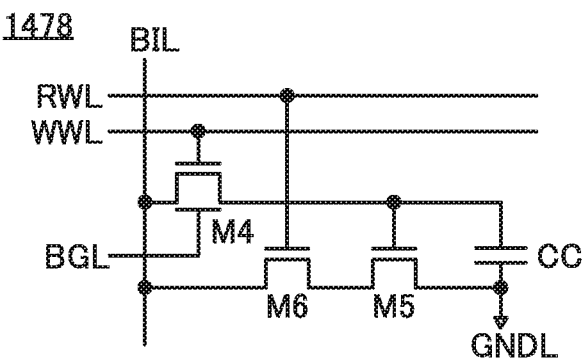

FIG. 28(H) illustrates an example of a gain-cell memory cell including three transistors and one capacitor. A memory cell 1478 illustrated in FIG. 28(H) includes a transistor M4 to a transistor M6 and a capacitor CC. The capacitor CC is provided as necessary. The memory cell 1478 is electrically connected to the wiring BIL, a wiring RWL, a wiring WWL, the wiring BGL, and a wiring GNDL. The wiring GNDL is a wiring for supplying a low-level potential. Note that the memory cell 1478 may be electrically connected to the wiring RBL and the wiring WBL instead of the wiring BIL.

The transistor M4 is an OS transistor including a back gate, and the back gate is electrically connected to the wiring BGL. Note that the back gate and a gate of the transistor M4 may be electrically connected to each other. Alternatively, the transistor M4 does not necessarily include the back gate.

Note that each of the transistors M5 and M6 may be an n-channel Si transistor or a p-channel Si transistor. Alternatively, the transistor M4 to the transistor M6 may be OS transistors. In that case, the circuit of the memory cell array 1470 can be configured using only n-channel transistors.

In the case where the semiconductor device described in the above embodiment is used in the memory cell 1478, the transistor 200 can be used as the transistor M4, the transistors 300 can be used as the transistor M5 and the transistor M6, and the capacitor 100 can be used as the capacitor CC. When an OS transistor is used as the transistor M4, the leakage current of the transistor M4 can be extremely low.

Note that the structures of the peripheral circuit 1411, the memory cell array 1470, and the like described in this embodiment are not limited to those described above. The arrangements and functions of these circuits and the wirings, circuit components, and the like connected to these circuits can be changed, removed, or added as needed.

The structure described in this embodiment can be used in an appropriate combination with the structures described in the other embodiments and the like.

Embodiment 5

In this embodiment, an example of a chip 1200 on which the semiconductor device of the present invention is mounted will be described with reference to FIG. 29. A plurality of circuits (systems) are mounted on the chip 1200. The technique for integrating a plurality of circuits (systems) on one chip is referred to as system on chip (SoC) in some cases.

Figure 29A:
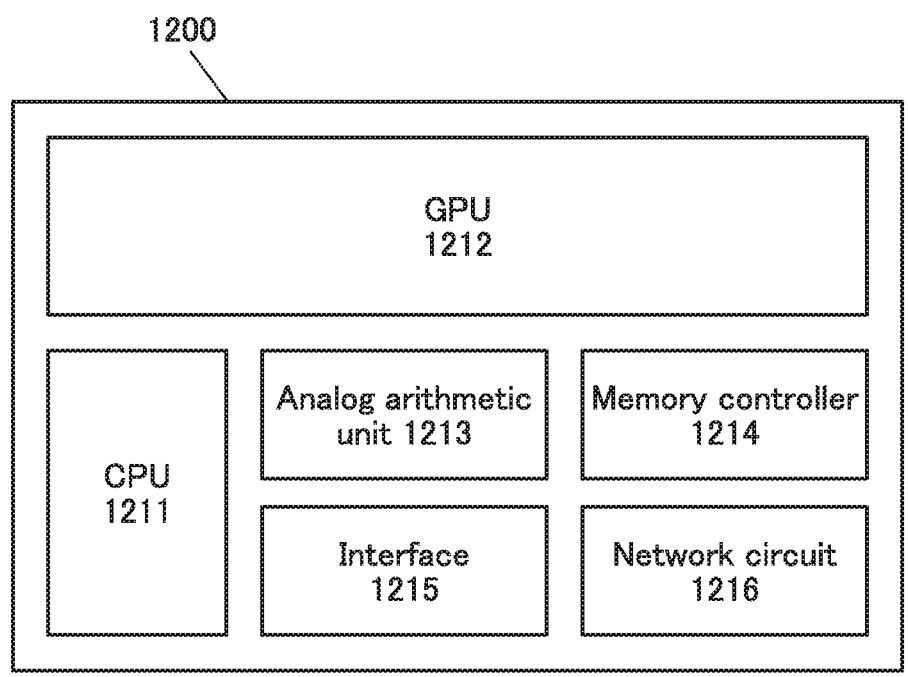
FIGS. 29A-29B Schematic views of a semiconductor device according to one embodiment of the present invention.

As illustrated in FIG. 29(A), the chip 1200 includes a CPU (Central Processing Unit) 1211, a GPU (Graphics Processing Unit) 1212, one or a plurality of analog arithmetic units 1213, one or a plurality of memory controllers 1214, one or a plurality of interfaces 1215, one or a plurality of network circuits 1216, and the like.

Figure 29B:
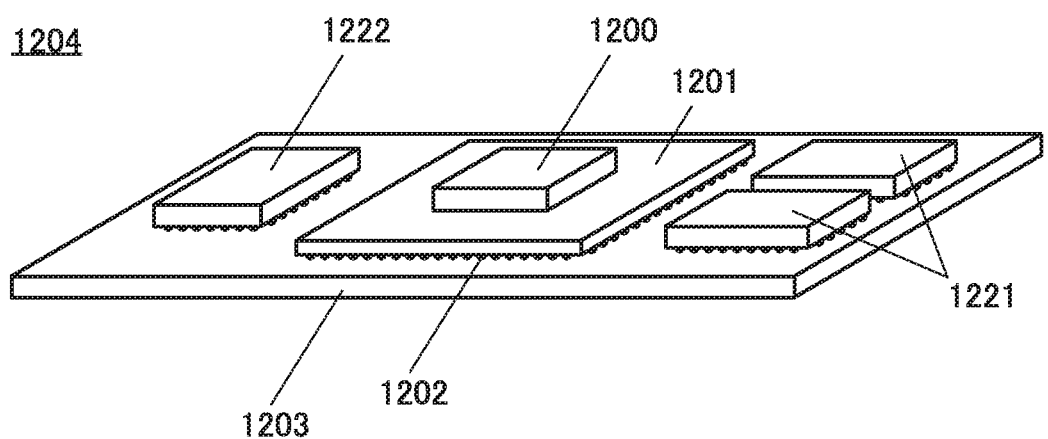

A bump (not illustrated) is provided on the chip 1200, and as illustrated in FIG. 29(B), the chip 1200 is connected to a first surface of a printed circuit board (PCB) 1201. A plurality of bumps 1202 are provided on the rear surface of the first surface of the PCB 1201 and are connected to a motherboard 1203.

Memory devices such as a DRAM 1221 and a flash memory 1222 may be provided on the motherboard 1203. For example, the DOSRAM described in the foregoing embodiment can be used as the DRAM 1221. For example, the NOSRAM described in the foregoing embodiment can be used as the flash memory 1222.

The CPU 1211 preferably includes a plurality of CPU cores. The GPU 1212 preferably includes a plurality of GPU cores. The CPU 1211 and the GPU 1212 may each include a memory for storing data temporarily. Alternatively, a common memory for the CPU 1211 and the GPU 1212 may be provided in the chip 1200. As the memory, the NOSRAM or the DOSRAM described above can be used. The GPU 1212 is suitable for parallel computation of a large number of data and thus can be used for image processing and product-sum operation. When an image processing circuit or a product-sum operation circuit using an oxide semiconductor of the present invention is provided in the GPU 1212, image processing and product-sum operation can be performed with low power consumption.

Since the CPU 1211 and the GPU 1212 are provided in the same chip, a wiring between the CPU 1211 and the GPU 1212 can be shortened; accordingly, data transfer from the CPU 1211 to the GPU 1212, data transfer between memories included in the CPU 1211 and the GPU 1212, and transfer of arithmetic operation results from the GPU 1212 to the CPU 1211 after arithmetic operation in the GPU 1212 can be performed at high speed.

The analog arithmetic unit 1213 includes one or both of an A/D (analog/digital) converter circuit and a D/A (digital/analog) converter circuit. Furthermore, the analog arithmetic unit 1213 may include the above-described product-sum operation circuit.

The memory controller 1214 includes a circuit functioning as a controller of the DRAM 1221 and a circuit functioning as the interface of the flash memory 1222.

The interface 1215 includes an interface circuit to be connected to an external device, such as a display device, a speaker, a microphone, a camera, or a controller. Examples of the controller include a mouse, a keyboard, and a game controller. As such an interface, USB (Universal Serial Bus), HDMI (registered trademark) (High-Definition Multimedia Interface), or the like can be used.

The network circuit 1216 includes a circuit for a network such as a LAN (Local Area Network). The network circuit 1216 may further include a circuit for network security.

The circuits (systems) can be formed in the chip 1200 in the same manufacturing process. Therefore, even when the number of circuits needed for the chip 1200 increases, there is no need to increase the number of steps in the manufacturing process; thus, the chip 1200 can be manufactured at low cost.

The motherboard 1203 provided with the PCB 1201 on which the chip 1200 including the GPU 1212 is mounted, the DRAM 1221, and the flash memory 1222 can be referred to as a GPU module 1204.

The GPU module 1204 includes the chip 1200 using the SoC technology, and thus can have a small size. The GPU module 1204 is excellent in image processing, and thus is suitably used in portable electronic devices such as a smartphone, a tablet terminal, a laptop PC, and a portable (mobile) game console. Furthermore, the product-sum operation circuit using the GPU 1212 can perform methods such as a deep neural network (DNN), a convolutional neural network (CNN), a recurrent neural network (RNN), an autoencoder, a deep Boltzmann machine (DBM), or a deep belief network (DBN); hence, the chip 1200 can be used as an AI chip or the GPU module 1204 can be used as an AI system module.

The structure described in this embodiment can be used in an appropriate combination with the structures described in the other embodiments and the like.

Embodiment 6

In this embodiment, application examples of the memory device using the semiconductor device described in the foregoing embodiment will be described. The semiconductor device described in the foregoing embodiment can be applied to, for example, memory devices in a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the foregoing embodiment is applied to a variety of removable memory devices such as memory cards (e.g., SD cards), USB memories, and SSDs (solid state drives). FIG. 30 schematically illustrates some structure examples of removable memory devices. The semiconductor device described in the foregoing embodiment is processed into a packaged memory chip and used in a variety of storage devices and removable memories, for example.

Figure 30A:
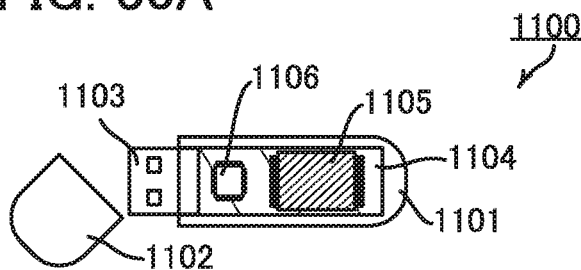
FIGS. 30A-30E Schematic views of memory devices according to one embodiment of the present invention.

FIG. 30(A) is a schematic diagram of a USB memory. A USB memory 1100 includes a housing 1101, a cap 1102, a USB connector 1103, and a substrate 1104. The substrate 1104 is held in the housing 1101. The substrate 1104 is provided with a memory chip 1105 and a controller chip 1106, for example. The semiconductor device described in the foregoing embodiment can be incorporated in the memory chip 1105 or the like.

Figure 30B:
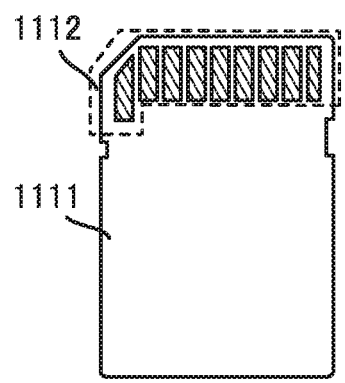
Figure 30C:
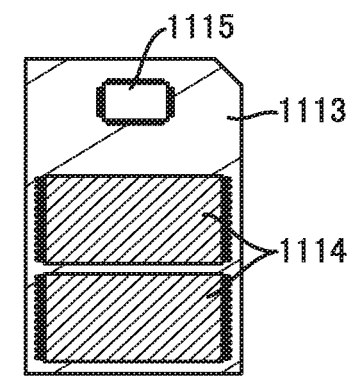

FIG. 30(B) is a schematic external diagram of an SD card, and FIG. 30(C) is a schematic diagram of the internal structure of the SD card. An SD card 1110 includes a housing 1111, a connector 1112, and a substrate 1113. The substrate 1113 is held in the housing 1111. The substrate 1113 is provided with a memory chip 1114 and a controller chip 1115, for example. When the memory chip 1114 is also provided on the back side of the substrate 1113, the capacity of the SD card 1110 can be increased. In addition, a wireless chip with a radio communication function may be provided on the substrate 1113. With such a wireless chip, data can be read from and written in the memory chip 1114 by radio communication between a host device and the SD card 1110. The semiconductor device described in the foregoing embodiment can be incorporated in the memory chip 1114 or the like.

Figure 30D:
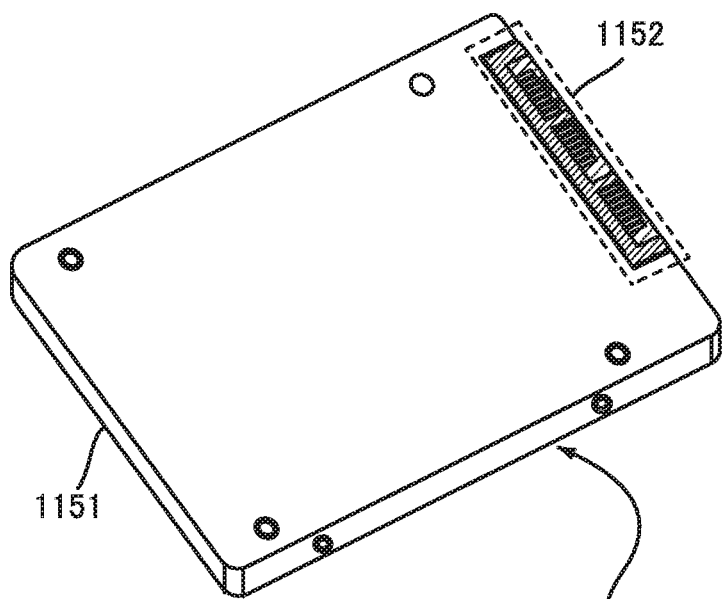
Figure 30E:
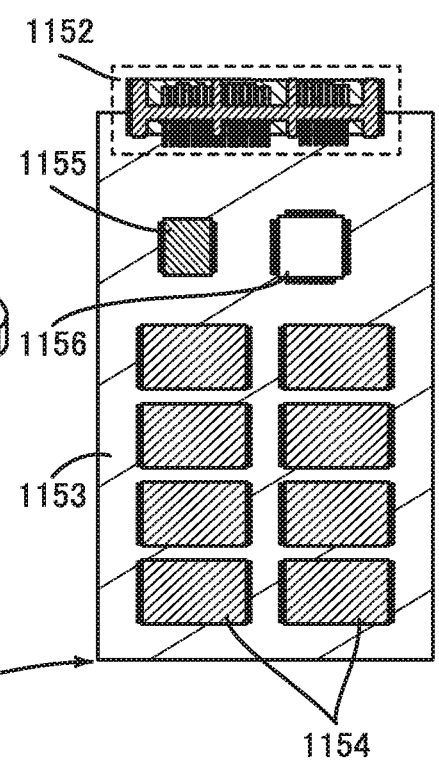

FIG. 30(D) is a schematic external diagram of an SSD, and FIG. 30(E) is a schematic diagram of the internal structure of the SSD. An SSD 1150 includes a housing 1151, a connector 1152, and a substrate 1153. The substrate 1153 is held in the housing 1151. The substrate 1153 is provided with a memory chip 1154, a memory chip 1155, and a controller chip 1156, for example. The memory chip 1155 is a work memory of the controller chip 1156, and a DOSRAM chip can be used, for example. When the memory chip 1154 is also provided on the back side of the substrate 1153, the capacity of the SSD 1150 can be increased. The semiconductor device described in the foregoing embodiment can be incorporated in the memory chip 1154 or the like.

This embodiment can be implemented in an appropriate combination with the structures described in the other embodiments and the like.

Embodiment 7

The semiconductor device according to one embodiment of the present invention can be used in a chip or a processor such as a CPU and a GPU. FIG. 31 illustrates specific examples of electronic devices each including a chip or a processor such as a CPU or a GPU according to one embodiment of the present invention.
<Electronic Devices and System>

The GPU or the chip according to one embodiment of the present invention can be mounted on a variety of electronic devices. Examples of electronic devices include a digital camera, a digital video camera, a digital photo frame, a mobile phone, a portable game machine, a portable information terminal, and an audio reproducing device in addition to electronic devices provided with a relatively large screen, such as a television device, a desktop or laptop personal computer, a monitor for a computer and the like, digital signage, and a large game machine such as a pachinko machine. In addition, when an integrated circuit or a chip according to one embodiment of the present invention is provided in the electronic device, the electronic device can include artificial intelligence.

The electronic device of one embodiment of the present invention may include an antenna. When a signal is received by the antenna, the electronic device can display a video, data, or the like on a display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, power, radioactive rays, flow rate, humidity, a gradient, oscillation, odor, or infrared rays).

The electronic device of one embodiment of the present invention can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIG. 31 illustrates examples of electronic devices.
[Mobile Phone]

Figure 31A:
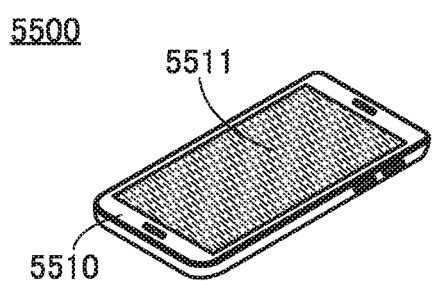

FIG. 31(A) illustrates a mobile phone (smartphone), which is a kind of information terminal. An information terminal 5500 includes a housing 5510 and a display portion 5511. As input interfaces, a touch panel is provided in the display portion 5511 and a button is provided in the housing 5510.

When the chip of one embodiment of the present invention is applied to the information terminal 5500, the information terminal 5500 can execute an application utilizing artificial intelligence. Examples of the application utilizing artificial intelligence include an application for recognizing a conversation and displaying the content of the conversation on the display portion 5511; an application for recognizing letters, figures, and the like input to the touch panel of the display portion 5511 by a user and displaying them on the display portion 5511; and an application for performing biometric authentication using fingerprints, voice prints, or the like.

[Information Terminal]

Figure 31B:
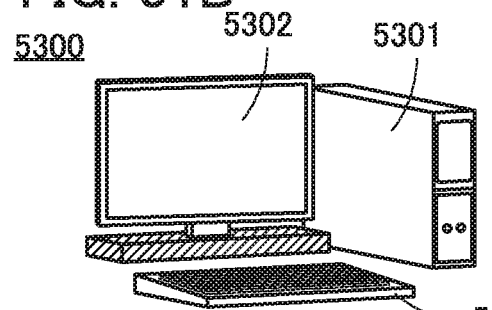

FIG. 31(B) illustrates a desktop information terminal 5300. The desktop information terminal 5300 includes a main body 5301 of the information terminal, a display 5302, and a keyboard 5303.

Like the information terminal 5500 described above, the desktop information terminal 5300 can execute an application utilizing artificial intelligence, with the use of the chip of one embodiment of the present invention. Examples of the application utilizing artificial intelligence include design-support software, text correction software, and software for automatic menu generation. Furthermore, with the use of the desktop information terminal 5300, novel artificial intelligence can be developed.

Note that although the smartphone and the desktop information terminal are respectively illustrated in FIGS. 31(A) and 31(B) as examples of the electronic devices, the electronic device can be an information terminal other than the smartphone and the desktop information terminal. Examples of an information terminal other than the smartphone and the desktop information terminal include a PDA (Personal Digital Assistant), a notebook information terminal, and a workstation.

[Electric Appliance]

Figure 31C:
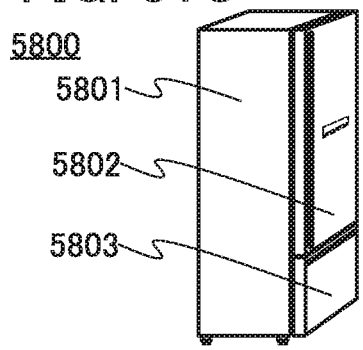

FIG. 31(C) illustrates an electric refrigerator-freezer 5800 that is an example of an electric appliance. The electric refrigerator-freezer 5800 includes a housing 5801, a refrigerator door 5802, a freezer door 5803, and the like.

When the chip of one embodiment of the present invention is applied to the electric refrigerator-freezer 5800, the electric refrigerator-freezer 5800 including artificial intelligence can be achieved. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting temperature to be appropriate for the foods stored in the electric refrigerator-freezer 5800, and the like.

Although the electric refrigerator-freezer is described in this example as an electric appliance, examples of other electric appliances include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

[Game Machine]

Figure 31D:
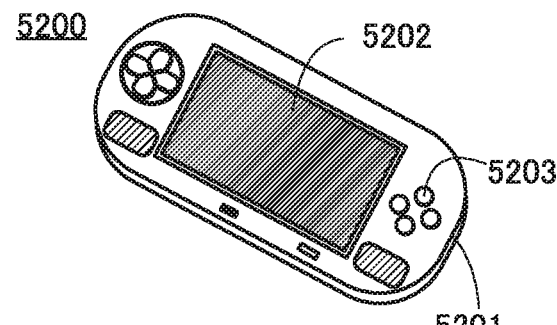
Figure 31D:
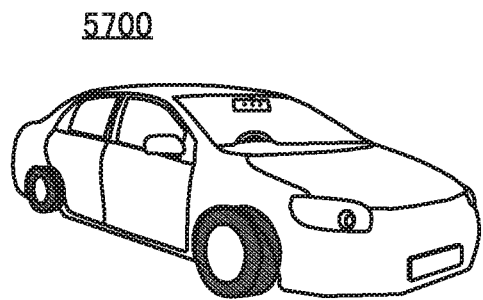
Figure 31D:
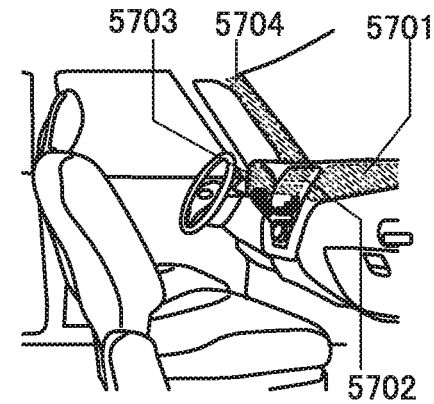

FIG. 31(D) illustrates a portable game machine 5200 that is an example of a game machine. The portable game machine includes a housing 5201, a display portion 5202, a button 5203, and the like.

When the GPU or the chip of one embodiment of the present invention is applied to the portable game machine 5200, the portable game machine 5200 with low power consumption can be achieved. Moreover, heat generation from a circuit can be reduced owing to low power consumption; thus, the influence of heat generation on the circuit, a peripheral circuit, and a module can be reduced.

Furthermore, when the GPU or the chip of one embodiment of the present invention is applied to the portable game machine 5200, the portable game machine 5200 including artificial intelligence can be achieved.

In general, the progress of a game, the actions and words of game characters, and expressions of a phenomenon and the like occurring in the game are determined by the program in the game; however, the use of artificial intelligence in the portable game machine 5200 enables expressions not limited by the game program. For example, questions posed by the player, the progress of the game, time, and actions and words of game characters can be changed for various expressions.

When a game requiring a plurality of players is played on the portable game machine 5200, the artificial intelligence can create a virtual game player; thus, the game can be played alone with the game player created by the artificial intelligence as an opponent.

Although the portable game machine is illustrated as an example of a game machine in FIG. 31(D), the game machine to which the GPU or the chip of one embodiment of the present invention is applied is not limited thereto. Examples of the game machine to which the GPU or the chip of one embodiment of the present invention is applied include a home stationary game machine, an arcade game machine installed in entertainment facilities (a game center, an amusement park, and the like), and a throwing machine for batting practice installed in sports facilities.

[Moving Vehicle]

The GPU or the chip of one embodiment of the present invention can be applied to an automobile, which is a moving vehicle, and the periphery of a driver's seat in the automobile.

FIG. 31(E1) illustrates an automobile 5700 that is an example of a moving vehicle, and FIG. 31(E2) is a diagram illustrating the periphery of a windshield inside the automobile. FIG. 31(E2) illustrates a display panel 5701, a display panel 5702, and a display panel 5703 that are attached to a dashboard and a display panel 5704 that is attached to a pillar.

The display panel 5701 to the display panel 5703 can provide various kinds of information by displaying a speedometer, a tachometer, mileage, a fuel gauge, a gear state, air-condition setting, and the like. In addition, the content, layout, or the like of the display on the display panels can be changed as appropriate to suit the user's preference, so that the design quality can be increased. The display panel 5701 to the display panel 5703 can also be used as lighting devices.

The display panel 5704 can compensate for view obstructed by the pillar (a blind spot) by showing an image taken by an imaging device (not illustrated) provided for the automobile 5700. That is, displaying an image taken by the imaging device provided outside the automobile 5700 leads to compensation for the blind spot and an increase in safety. Moreover, displaying an image to compensate for a portion that cannot be seen makes it possible for the driver to confirm the safety more naturally and comfortably. The display panel 5704 can also be used as a lighting device.

Since the GPU or the chip of one embodiment of the present invention can be applied to a component of artificial intelligence, the chip can be used for an automatic driving system of the automobile 5700, for example. The chip can also be used for a navigation system, risk prediction, or the like. A structure may be employed in which the display panel 5701 to the display panel 5704 display navigation information, risk prediction information, or the like.

Note that although an automobile is described above as an example of a moving vehicle, the moving vehicle is not limited to an automobile. Examples of the moving vehicle include a train, a monorail train, a ship, and a flying vehicle (a helicopter, an unmanned aircraft (a drone), an airplane, and a rocket), and these moving vehicles can each include a system utilizing artificial intelligence with the use of the chip of one embodiment of the present invention.

[Broadcasting System]

The GPU or the chip of one embodiment of the present invention can be applied to a broadcasting system.

Figure 31F:
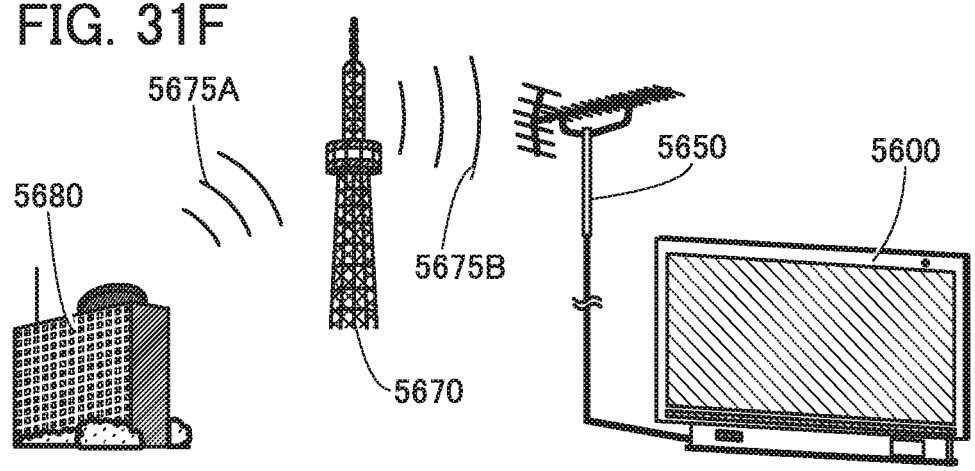

FIG. 31(F) schematically shows data transmission in a broadcasting system. Specifically, FIG. 31(F) shows a path in which a radio wave (a broadcast signal) transmitted from a broadcast station 5680 is delivered to a television receiver (TV) 5600 of each household. The TV 5600 includes a receiving device (not illustrated), and the broadcast signal received by an antenna 5650 is transmitted to the TV 5600 through the receiving device.

Although a UHF (Ultra High Frequency) antenna is illustrated as the antenna 5650 in FIG. 31(F), a BS/110° CS antenna, a CS antenna, or the like can also be applied to the antenna 5650.

A radio wave 5675A and a radio wave 5675B are broadcast signals for terrestrial broadcasting; a radio wave tower 5670 amplifies the received radio wave 5675A and transmits the radio wave 5675B. Each household can view terrestrial TV broadcasting on the TV 5600 by receiving the radio wave 5675B with the antenna 5650. Note that the broadcasting system is not limited to the terrestrial broadcasting shown in FIG. 31(F), and may be satellite broadcasting using an artificial satellite, data broadcasting using an optical line, or the like.

The broadcasting system may be a broadcasting system utilizing artificial intelligence by applying the chip of one embodiment of the present invention. When broadcast data is transmitted from the broadcast station 5680 to the TV 5600 of each household, the broadcast data is compressed by an encoder. When the antenna 5650 receives the compressed broadcast data, the compressed broadcast data is decompressed by a decoder of the receiving device included in the TV 5600. With the use of artificial intelligence, for example, a display pattern included in an image to be displayed can be recognized in motion compensation prediction, which is one of the compression methods for the encoder. In-frame prediction or the like can also be performed utilizing artificial intelligence. Furthermore, for example, when broadcast data with low resolution is received and the broadcast data is displayed on the TV 5600 with high resolution, image interpolation processing such as upconversion can be performed in the broadcast data decompression by the decoder.

The broadcasting system utilizing artificial intelligence is suitable for ultra-high definition television (UHDTV: 4K, 8K) broadcasting, which needs a larger amount of broadcast data.

As an application of artificial intelligence in the TV 5600, a recording device including artificial intelligence may be provided in the TV 5600, for example. With such a structure, the artificial intelligence in the recording device can learn the user's preference, so that TV programs that suit the user's preference can be recorded automatically.

The electronic devices, the functions of the electronic devices, the application examples of artificial intelligence, their effects, and the like described in this embodiment can be combined as appropriate with the description of another electronic device.

This embodiment can be implemented in an appropriate combination with the structures described in the other embodiments and the like.

REFERENCE NUMERALS

100: capacitor, 110: conductor, 112: conductor, 120: conductor, 130: insulator, 140: insulator, 150: insulator, 200: transistor, 200A: transistor, 200B: transistor, 205: conductor, 210: insulator, 212: insulator, 214: insulator, 216: insulator, 218: conductor, 222: insulator, 224: insulator, 224A: insulating film, 230: oxide, 230*a*: oxide, 230A: oxide film, 230*b*: oxide, 230B: oxide film, 230*c*: oxide, 230*c*1: oxide, 230*c*2: oxide, 230C: oxide film, 230C1: oxide film, 230C2: oxide film, 231: region, 231*a*: region, 231*b*: region, 232: region, 232*a*: region, 232*b*: region, 234: region, 240: conductor, 240*a*: conductor, 240*b*: conductor, 241: insulator, 241*a*: insulator, 241*b*: insulator, 242: conductor, 242*a*: conductor, 242A: conductive film, 242*b*: conductor, 242B: conductive layer, 243: region, 243*a*: region, 243*b*: region, 250: insulator, 250A: insulating film, 254: insulator, 254*a*: insulator, 254A: insulating film, 254*b*: insulator, 254B: insulating film, 254*c*: insulator, 260: conductor, 260*a*: conductor, 260A: conductive film, 260B: conductive film, 260*b*: conductor, 262: dummy gate, 262A: dummy gate layer, 274: insulator, 280: insulator, 280*a*: insulator, 280A: insulating film, 280*b*: insulator, 281: insulator, 282: insulator, 300: transistor, 311: substrate, 313: semiconductor region, 314*a*: low-resistance region, 314*b*: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 400: transistor, 405: conductor, 405*a*: conductor, 405*b*: conductor, 424*a*: insulator, 424*b*: insulator, 430*c*: oxide, 430*c*1: oxide, 430*c*2: oxide, 431*a*: oxide, 431*b*: oxide, 432*a*: oxide, 432*b*: oxide, 440: conductor, 440*a*: conductor, 440*b*: conductor, 442: conductor, 442*a*: conductor, 442*b*: conductor, 443*a*: region, 443*b*: region, 450: insulator, 460: conductor, 460*a*: conductor, 460*b*: conductor, 1001: wiring, 1002: wiring, 1003: wiring, 1004: wiring, 1005: wiring, 1006: wiring, 1007: wiring, 1008: wiring, 1009: wiring, 1010: wiring, 1100: USB memory, 1101: housing, 1102: cap, 1103: USB connector, 1104: substrate, 1105: memory chip, 1106: controller chip, 1110: SD card, 1111: housing, 1112: connector, 1113: substrate, 1114: memory chip, 1115: controller chip, 1150: SSD, 1151: housing, 1152: connector, 1153: substrate, 1154: memory chip, 1155: memory chip, 1156: controller chip, 1200: chip, 1201: PCB, 1202: bump, 1203: motherboard, 1204: GPU module, 1211: CPU, 1212: GPU, 1213: analog arithmetic unit, 1214: memory controller, 1215: interface, 1216: network circuit, 1221: DRAM, 1222: flash memory, 1400: memory device, 1411: peripheral circuit, 1420: row circuit, 1430: column circuit, 1440: output circuit, 1460: control logic circuit, 1470: memory cell array, 1471: memory cell, 1472: memory cell, 1473: memory cell, 1474: memory cell, 1475: memory cell, 1476: memory cell, 1477: memory cell, 1478: memory cell, 5200: portable game machine, 5201: housing, 5202: display portion, 5203: button, 5300: desktop information terminal, 5301: main body, 5302: display, 5303: keyboard, 5500: information terminal, 5510: display portion, 5600: TV, 5650: antenna, 5670: radio wave tower, 5675A: radio wave, 5675B: radio wave, 5680: broadcast station, 5700: automobile, 5701: display panel, 5702: display panel, 5703: display panel, 5704: display panel, 5800: electric refrigerator-freezer, 5801: housing, 5802: refrigerator door, 5803: freezer door

The invention claimed is:

1. A semiconductor device comprising a transistor, the transistor comprising:
a first insulator;
a second insulator over the first insulator;
a first oxide over the second insulator;
a second oxide over the first oxide;
a third oxide over the second oxide;
a first conductor and a second conductor over the second oxide;
a third insulator over the third oxide;
a third conductor over the third insulator;
a fourth insulator over the first conductor and the second conductor; and
a fifth insulator over the fourth insulator,
wherein an opening reaching the second oxide is provided in the fourth insulator and the fifth insulator,
wherein the third oxide is positioned to cover an inner wall of the opening,
wherein the third insulator is positioned to cover the inner wall of the opening with the third oxide therebetween,
wherein the third conductor is positioned to fill the opening with the third oxide and the third insulator therebetween,
wherein in a channel length direction of the transistor, at least part of the fourth insulator in a region where the fourth insulator and the second oxide do not overlap with each other is in contact with the first insulator,
wherein in a channel width direction of the transistor, with reference to a height of a bottom surface of the first insulator, a height of a bottom surface of the third conductor in a region where the third conductor and the second oxide do not overlap with each other is lower than a height of a bottom surface of the second oxide, and
wherein in the channel width direction of the transistor, at least part of the third oxide in a region where the third oxide and the second oxide do not overlap with each other is in contact with the first insulator.

2. The semiconductor device according to claim 1,
wherein the third oxide has a stacked-layer structure comprising a first layer and a second layer,
wherein the first layer is in contact with the second oxide and the fifth insulator, and
wherein the second layer is provided between the first layer and the third insulator.

3. The semiconductor device according to claim 2,
wherein the second layer has higher crystallinity than the first layer.

4. The semiconductor device according to claim 2,
wherein the first layer and the second layer each comprise In, an element M, and Zn, where M is Al, Ga, Y, or Sn, and
wherein an atomic ratio of In to constituent elements in the second layer is lower than an atomic ratio of In to constituent elements in the first layer.

5. A semiconductor device comprising a transistor, the transistor comprising:
a first insulator;
a second insulator over the first insulator;
a first oxide over the second insulator;
a second oxide over the first oxide;
a third oxide over the second oxide;
a third insulator over the third oxide;
a conductor over the third insulator;
a fourth insulator in contact with at least part of the third oxide, at least part of a top surface of the second oxide, at least part of a side surface of the second oxide, at least part of a side surface of the first oxide, at least part of a side surface of the second insulator, and at least part of the first insulator;
a fifth insulator over the fourth insulator; and
a sixth insulator in contact with at least part of a top surface of the third oxide, at least part of a top surface of the third insulator, at least part of a top surface of the conductor, and at least part of a top surface of the fifth insulator,
wherein the second oxide comprises a first region, a second region, and a third region positioned between the first region and the second region,
wherein resistance of the first region and resistance of the second region are lower than resistance of the third region,
wherein the conductor is provided above the third region to overlap with the third region,
wherein part of the third oxide and part of the third insulator are provided between a side surface of the conductor and a side surface of the fifth insulator,
wherein the fourth insulator comprises a region in contact with the first region and a region in contact with the second region,
wherein in a channel width direction of the transistor, with reference to a height of a bottom surface of the first insulator, a height of a bottom surface of the conductor in a region where the conductor and the second oxide do not overlap with each other is lower than a height of a bottom surface of the second oxide, and
wherein in the channel width direction of the transistor, at least part of the third oxide in a region where the third oxide and the second oxide do not overlap with each other is in contact with the first insulator.

6. The semiconductor device according to claim 5,
wherein the first region and the second region comprise more oxygen vacancies than the third region.

7. The semiconductor device according to claim 6,
wherein the fourth insulator has a stacked-layer structure comprising a third layer and a fourth layer,
wherein the third layer is in contact with the first insulator, and
wherein the fourth layer is in contact with the fifth insulator.

8. The semiconductor device according to claim 6,
wherein the third oxide has a stacked-layer structure comprising a first layer and a second layer,
wherein the first layer is in contact with the second oxide and the fifth insulator, and
wherein the second layer is provided between the first layer and the third insulator.

9. The semiconductor device according to claim 6,
wherein the first region and the second region comprise more oxygen vacancies than the third region.

10. The semiconductor device according to claim 7,
wherein the first layer and the second layer each comprise In, an element M, and Zn, where M is Al, Ga, Y, or Sn, and
wherein an atomic ratio of In to the element M in the second layer is lower than an atomic ratio of In to the element M in the first layer.

11. The semiconductor device according to claim 5,
wherein the fourth insulator has a stacked-layer structure comprising a third layer and a fourth layer,
wherein the third layer is in contact with the first insulator, and
wherein the fourth layer is in contact with the fifth insulator.

12. The semiconductor device according to claim 11,
wherein the third oxide has a stacked-layer structure comprising a first layer and a second layer,
wherein the first layer is in contact with the second oxide and the fifth insulator, and
wherein the second layer is provided between the first layer and the third insulator.

13. The semiconductor device according to claim 11,
wherein the fourth insulator has a stacked-layer structure comprising a third layer and a fourth layer,
wherein the third layer is in contact with the first insulator, and
wherein the fourth layer is in contact with the fifth insulator.

14. The semiconductor device according to claim 5,
wherein the third oxide has a stacked-layer structure comprising a first layer and a second layer,
wherein the first layer is in contact with the second oxide and the fifth insulator, and
wherein the second layer is provided between the first layer and the third insulator.

15. The semiconductor device according to claim 14,
wherein the third oxide has a stacked-layer structure comprising a first layer and a second layer,
wherein the first layer is in contact with the second oxide and the fifth insulator, and
wherein the second layer is provided between the first layer and the third insulator.

16. The semiconductor device according to claim 14,
wherein the third layer comprises silicon oxide, and
wherein the fourth layer comprises aluminum oxide.

17. The semiconductor device according to claim 5,
wherein the first region and the second region comprise one of phosphorus and boron.

18. The semiconductor device according to claim 17,
wherein the third oxide has a stacked-layer structure comprising a first layer and a second layer,
wherein the first layer is in contact with the second oxide and the fifth insulator, and
wherein the second layer is provided between the first layer and the third insulator.

* * * * *